(12) United States Patent
Sun et al.

(10) Patent No.: US 11,711,958 B2
(45) Date of Patent: Jul. 25, 2023

(54) DISPLAY PANEL AND DISPLAY DEVICE

(71) Applicant: BOE TECHNOLOGY GROUP CO., LTD., Beijing (CN)

(72) Inventors: Liang Sun, Beijing (CN); Tuo Sun, Beijing (CN); Xiaodan Jin, Beijing (CN); Lintao Zhang, Beijing (CN)

(73) Assignee: BOE TECHNOLOGY GROUP CO., LTD., Beijinq (CN)

( * ) Notice: Subject to any disclaimer, the term of this patent is extended or adjusted under 35 U.S.C. 154(b) by 0 days.

(21) Appl. No.: 17/230,146

(22) Filed: Apr. 14, 2021

(65) Prior Publication Data
US 2021/0233969 A1    Jul. 29, 2021

Related U.S. Application Data

(63) Continuation-in-part of application No. 16/358,819, filed on Mar. 20, 2019, now Pat. No. 11,004,905.
(Continued)

(30) Foreign Application Priority Data

Sep. 11, 2014 (CN) .......................... 201410459909.3

(51) Int. Cl.
*H01L 27/32* (2006.01)
*H01L 51/52* (2006.01)
(Continued)

(52) U.S. Cl.
CPC .......... *H10K 59/353* (2023.02); *G09G 3/2003* (2013.01); *H10K 59/122* (2023.02); *H10K 59/352* (2023.02); *G09G 2300/0452* (2013.01)

(58) Field of Classification Search
CPC .... G09G 3/32; G09G 2300/0452; G09G 5/00; G09G 5/02; G09G 5/10; G09G 3/20;
(Continued)

(56) References Cited

U.S. PATENT DOCUMENTS

2003/0098917 A1   5/2003 Oda
2006/0033422 A1   2/2006 Chao
(Continued)

FOREIGN PATENT DOCUMENTS

CN   101449382   6/2009
CN   202736924   2/2013
(Continued)

OTHER PUBLICATIONS

Notice of Allowance from U.S. Appl. No. 16/358,819 dated Jan. 8, 2021.
(Continued)

*Primary Examiner* — Chanh D Nguyen
*Assistant Examiner* — Nguyen H Truong
(74) *Attorney, Agent, or Firm* — Calfee, Halter & Griswold LLP

(57) ABSTRACT

A display panel, including: a plurality of pixels arranged in an array in a first direction and a second direction intersecting the first direction, each pixel including: a first sub-pixel having a first light-emitting zone configured to emit light of a first color; a second sub-pixel having a second light-emitting zone configured to emit light of a second color; and a third sub-pixel having a third light-emitting zone configured to emit light of a third color, wherein the plurality of pixels include a first pixel, the first light-emitting zone of the first pixel has a substantially polygonal shape, the substantially polygonal shape including: a first side substantially parallel to one side of the second light-emitting zone of the first pixel, and the one side of the second light-emitting zone of the first pixel being opposite to the first light-emitting zone; and a second side substantially parallel to one side of the third light-emitting zone of the first pixel, and the one side of the third light-emitting zone of the first pixel being opposite to the first light-emitting zone.

18 Claims, 27 Drawing Sheets

Related U.S. Application Data which is a continuation-in-part of application No. 14/555,952, filed on Nov. 28, 2014, now abandoned.

(51) Int. Cl.
- *G09G 3/3208* (2016.01)
- *H10K 59/35* (2023.01)
- *G09G 3/20* (2006.01)
- *H10K 59/122* (2023.01)

(58) Field of Classification Search
CPC ...... G09G 3/30; G09G 3/3275; G09G 3/3225; G09G 3/3233; H01L 27/3218; H01L 27/3216; H01L 27/3246; H01L 27/32; H01L 51/00; H01L 51/52; H10K 59/122; H10K 59/353; H10K 59/352; H01J 1/62; H01J 9/00; H04N 9/64; H04N 9/74

See application file for complete search history.

(56) References Cited

U.S. PATENT DOCUMENTS

| | | |
|---|---|---|
| 2008/0001525 A1 | 1/2008 | Chao et al. |
| 2008/0297465 A1* | 12/2008 | Kim ................... G09G 3/3413 345/102 |
| 2009/0046108 A1 | 2/2009 | Elliott et al. |
| 2009/0302331 A1* | 12/2009 | Smith ................ H01L 27/3216 257/E33.062 |
| 2012/0049726 A1 | 3/2012 | Too et al. |
| 2012/0056531 A1 | 3/2012 | Park et al. |
| 2013/0002118 A1 | 1/2013 | Ko |
| 2013/0113363 A1 | 5/2013 | Hong |
| 2013/0307868 A1 | 11/2013 | Jeong |
| 2014/0097760 A1 | 4/2014 | Kato et al. |
| 2015/0009104 A1 | 1/2015 | Kim et al. |
| 2015/0015466 A1 | 1/2015 | Feng |
| 2015/0015590 A1 | 1/2015 | Jeong |
| 2015/0015600 A1 | 1/2015 | Yang et al. |
| 2015/0021637 A1 | 1/2015 | Ahn et al. |
| 2015/0061978 A1 | 3/2015 | Shih |
| 2015/0155516 A1 | 6/2015 | Yamashita |
| 2015/0379924 A1* | 12/2015 | Matsueda ............ G09G 3/3208 345/77 |
| 2016/0112690 A1* | 4/2016 | Yang ..................... G09G 3/346 345/690 |
| 2016/0126298 A1* | 5/2016 | Chen ................... H01L 27/3218 257/40 |
| 2016/0276416 A1 | 9/2016 | Ma |
| 2016/0329385 A1* | 11/2016 | Qiu ..................... H01L 27/3216 |
| 2017/0061846 A1 | 3/2017 | Yao |
| 2017/0162111 A1* | 6/2017 | Kang ................... G09G 3/3233 |
| 2018/0097043 A1* | 4/2018 | Song ................... H01L 25/0655 |
| 2019/0035861 A1* | 1/2019 | Wang .................. H01L 27/3218 |
| 2019/0157361 A1 | 5/2019 | Lee |
| 2019/0237520 A1 | 8/2019 | Tian |
| 2020/0105187 A1* | 4/2020 | Bian ..................... G09G 3/325 |
| 2020/0176531 A1* | 6/2020 | Baek ..................... H10K 59/88 |
| 2021/0217821 A1* | 7/2021 | Han ..................... H10K 59/121 |
| 2021/0327972 A1* | 10/2021 | Lou ..................... H10K 59/353 |

FOREIGN PATENT DOCUMENTS

| | | |
|---|---|---|
| CN | 103257494 | 8/2013 |
| CN | 103872091 | 6/2014 |
| CN | 104009063 | 8/2014 |
| CN | 104009066 | 8/2014 |
| JP | 2011009093 | 1/2011 |

OTHER PUBLICATIONS

Office action from U.S. Appl. No. 16/358,819 dated Apr. 3, 2020.
Office action from U.S. Appl. No. 16/358,819 dated Aug. 17, 2020.
Search report from International Application No. PCT/CN2015/070087 dated Jun. 23, 2015.
Written Opinion from International Application No. PCT/CN2015/070087 dated Jun. 23, 2015.
First Office action from Chinese Application No. 201410459909.3 dated Jul. 21, 2016.
Second Office action from Chinese Application No. 201410459909.3 dated Jan. 3, 2017.
Third Office action from Chinese Application No. 201410459909.3 dated Jun. 22, 2017.
Fourth Office action from Chinese Application No. 201410459909.3 dated Dec. 1, 2017.

* cited by examiner

DISPLAY PANEL AND DISPLAY DEVICE

CROSS-REFERENCE TO RELATED APPLICATIONS

This application is a continuation-in-part of application Ser. No. 16/358,819, filed on Mar. 20, 2019 and entitled "DISPLAY PANEL AND DISPLAY DEVICE". Application Ser. No. 16/358,819 is a continuation-in-part of application Ser. No. 14/555,952, filed on Nov. 28, 2014 and entitled "DISPLAY PANEL, ORGANIC LIGHT EMITTING DIODE DISPLAY AND DISPLAY DEVICE", which claims the priority of Chinese Patent Application No. 201410459909.3, filed with the Chinese Patent Office on Sep. 11, 2014, the entire disclosures of which are incorporated herein by reference.

TECHNICAL FIELD

The present disclosure relates to the field of display technologies, and in particular, to a display panel and a display device.

BACKGROUND

The manufacture of organic light emitting diode (OLED) display panels is limited by the opening size of the fine metal mask and the precision of the evaporation process, rendering difficult the realization of high resolution. Moreover, in the case of high resolution, a high aperture ratio of a sub-pixel (which generally refers to a ratio of an area of the light-emitting zone of a pixel unit to an area of the pixel unit) is difficult to attain, thereby affecting the performance of the display panel, e.g. in terms of brightness.

It therefore has been a challenge in the art to increase the aperture ratio of the sub-pixel while achieving high resolution.

SUMMARY

According to an aspect of the present disclosure, a display panel is provided, comprising: a plurality of pixels arranged in an array in a first direction and a second direction intersecting the first direction, each pixel comprising: a first sub-pixel having a first light-emitting zone configured to emit light of a first color; a second sub-pixel having a second light-emitting zone configured to emit light of a second color; and a third sub-pixel having a third light-emitting zone configured to emit light of a third color, wherein the plurality of pixels comprise a first pixel, the first light-emitting zone of the first pixel has a substantially polygonal shape, the substantially polygonal shape comprising: a first side substantially parallel to one side of the second light-emitting zone of the first pixel, and the one side of the second light-emitting zone of the first pixel being opposite to the first light-emitting zone; and a second side substantially parallel to one side of the third light-emitting zone of the first pixel, and the one side of the third light-emitting zone of the first pixel being opposite to the first light-emitting zone.

In some embodiments, the plurality of pixels further comprise a second pixel, the first light-emitting zone of the first pixel is adjacent to the second light-emitting zone and the third light-emitting zone of the second pixel, and the substantially polygonal shape of the first light-emitting zone of the first pixel further comprises: a third side substantially parallel to one side of the second light-emitting zone of the second pixel, and the one side of the second light-emitting zone of the second pixel being opposite to the first light-emitting zone; and a fourth side substantially parallel to one side of the third light-emitting zone of the second pixel, and the one side of the third light-emitting zone of the second pixel being opposite to the first light-emitting zone.

In some embodiments, in one of the plurality of pixels, the first, second, and third light-emitting zones are arranged in a triangle such that the first, second, and third light-emitting zones respectively cover three vertices of the triangle, and one side of the triangle is substantially parallel to the first direction, and wherein the second and third light-emitting zones respectively cover two vertices of three vertices of the triangle, and the two vertices define the side of the triangle which is substantially parallel to the first direction.

In some embodiments, the plurality of pixels are arranged along the first direction, and a line connecting centers of the first light-emitting zones in the plurality of pixels is substantially parallel to the first direction.

In some embodiments, in one of the plurality of pixels, a line connecting a center of the second light-emitting zone and a center of the third light-emitting zone is substantially parallel to the first direction.

In some embodiments, in the plurality of pixels, the first light-emitting zones have the same shape, the second light-emitting zones have the same shape, and the third light-emitting zones have the same shape.

In some embodiments, the plurality of pixels are arranged such that two pixels directly adjacent in the first direction have respective patterns of first, second, and third light-emitting zones, the respective patterns of first, second, and third light-emitting zones being substantially mirror symmetrical to each other with respect to a symmetry axis, wherein the symmetry axis is substantially parallel to the second direction.

In some embodiments, the plurality of pixels are arranged such that, in four pixels distributed in a 2*2 matrix, two diagonally adjacent pixels have substantially repeating patterns of first, second and third light-emitting zones with respect to each other.

In some embodiments, in each of the plurality of pixels, the second light-emitting zone and the third light-emitting zone each have a substantially trapezoidal shape, the substantially trapezoidal shape having a longer base side and a shorter base side substantially parallel to each other, and wherein the shorter base side of the second light-emitting zone and the shorter base side of the third light-emitting zone are opposite and substantially parallel to each other.

In some embodiments, in each of the plurality of pixels, an arrangement direction of both the second light-emitting zone and the third light-emitting zone is substantially parallel to the first direction or the second direction, and a size of the first light-emitting zone in the arrangement direction is smaller than a sum of sizes of both the second light-emitting zone and the third light-emitting zone in the arrangement direction.

In some embodiments, in the plurality of pixels, a shortest distance between the second light-emitting zone and its adjacent second light-emitting zone is not greater than a shortest distance between the second light-emitting zone and its adjacent third light-emitting zone; and/or a shortest distance between the third light-emitting zone and its adjacent third light-emitting zone is not greater than a shortest distance between the second light-emitting zone and its adjacent third light-emitting zone.

In some embodiments, in the plurality of pixels: a plurality of second light-emitting zones or third light-emitting zones arranged in the second direction are connected to a same data line; a plurality of first light-emitting zones arranged in the second direction are connected to a same data line; a first light-emitting zone, a second light-emitting zone, and a third light-emitting zone in a same pixel are connected to a same control line; and two adjacent pixels in the first direction are connected to a same control line, and wherein the control line comprises at least one of a scan line, a light-emitting control line, or a reset control line.

In some embodiments, both the data line to which the plurality of second light-emitting zones or third light-emitting zones arranged in the second direction are connected and the data line to which the plurality of first light-emitting zones arranged in the second direction are connected are alternately arranged in the first direction.

In some embodiments, one of the plurality of pixels has a luminance center inside the triangle, and a distance from the luminance center to the first light-emitting zone of the pixel is less than a distance from the luminance center to the second light-emitting zone of the pixel or a distance from the luminance center to the third light-emitting zone of the pixel.

In some embodiments, at least one of a first line or a second line sequentially connecting the luminance centers of the pixels arranged in the first direction or the second direction is a straight line.

In some embodiments, at least one of a first line or a second line sequentially connecting the luminance centers of the pixels arranged in the first direction or the second direction has a zigzag shape, and an acute angle between a polyline segment in the zigzag shape and an extending direction of the zigzag shape is less than 45 degrees.

In some embodiments, two second light-emitting zones respectively comprised in two pixels adjacent in the first direction are adjacent to each other, and the two second light-emitting zones are substantially symmetrical with respect to a symmetry axis, and the symmetry axis is parallel to the longest side of one of the two second light-emitting zones.

In some embodiments, the display panel further comprises a base substrate on which the plurality of pixels are formed, wherein each of the first, second, and third sub-pixels comprises a light emitting diode comprising a first electrode, a light emitting layer, and a second electrode which are sequentially stacked in a direction away from the base substrate; and a pixel defining layer comprising a plurality of openings, the plurality of openings defining respective ones of the first, second and third light-emitting zones of the plurality of pixels, wherein an area of an orthographic projection of the light emitting layer onto the base substrate is larger than an area of an orthographic projection of a corresponding one of the plurality of openings onto the base substrate, such that the orthographic projection of the corresponding one of the plurality of openings falls within the orthographic projection of the light emitting layer; and wherein the light-emitting layers of any two sub-pixels directly adjacent in the first direction and having light-emitting zones configured to emit light of a same color are formed such that orthographic projections of the light-emitting layers onto the base substrate are in communication with each other.

In some embodiments, the display panel further comprises: a base substrate on which the plurality of pixels are formed, wherein each of the first, second, and third sub-pixels comprises a light emitting diode comprising a first electrode, a light emitting layer, and a second electrode which are sequentially stacked in a direction away from the base substrate; and a pixel defining layer comprising a plurality of openings, the plurality of openings defining respective ones of the first, second and third light-emitting zones of the plurality of pixels, wherein the first electrode is formed on a side of the pixel defining layer close to the base substrate, and at least part of the first electrode is exposed by the plurality of openings formed in the pixel defining layer; and wherein two first electrodes of two second sub-pixels or two first electrodes of two third sub-pixels in at least two pixels adjacent in the first direction or the second direction are electrically connected.

In some embodiments, the first, second, and third light-emitting zones of the first pixel have first, second, and third areas, respectively, and wherein the second area is greater than the first area and greater than the third area.

In some embodiments, in each of the plurality of pixels, the first, second, and third light-emitting zones are arranged such that centers of the first, second, and third light-emitting zones are respectively located at the three vertices of the triangle, and a distance from the center of the first light-emitting zone to the center of the second light-emitting zone is not less than a distance from the center of the first light-emitting zone to the center of the third light-emitting zone.

In some embodiments, in each of the plurality of pixels, an acute angle between a direction of a line connecting two points farthest in the first light-emitting zone and the first direction is less than 60 degrees or less than 45 degrees.

In some embodiments, the first color is green, the second color is blue, and the third color is red, or wherein the first color is green, the second color is red, and the third color is blue.

In some embodiments, the first light-emitting zone of the first pixel has a shape selected from a group consisting of a rectangle, parallelogram, trapezoid, pentagon, hexagon, heptagon, and octagon.

In some embodiments, a ratio of a length of the shorter base side of the second light-emitting zone to a length of the shorter base side of the third light-emitting zone is 0.8-1.2.

In some embodiments, the orthographic projections of the light-emitting layers that are in communication with each other form a shape selected from a group consisting of a rounded hexagon, a rounded rectangle, a substantially ellipse, and a substantially circle.

In some embodiments, in one of the plurality of pixels, a ratio between a shortest distance between the first light-emitting zone and the second light-emitting zone and a shortest distance between the second light-emitting zone and the third light-emitting zone is 0.8-1.2.

According to another aspect of the present disclosure, a display device is provided comprising the display panel as described above.

These and other aspects of the present disclosure will be apparent from and elucidated with reference to the embodiment(s) described hereinafter.

BRIEF DESCRIPTION OF THE DRAWINGS

Further details, features and advantages of the present disclosure are disclosed in the following description of exemplary embodiments in conjunction with the accompanying drawings in which.

DETAILED DESCRIPTION

Figure 1A:
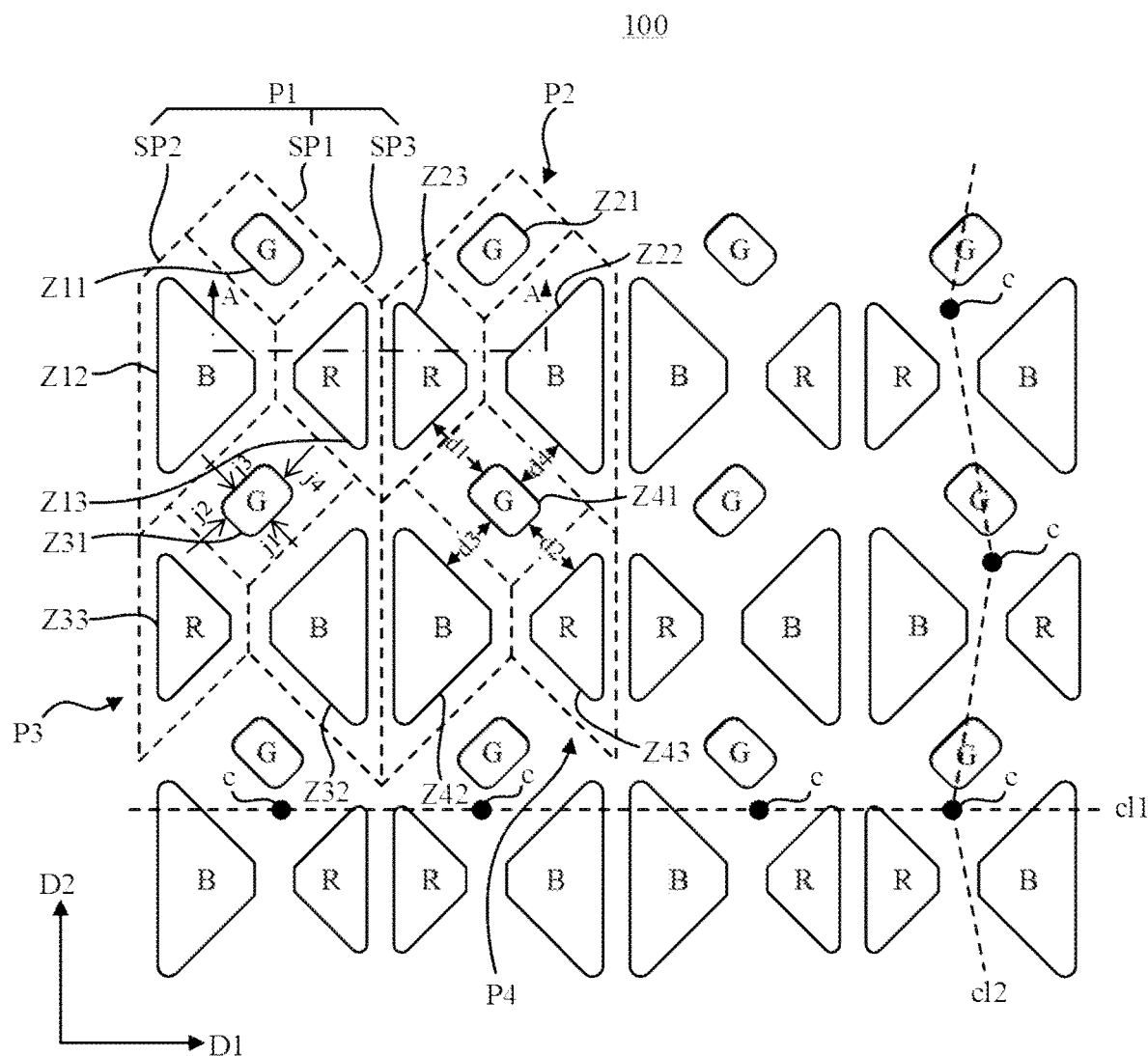
FIGS. 1A-1B are schematic diagrams showing pixel regions of display panels according to embodiments of the present disclosure.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure will be described in detail below with reference to the accompanying drawings.

FIG. 1A is a schematic diagram showing pixel regions of a display panel 100 according to an embodiment of the present disclosure.

Referring to FIG. 1A, the display panel 100 includes a plurality of pixels arranged in an array in a first direction D1 and a second direction D2 intersecting (e.g., perpendicular to) the first direction D1, four of which are labeled in FIG. 1A as P1, P2, P3 and P4, respectively. Each of the pixels includes a first sub-pixel having a first light-emitting zone configured to emit light of a first color, a second sub-pixel having a second light-emitting zone configured to emit light of a second color, and a third sub-pixel having a third light-emitting zone configured to emit light of a third color. In the example of FIG. 1A, the pixel P1 includes a first sub-pixel SP1 having a first light-emitting zone Z11 that emits green light, a second sub-pixel SP2 having a second light-emitting zone Z12 that emits blue light, and a third sub-pixel SP3 having a third light-emitting zone Z13 that emits red light, the pixel P2 includes a first sub-pixel SP1 having a first light-emitting zone Z21 that emits green light, a second sub-pixel SP2 having a second light-emitting zone Z22 that emits blue light, and a third sub-pixel SP3 having a third light-emitting zone Z23 that emits red light, the pixel P3 includes a first sub-pixel SP1 having a first light-emitting zone Z31 that emits green light, a second sub-pixel SP2 having a second light-emitting zone Z32 that emits blue light, and a third sub-pixel SP3 having a third light-emitting zone Z33 that emits red light, and the pixel P4 includes a first sub-pixel SP1 having a first light-emitting zone Z41 that emits green light, a second sub-pixel having a second light-emitting zone Z42 that emits blue light, and a third sub-pixel SP3 having a third light-emitting zone Z43 that emits red light. It will be understood that the first, second and third light-emitting zones themselves do not have corresponding colors, but instead emit light of corresponding colors when the display panel 100 displays an image.

It will be understood that the first, second and third light-emitting zones are named for convenience of description only, and do not have a limiting effect. For example, they may not have corresponding colors or emit light of corresponding colors themselves, but instead certain structures disposed within the corresponding light-emitting zones render or emit light of corresponding colors when the display panel 100 displays images or performs a specific process. When the display panel product is not in use, the light-emitting zones are not in a light emission state but have a capability of emitting corresponding colors under certain conditions such as the structures disposed therein being applied with signals or in a light emission state. The first, second, and third light-emitting zones can thus be understood as areas having specific shapes and located in specific positions, which have the ability to emit light or to render certain colors by means of the light-emitting structures in these areas. The area where the light is emitted or the color is rendered is closely related to the physical space occupied by a light-emitting zone. For example, they may theoretically be equal, or alternatively may have a similar contour or envelope in the optical sense.

In some embodiments, the plurality of pixels comprise a first pixel P3, the first light-emitting zone Z31 of the first pixel P3 has a substantially polygonal shape, the substantially polygonal shape comprising: a first side j1 substantially parallel to one side of the second light-emitting zone Z32 of the first pixel P3, and the one side of the second light-emitting zone Z32 of the first pixel P3 being opposite to the first light-emitting zone Z31; and a second side j2 substantially parallel to one side of the third light-emitting zone Z33 of the first pixel P3, and the one side of the third light-emitting zone Z33 of the first pixel P3 being opposite to the first light-emitting zone Z31.

In some embodiments, the plurality of pixels further comprise a second pixel P1, the first light-emitting zone Z31 of the first pixel P3 is adjacent to the second light-emitting zone Z12 and the third light-emitting zone Z13 of the second pixel P1, and the substantially polygonal shape of the first light-emitting zone Z31 of the first pixel P3 further comprises: a third side j3 substantially parallel to one side of the second light-emitting zone Z12 of the second pixel P1, and the one side of the second light-emitting zone Z12 of the second pixel P1 being opposite to the first light-emitting zone Z31; and a fourth side j4 substantially parallel to one side of the third light-emitting zone Z13 of the second pixel P1, and the one side of the third light-emitting zone Z13 of the second pixel P1 being opposite to the first light-emitting zone Z31.

In some embodiments, in each of the plurality of pixels, an acute angle between a direction of a line connecting two points farthest in the first light-emitting zones Z11, Z21, Z31, Z41 and the first direction D1 is less than 60 degrees or less than 45 degrees.

Figure 1B:
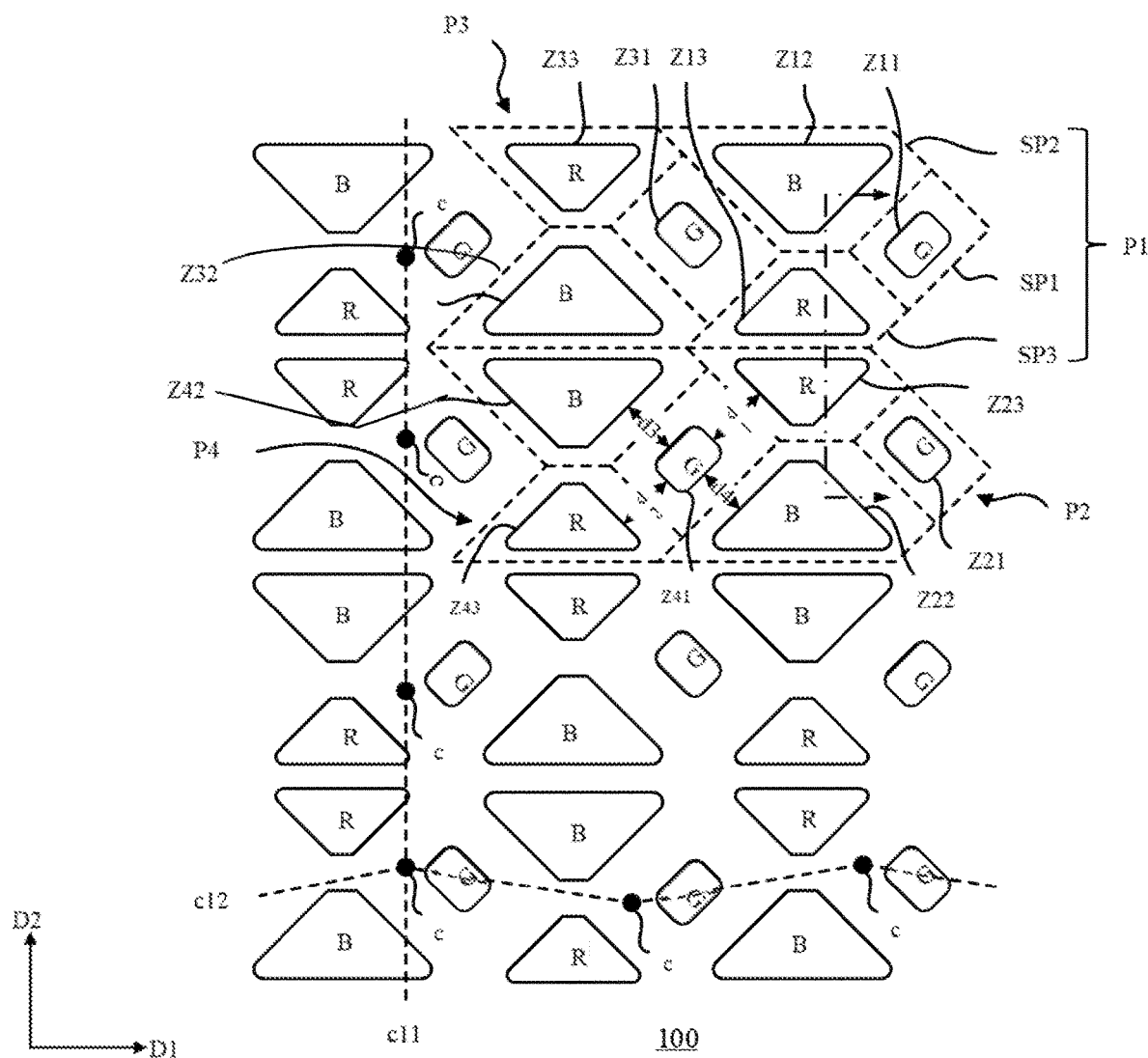

FIG. 1B is a pixel arrangement obtained after the pixel arrangement in FIG. 1A is rotated by 90°. It should be understood that the description of FIG. 1A in the present disclosure also applies to the arrangement of FIG. 1B after appropriate transformations, provided that there is no conflict with each other.

Figure 2:
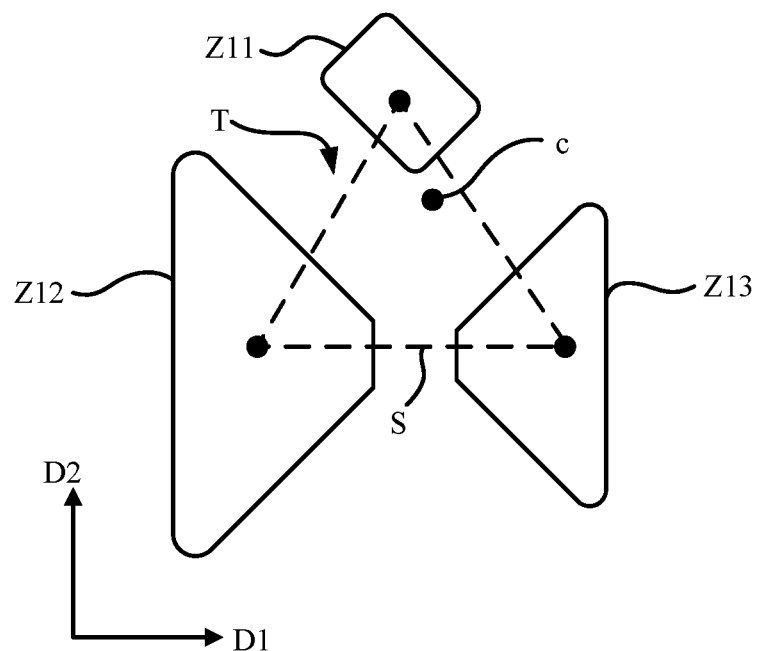
FIG. 2 is a schematic diagram showing one of the pixel regions of FIG. 1A.

FIG. 2 shows an example arrangement of the light-emitting zones of the pixel P1. As shown in FIG. 2, the first, second and third light-emitting zones Z11, Z12 and Z13 are arranged in a triangle T such that the first, second and third light-emitting zones Z11, Z12 and Z13 cover respective vertices of the triangle T, with one side S of the triangle T being substantially parallel to the first direction D1. Here, the term "substantially" is intended to encompass the deviation from an ideal situation introduced by the manufacturing process.

Specifically, the second light-emitting zone Z12 and the third light-emitting zone Z13 respectively cover a first vertex and a second vertex of the vertices of the triangle T with the first vertex and the second vertex respectively located at both ends of the side S, and the first light-emitting zone Z11 covers a third vertex of the vertices of the triangle T. One side of the triangle T is substantially parallel to the first direction D1, and the second and third light-emitting zones Z12 and Z13 respectively cover two vertices of three vertices of the triangle T, and the two vertices define the side S of the triangle which is substantially parallel to the first direction D1. It will be understood that the arrangement of the light-emitting zones of the pixel P1 described herein in connection with FIG. 2 is also applicable to other pixels in the display panel 100.

In some embodiments, the first, second, and third light-emitting zones Z11, Z12, and Z13 are arranged such that their centers are respectively located at the three vertices of the triangle T. This provides a regular pattern of light-emitting zones, producing a desired display effect. Here, the term center may refer to a geometric center or a center of gravity of the plane shape of the corresponding light-emitting zone, or a luminance center of the corresponding light-emitting zone at the time of light emission. For a light-emitting zone, the luminance center is defined as a point of the light-emitting zone perceived by the human eye to have the highest luminance at a given grayscale. More generally, the term center may refer to a point within the light-emitting zone that has a distance to the boundary of the light-emitting zone, which distance is greater than ⅔ of the distance from the geometric center of the light-emitting zone to the boundary.

In some embodiments, the first, second, and third light-emitting zones Z11, Z12, and Z13 are arranged such that the triangle T is a substantially isosceles triangle, with the side S being a base side. This further provides a regular pattern of light-emitting zones that improves the display performance. More generally, a distance from the center of the first light-emitting zone Z11 to the center of the second light-emitting zone Z12 is not less than a distance from the center of the first light-emitting zone Z11 to the center of the third light-emitting zone Z13.

In some embodiments, the plurality of pixels P1, P2 are arranged along the first direction D1, and a line connecting centers of the first light-emitting zones Z11, Z21 in the plurality of pixels P1, P2 is substantially parallel to the first direction D1.

In some embodiments, in one of the plurality of pixels, a line connecting a center of the second light-emitting zone and a center of the third light-emitting zone is substantially parallel to the first direction. For example, in pixel P1, a line connecting a center of the second light-emitting zone Z12 and a center of the third light-emitting zone Z13 is substantially parallel to the first direction D1.

In some embodiments, in the plurality of pixels P1, P2, P3, P4, the first light-emitting zones Z11, Z21, Z31, Z41 have the same shape, the second light-emitting zones Z12, Z22, Z32, Z42 have the same shape, and the third light-emitting zones Z13, Z23, Z33, Z43 have the same shape.

In some embodiments, the first light-emitting zone has a shape selected from a group consisting of a rectangle, parallelogram, trapezoid, pentagon, hexagon, heptagon, and octagon.

In the example of FIG. 2, the first light-emitting zone Z11 has a substantially rectangular shape. By "substantially rectangular shape" is meant in this example a rectangle having one or more rounded corners. Specifically, the substantially rectangular shape has a longer side substantially parallel to a side of the second light-emitting zone Z12 opposite to the first light-emitting zone Z11 and a shorter side substantially parallel to a side of the third light-emitting zone Z13 opposite to the first light-emitting zone Z11. It will be understood that in an embodiment in which the side of the second light-emitting zone Z12 opposite to the first light-emitting zone Z11 is as long as the side of the third light-emitting zone Z13 opposite to the first light-emitting zone Z11 (e.g., the second light-emitting zone Z12 in mirror symmetry to the third light-emitting zone Z13), the substantially rectangular shape of the first light-emitting zone Z11 would become a substantially square shape.

The second light-emitting zone Z12 and the third light-emitting zone Z13 each have a substantially trapezoidal shape. The so-called substantially trapezoidal shape in this example has a longer base side and a shorter base side that are substantially parallel to each other, as well as one or more rounded corners. The formation of the rounded corners of the first, second, and third light-emitting zones Z11, Z12, and Z13 may be due to intentional design or due to unintentional design (e.g., the manufacturing process). For example, when a light-emitting layer is evaporated and deposited using a mask, a portion of the light-emitting zone corresponding to a corner of that mask may naturally form a rounded shape rather than a desired sharp corner due to a shadow effect.

In this example, the shorter base side of the second light-emitting zone Z12 and the shorter base side of the third light-emitting zone Z13 are opposite and substantially parallel to each other. More specifically, the longer base side and the shorter base side of the second light-emitting zone Z12, together with the longer base side and the shorter base side of the third light-emitting zone Z13, are substantially parallel to the second direction D2. As will be described later, the respective light-emitting zones are defined by respective ones of the openings of a pixel defining layer in the display panel. Accordingly, the shorter base side of the second light-emitting zone Z12 is a boundary of the opening defining the second light-emitting zone Z12, and the shorter base side of the third light-emitting zone Z13 is a boundary of the opening defining the third light-emitting zone Z13. The main portions of these two boundaries are substantially parallel to each other, and two rounded corners may be formed, respectively, at both ends of each of the boundaries due to the manufacturing process. In some embodiments, the second and third light-emitting zones Z12 and Z13 may each be a substantially isosceles trapezoidal shape. In addition, although not shown in FIG. 2, the longer base sides of two second or third light-emitting zones directly adjacent in the first direction D1 are also opposite and substantially parallel to each other. The pattern of the light-emitting zones as shown in FIG. 2 facilitates a compact arrangement of the first, second, and third light-emitting zones Z11, Z12, and Z13, thus increasing the resolution of the display panel 100. In some embodiments, a ratio of a length of the shorter base side of the second light-emitting zone Z12 to a length of the shorter base side of the third light-emitting zone Z13 is 0.8-1.2.

In some embodiments, in each of the plurality of pixels, an arrangement direction of both the second light-emitting zone and the third light-emitting zone is substantially parallel to the first direction or the second direction, and a size of the first light-emitting zone in the arrangement direction is smaller than a sum of sizes of both the second light-emitting zone and the third light-emitting zone in the arrangement direction. For example, in the FIG. 1A, in the pixel P1, an arrangement direction of both the second light-emitting zone Z12 and the third light-emitting zone Z13 is substantially parallel to the first direction D1, and a size of the first light-emitting zone Z11 in the arrangement direction is smaller than a sum of sizes of both the second light-emitting zone Z12 and the third light-emitting zone Z13 in the arrangement direction. For example, in the FIG. 1B, in the pixel P1, an arrangement direction of both the second light-emitting zone Z12 and the third light-emitting zone Z13 is substantially parallel to the second direction D2, and a size of the first light-emitting zone Z11 in the arrangement direction is smaller than a sum of sizes of both the second light-emitting zone Z12 and the third light-emitting zone Z13 in the arrangement direction.

In some embodiments, in the plurality of pixels, a shortest distance between the second light-emitting zone Z32 and its adjacent second light-emitting zone Z42 is not greater than a shortest distance between the second light-emitting zone Z32 and its adjacent third light-emitting zone Z33; and/or, a shortest distance between the third light-emitting zone Z13 and its adjacent third light-emitting zone Z23 is not greater than a shortest distance between the second light-emitting zone Z12 and its adjacent third light-emitting zone Z13.

In some embodiments, in one of the plurality of pixels, a ratio between a shortest distance between the first light-emitting zone Z11 and the second light-emitting zone Z12 and a shortest distance between the second light-emitting zone Z12 and the third light-emitting zone Z13 is 0.8-1.2.

FIG. 2 further shows a luminance center c of the pixel P1 as a whole. For a pixel, the luminance center refers to a point of the pixel that is perceived by human eyes to have the highest luminance when all of the sub-pixels of the pixel are at the same given grayscale. As shown in FIG. 2, the luminance center c is located inside the triangle T. More specifically, it is close to a line connecting the center of the first light-emitting zone Z11 and the center of the third light-emitting zone Z13 and closer to the first light-emitting zone Z11 that emits green light to which the human eyes are more sensitive. In this case, a distance from the luminance center to the first light-emitting zone Z11 of the pixel is less than a distance from the luminance center to the second light-emitting zone Z12 of the pixel or a distance from the luminance center to the third light-emitting zone Z13 of the pixel.

Figure 3:
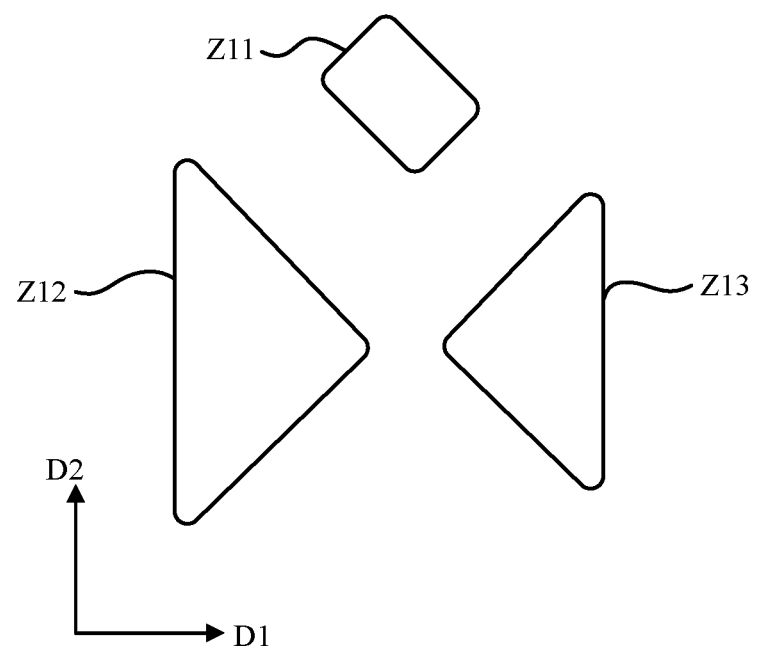
FIG. 3 is a schematic diagram showing a variation of the pixel region of FIG. 2.

FIG. 3 shows a variation of the arrangement of the light-emitting zones of the pixel P1. Referring to FIG. 3, the first light-emitting zone Z11 still has a substantially rectangular shape, and the second light-emitting zone Z12 and the third light-emitting zone Z13 now each have a substantially triangular shape having a base side substantially parallel to the second direction D2. Each of the second light-emitting zone Z12 and the third light-emitting zone Z13 has three rounded corners instead of ideal sharp corners due to, for example, the manufacturing process.

Figure 4:
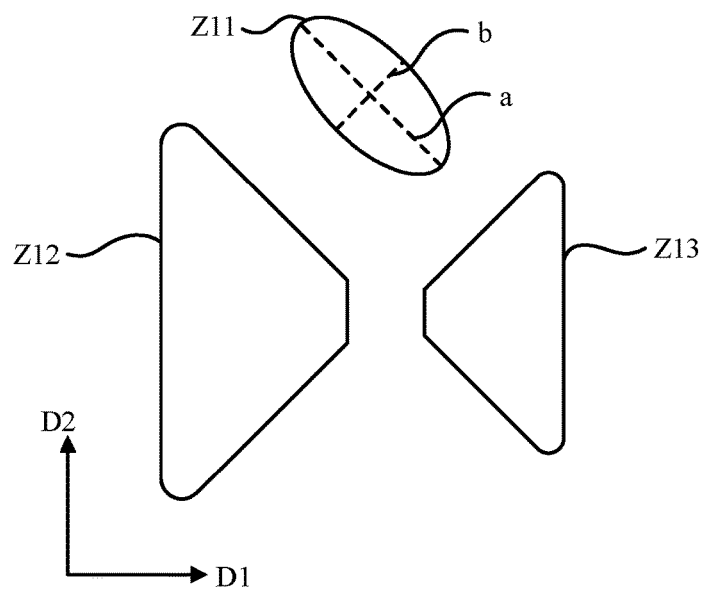
FIG. 4 is a schematic diagram showing another variation of the pixel region of FIG. 2.

FIG. 4 shows another variation of the arrangement of the light-emitting zones of the pixel P1. Referring to FIG. 4, the first light-emitting zone Z11 now has a substantially elliptical shape, and the second light-emitting zone Z12 and the third light-emitting zone Z13 each still have a substantially trapezoidal shape. Specifically, the substantially elliptical shape has a major axis a substantially parallel to a side of the second light-emitting zone Z12 opposite to the first light-emitting zone Z11 and a minor axis b substantially parallel to a side of the third light-emitting zone Z13 opposite to the first light-emitting zone Z11. It will be understood that in an embodiment in which the side of the second light-emitting zone Z12 opposite to the first light-emitting zone Z11 is as long as the side of the third light-emitting zone Z13 opposite to the first light-emitting zone Z11 (e.g., the second light-emitting zone Z12 in mirror symmetry to the third light-emitting zone Z13), the substantially elliptical shape of the first light-emitting zone Z11 would become a substantially circular shape.

More generally, in the embodiments described above in connection with FIGS. 2 to 4, the first light-emitting zone Z11 has a first size in a direction parallel to the side of the second light-emitting zone Z12 opposite to the first light-emitting zone Z11, and a second size in a direction parallel to the side of the third light-emitting zone Z13 opposite to the first light-emitting zone Z11, the first size being greater than or equal to the second size. Such an arrangement is based on the concept that the first, second and third light-emitting zones Z11, Z12 and Z13 are closely and evenly arranged.

Referring back to FIG. 1A, the plurality of pixels are arranged such that any two pixels directly adjacent in the first direction D1 have respective patterns of first, second, and third light-emitting zones, which patterns are substantially mirror symmetrical to each other with respect to a symmetry axis, and the symmetry axis is substantially parallel to the second direction D2. For example, the pattern of first, second, and third light-emitting zones of the pixel P1 is substantially mirror-symmetrical to the pattern of first, second, and third light-emitting zones of the pixel P2. For another example, the pattern of first, second, and third light-emitting zones of the pixel P3 is also substantially mirror-symmetrical to the pattern of first, second, and third light-emitting zones of the pixel P4. Here, the phrase "A and B are substantially mirror-symmetrical" means that most (e.g., at least 70% of) regions of A and B coincide with each other after A and B are folded along a center line therebetween.

In some embodiments, the plurality of pixels are arranged such that, in four pixels distributed in a 2*2 matrix, two diagonally adjacent pixels have substantially repeating patterns of first, second and third light-emitting zones with respect to each other. The pixels are arranged such that any two diagonally adjacent pixels have a substantially repeating pattern of first, second and third light-emitting zones with respect to each other. For example, the pixel P1 and the diagonally adjacent pixel P4 have a substantially repeating pattern of first, second, and third light-emitting zones with respect to each other, and the pixel P2 and the diagonally adjacent pixel P3 have a substantially repeating pattern of first, second and third light-emitting zones with respect to each other. As a result, for any two pixels directly adjacent in the second direction D2, the patterns of first, second, and third light-emitting zones are horizontally inverted with respect to each other. For example, the pattern of first, second, and third light-emitting zones of the pixel P3 is horizontally inverted with respect to the pattern of first, second, and third light-emitting zones of the pixel P1. Here, the phrase "A and B having a substantially repeating pattern" may encompass 1) a situation where the patterns of A and B duplicate each other in terms of e.g. structure and shape, and 2) a situation where deviations from an ideal situation are introduced by the manufacturing process. For example, A and B may in some cases be perforated at different portions for wiring purposes, or their main bodies may correspond to each other in terms of shape and structure except that some of the layers disposed therein are slightly deformed. For example, the main pattern of an anode layer may have an extending portion to facilitate the connection to signal lines.

Embodiments of the present disclosure may realize a pixel arrangement of Real RGB as compared to a sub-pixel rendering (SPR) approach in which adjacent pixels share sub-pixels, thereby eliminating the need for signal processing and hardware circuitry for SPR purposes. Additionally, embodiments of the present disclosure may achieve process compatibility without the need for special process steps.

With continued reference to FIG. 1A, in this example, any two first light-emitting zones adjacent in the first direction D1 have different orientations from each other. For example, the length direction of the first light-emitting zone Z11 in the pixel P1 is at an angle of about 45 degrees with respect to the first direction D1, and the length direction of the first light-emitting zone Z21 in the pixel P2 is at an angle of about 45 degrees with respect to the first direction D1, such that the length direction of the first light-emitting zone Z11 is substantially perpendicular to the length direction of the first light-emitting zone Z21. In this example, any two first light-emitting zones adjacent in the second direction D2 also have different orientations from each other. For example, the length direction of the first light-emitting zone Z11 in the pixel P1 is at an angle of about 45 degrees with respect to the first direction D1, and the length direction of the first light-emitting zone Z31 in the pixel P3 is also at an angle of about 45 degrees with respect to the first direction D1, such that the length direction of the first light-emitting zone Z11 is substantially perpendicular to the length direction of the first light-emitting zone Z31. This provides a regular pattern of light-emitting zones that produces a desired display effect.

Other embodiments are also contemplated. For example, each of the first light-emitting zones may have a shape such as a substantially square, substantially elliptical or substantially circular shape.

In some embodiments, each of the first light-emitting zones is disposed substantially equidistant from diagonally adjacent ones of the second and third light-emitting zones. For example, the first light-emitting zone Z41 has a first distance d1 from the diagonally adjacent third light-emitting zone Z23, a second distance d2 from the diagonally adjacent third light-emitting zone Z43, a third distance d3 from the diagonally adjacent second light-emitting zone Z42, and a fourth distance d4 from the diagonally adjacent second light-emitting zone Z22, with the first distance d1, the second distance d2, the third distance d3, and the fourth distance d4 being substantially equal. In this context, the distance between two light-emitting zones is defined as the shortest distance between the boundaries of two openings of a pixel defining layer that define respective ones of these two light-emitting zones. This provides a pixel arrangement in which the first light-emitting zones are evenly distributed, resulting in a desired display effect.

In some embodiments, the distance between the second light-emitting zone and the third light-emitting zone that are directly adjacent in the first direction D1 is greater than the distance between any two second or third light-emitting zones that are directly adjacent in the first direction D1. For example, the distance between the second light-emitting zone Z12 and the third light-emitting zone Z13 is greater than the distance between the second light-emitting zones Z32 and Z42 or the third light-emitting zones Z13 and Z23 that are directly adjacent in the first direction D1. This provides a specific pixel arrangement that produces a desired display effect.

In the example of FIG. 1A, the first light-emitting zone emits green light (G), the second light-emitting zone emits blue light (B), and the third light-emitting zone emits red light (R). Since the human eyes are sensitive to the green light, the first light-emitting zone may have a relatively small area. In some embodiments, the first light-emitting zone emitting green light has a first area, the third light-emitting zone emitting red light has a third area, and the second light-emitting zone emitting blue light has a second area larger than the first area and the third area. Other embodiments are also contemplated. For example, the second light-emitting zone and the third light-emitting zone may have substantially equal areas. In this case, the first light-emitting zone may, for example, have a circular or square shape.

In some embodiments, each of the first light-emitting zones has a side opposite to a side of a diagonally adjacent one of the second light-emitting zones, the side of the first light-emitting zone being substantially parallel to the side of the diagonally adjacent second light-emitting zone. Also, each of the first light-emitting zones has a side opposite to a side of a diagonally adjacent one of the third light-emitting zones, the side of the first light-emitting zone being substantially parallel to the side of the diagonally adjacent third light-emitting zone. For example, in the pixel P1, the lower longer side of the first light-emitting zone Z11 may be substantially parallel to the upper lateral side of the diagonally adjacent second light-emitting zone Z12, and the lower shorter side of the first light-emitting zone Z11 may be substantially parallel to the upper lateral side of the diagonally adjacent third light-emitting zone Z13. This provides a uniform sub-pixel gap that helps reduce cross-coloring.

FIG. 1A further shows the luminance centers c of the pixels arranged in the first direction D1 and the luminance centers c of the pixels arranged in the second direction D2. In some embodiments, at least one of a first line or a second line sequentially connecting the luminance centers of the pixels arranged in the first direction or the second direction is a straight line. In some embodiments, at least one of a first line or a second line sequentially connecting the luminance centers of the pixels arranged in the first direction or the second direction has a zigzag shape and an acute angle between a polyline segment in the zigzag shape and an extending direction of the zigzag shape is less than 45 degrees. In this example arrangement, a line cl1 sequentially connecting the luminance centers c of the pixels arranged in the first direction D1 is substantially parallel to the first direction D1, and a line cl2 sequentially connecting the luminance centers c of the pixels arranged in the second direction D2 has a zigzag shape and an acute angle between a polyline segment in the zigzag shape and an extending direction of the zigzag shape is less than 45 degrees.

Figure 5A:
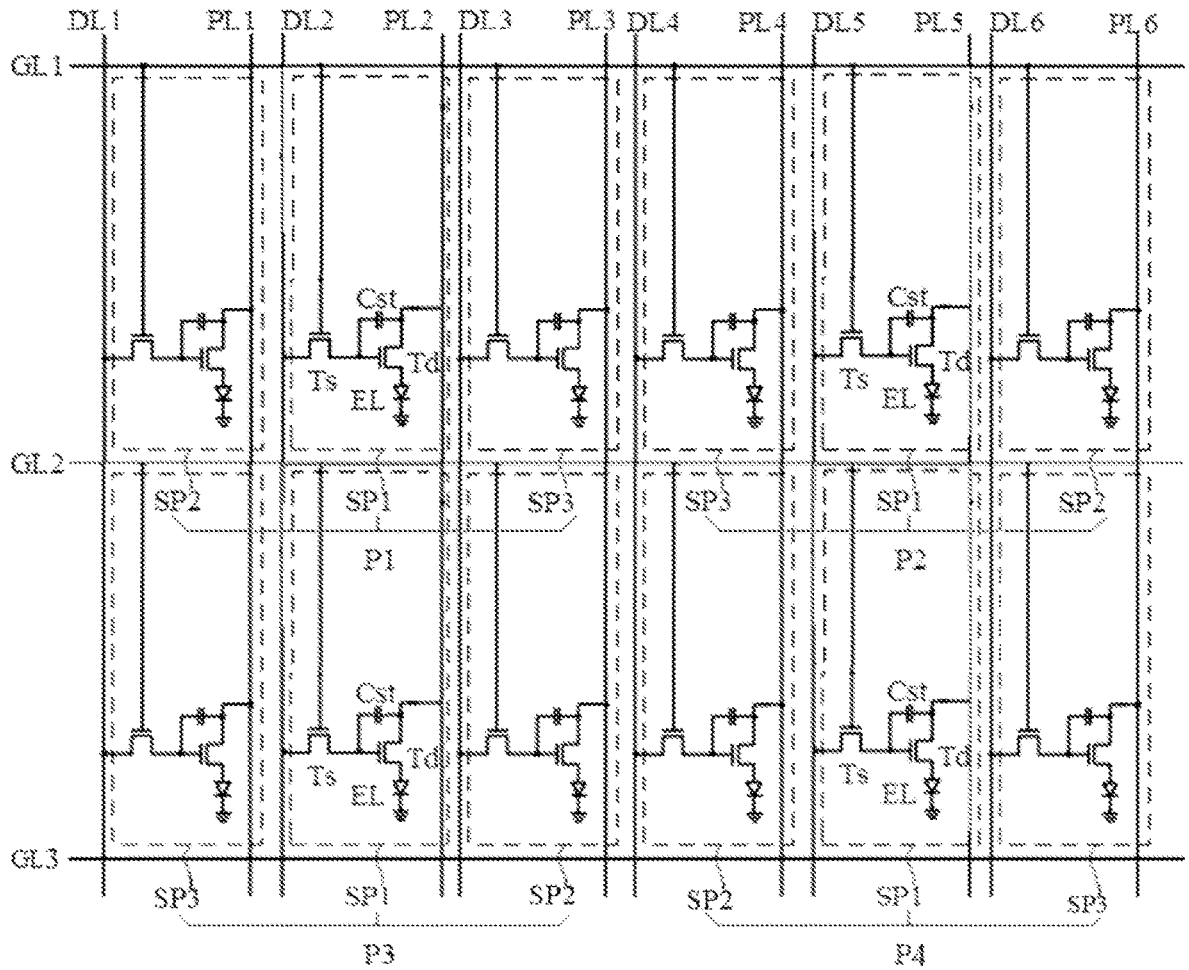
FIGS. 5A-5B are circuit diagrams of example circuits according to some embodiments of the present disclosure.

FIG. 5A is a circuit diagram of an example circuit of the pixels P1, P2, P3 and P4 corresponding to FIG. 1A. Referring to FIG. 5A, the display panel 100 includes first and second gate lines GL1 and GL2, first to sixth data lines DL1, DL2, DL3, DL4, DL5 and DL6, and first to sixth power supply lines PL1, PL2, PL3, PL4, PL5 and PL6. A region surrounded by the first and second gate lines GL1 and GL2, the first data line DL1, and the third power line PL3 is defined as the pixel P1, and a region surrounded by the first and second gate lines GL1 and GL2, the fourth data line DL4, and the sixth power source line PL6 is defined as the pixel P2.

In some embodiments, in the plurality of pixels: a plurality of second light-emitting zones or third light-emitting zones arranged in the second direction are connected to a same data line; a plurality of first light-emitting zones arranged in the second direction are connected to a same data line; a first light-emitting zone, a second light-emitting zone, and a third light-emitting zone in a same pixel are connected to a same control line; and two adjacent pixels in the first direction are connected to a same control line, and wherein the control line comprises at least one of a scan line, a light-emitting control line, or a reset control line. The pixel P1 is divided into three sub-pixels SP1, SP2, and SP3, each of which includes a switching transistor Ts, a driving transistor Td, a storage capacitor Cst, and a light emitting diode EL. In this example, the switching transistor Ts, the driving transistor Td, the storage capacitor Cst and the light emitting diode EL in the second sub-pixel SP2 are driven by signals from the first gate line GL1 and the first data line DL1, the switching transistor Ts, the driving transistor Td, the storage capacitor Cst and the light emitting diode EL in the first sub-pixel SP1 are driven by signals from the first gate line GL1 and the second data line DL2, and the switching transistor Ts, the driving transistor Td, the storage capacitor Cst and the light emitting diode EL in the third sub-pixel SP3 are driven by signals from the first gate line GL1 and the third data line DL3.

Similarly, the pixel P2 is divided into three sub-pixels SP1, SP2, and SP3, each of which includes a switching transistor Ts, a driving transistor Td, a storage capacitor Cst, and a light emitting diode EL. In this example, the switching transistor Ts, the driving transistor Td, the storage capacitor Cst and the light emitting diode EL in the third sub-pixel SP3 are driven by signals from the first gate line GL1 and the fourth data line DL4, the switching transistor Ts, the driving transistor Td, the storage capacitor Cst and the light emitting diode EL in the first sub-pixel SP1 are driven by signals from the first gate line GL1 and the fifth data line DL5, and the switching transistor Ts, the driving transistor Td, the storage capacitor Cst and the light emitting diode EL in the second sub-pixel SP2 are driven by signals from the first and sixth data lines GL1 and DL6.

In some embodiments, both the data line to which the plurality of second light-emitting zones or third light-emitting zones arranged in the second direction are connected and the data line to which the plurality of first light-emitting zones arranged in the second direction are connected are alternately arranged in the first direction. For example, for the pixels P1 and P3, both the data line DO or DB to which the plurality of second light-emitting zones or third light-emitting zones arranged in the second direction are connected and the data line DL2 to which the plurality of first light-emitting zones arranged in the second direction are connected are alternately arranged in the first direction. In the display panel 100, any two sub-pixels directly adjacent in the first direction D1 and having light-emitting zones emitting light of the same color are connected to respective separate data lines. For example, in FIG. 5A, the two sub-pixels SP3 that are directly adjacent and have light-emitting zones emitting light of the same color are connected to the third and fourth data lines DL3 and DL4, respectively. This enables the light-emitting zones that are directly adjacent and emit light of the same color to be driven by different image data, realizing the color mode of Real RGB.

It will be understood that the circuit shown in FIG. 5A is merely exemplary and illustrative, and that in other embodiments the sub-pixels may have other forms of circuitry.

For example, for the pixel arrangement shown in FIG. 1B, the circuit arrangement may also change correspondingly as the arrangement of the light-emitting zones changes. For example, corresponding to GL1, the drive circuit corresponding to SP1 is arranged on the far right, the drive circuit corresponding to SP2 or SP3 is arranged secondly from the right, and the drive circuit corresponding to SP3 or SP2 is arranged thirdly from the right.

Figure 5B:
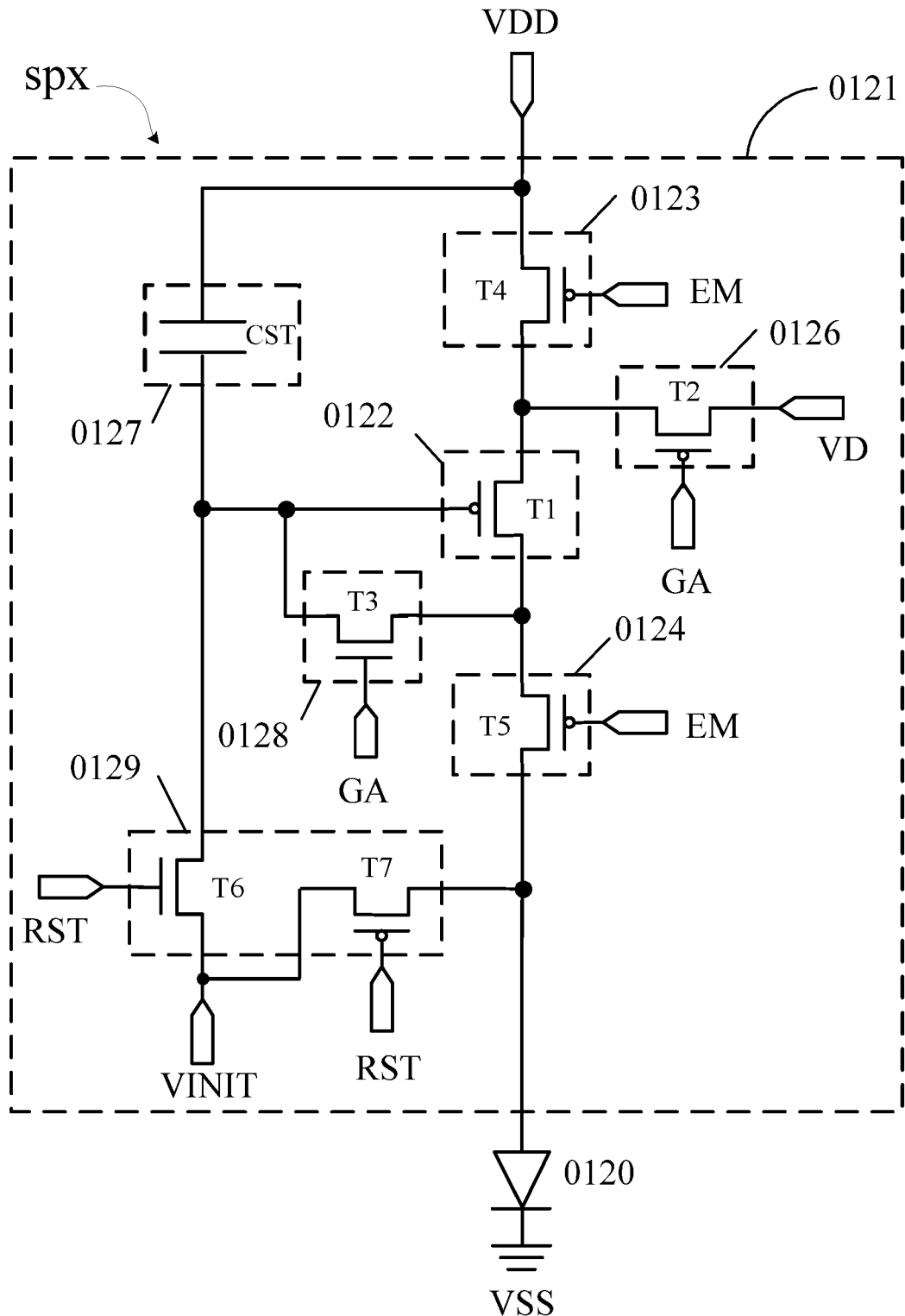

Illustratively, FIG. 5B shows a pixel circuit according to another embodiment. As shown in FIG. 1A, FIG. 1B and FIG. 5B, at least one sub-pixel (for example, each sub-pixel) of the plurality of sub-pixels may include: a pixel circuit 0121 and a light-emitting element 0120. The pixel circuit 0121 includes a transistor and a capacitor, and generates an electrical signal through the interaction of the transistor and the capacitor, and the generated electrical signal is input to the anode of the light-emitting element 0120. In addition, a corresponding voltage is applied to the cathode of the light-emitting element 0120 to drive the light-emitting element 0120 to emit light.

With reference to FIG. 5B, the pixel circuit 0121 may include: a drive control circuit 0122, a first light-emitting control circuit 0123, a second light-emitting control circuit 0124, a data writing circuit 0126, a storage circuit 0127, a threshold compensation circuit 0128, and a reset circuit 0129.

The drive control circuit 0122 may include a control terminal, a first terminal, and a second terminal. The drive control circuit 0122 is configured to provide the light-emitting element 0120 with a driving current for driving the light-emitting element 0120 to emit light. For example, the first light-emitting control circuit 0123 is connected to the first terminal of the drive control circuit 0122 and the first voltage terminal VDD. The first light-emitting control circuit 0123 is configured to switch on or off the connection between the drive control circuit 0122 and the first voltage terminal VDD.

The second light-emitting control circuit 0124 is electrically connected to the second terminal of the driving control circuit 0122 and the anode of the light emitting element 0120. The second light emitting control circuit 0124 is configured to switch on or off the connection between the drive control circuit 0122 and the light emitting element 0120.

The data writing circuit 0126 is electrically connected to the first terminal of the drive control circuit 0122. The data writing circuit 0126 is configured to write the signal of the data line VD into the storage circuit 0127.

The storage circuit 0127 is electrically connected to the control terminal of the drive control circuit 0122 and the first voltage terminal VDD. The storage circuit 0127 is configured to store data signals and information of the drive control circuit 0122.

The threshold compensation circuit 0128 is electrically connected to the control terminal and the second terminal of the drive control circuit 0122, respectively. The threshold compensation circuit 0128 is configured to perform threshold compensation for the drive control circuit 0122.

The reset circuit 0129 is also electrically connected to the control terminal of the drive control circuit 0122 and the anode of the light-emitting element 0120, respectively. The reset circuit 0129 is configured to reset the anode of the light-emitting element 0120 and reset the control terminal of the drive control circuit 0122.

The light-emitting element 0120 can be configured as an electroluminescent diode, such as at least one of OLED, QLED, micro LED, and mini OLED. The light-emitting element 0120 may include an anode, a light-emitting layer, and a cathode that are stacked. Further, the light-emitting layer may also include film layers such as a hole injection layer, a hole transport layer, an electron transport layer, and an electron injection layer. Of course, in actual applications, the light-emitting element 0120 can be designed and determined according to the requirements of the actual application environment, which is not limited here.

Exemplarily, as shown in FIG. 5B, the drive control circuit 0122 includes a driving transistor T1, the control terminal of the drive control circuit 0122 includes the gate of the driving transistor T1, the first terminal of the drive control circuit 0122 includes the first electrode of the driving transistor T1, and the second terminal of the driving control circuit 0122 includes the second electrode of the driving transistor T1.

Exemplarily, as shown in FIG. 5B, the data writing circuit 0126 includes a data writing transistor T2. The storage circuit 0127 includes a storage capacitor CST. The threshold compensation circuit 0128 includes a threshold compensation transistor T3. The first light-emitting control circuit 0123 includes a light-emitting control transistor T4. The second light-emitting control circuit 0124 includes a conduction control transistor T5. The reset circuit 0129 includes an initialization transistor T6 and a reset transistor T7.

Specifically, the first electrode of the data writing transistor T2 is electrically connected to the first electrode of the driving transistor T1, the second electrode of the data writing transistor T2 is configured to be electrically connected to the data line VD to receive the data signal, and the gate of the data writing transistor T2 is configured to be electrically connected to the scan line GA to receive a signal.

The first electrode of the storage capacitor CST is electrically connected to the first power supply terminal VDD, and the second electrode of the storage capacitor CST is electrically connected to the gate of the driving transistor T1.

The first electrode of the threshold compensation transistor T3 is electrically connected to the second electrode of the driving transistor T1, the second electrode of the threshold compensation transistor T3 is electrically connected to the gate of the driving transistor T1, and the gate of the threshold compensation transistor T3 is configured to be electrically connected to the scan line GA to receive the signal.

The first electrode of the initialization transistor T6 is configured to be electrically connected to the initialization line VINIT to receive a reset signal, the second electrode of the initialization transistor T6 is electrically connected to the gate of the driving transistor T1, and the gate of the initialization transistor T6 is configured to be electrically connected to the reset line RST to receive the signal.

The first electrode of the reset transistor T7 is configured to be electrically connected to the initialization line VINIT to receive a reset signal, the second electrode of the reset transistor T7 is electrically connected to the anode of the light emitting element 0120, and the gate of the reset transistor T7 is configured to be electrically connected to the reset line RST to receive the signal.

The first electrode of the light-emitting control transistor T4 is electrically connected to the first power supply terminal VDD, the second electrode of the light-emitting control transistor T4 is electrically connected to the first electrode of the driving transistor T1, and the gate of the light-emitting control transistor T4 is configured to be electrically connected to the light-emitting control line EM to receive the light-emitting control signal.

The first electrode of the conduction control transistor T5 is electrically connected to the second electrode of the driving transistor T1, the second electrode of the conduction control transistor T5 is electrically connected to the anode of the light-emitting element 0120, and the gate of the conduction control transistor T5 is configured to be electrically connected to the light-emitting control line EM to receive the light-emitting control signal.

The cathode of the light-emitting element 0120 is electrically connected to the second power supply terminal VSS. The first electrodes and the second electrodes of the above-mentioned transistors can be determined as the source or the drain according to the actual application, which is not limited herein.

Exemplarily, one of the first power supply terminal VDD and the second power supply terminal VSS is a high-voltage terminal and the other is a low-voltage terminal. For example, in the embodiment shown in FIG. 5B, the first power supply terminal VDD is a voltage source to output a constant first voltage. For example, the first voltage is a positive voltage. The second power supply terminal VSS may be a voltage source to output a constant second voltage. For example, the second voltage is 0 or a negative voltage. For example, in some examples, the second power supply terminal VSS may be grounded.

Figure 5C:
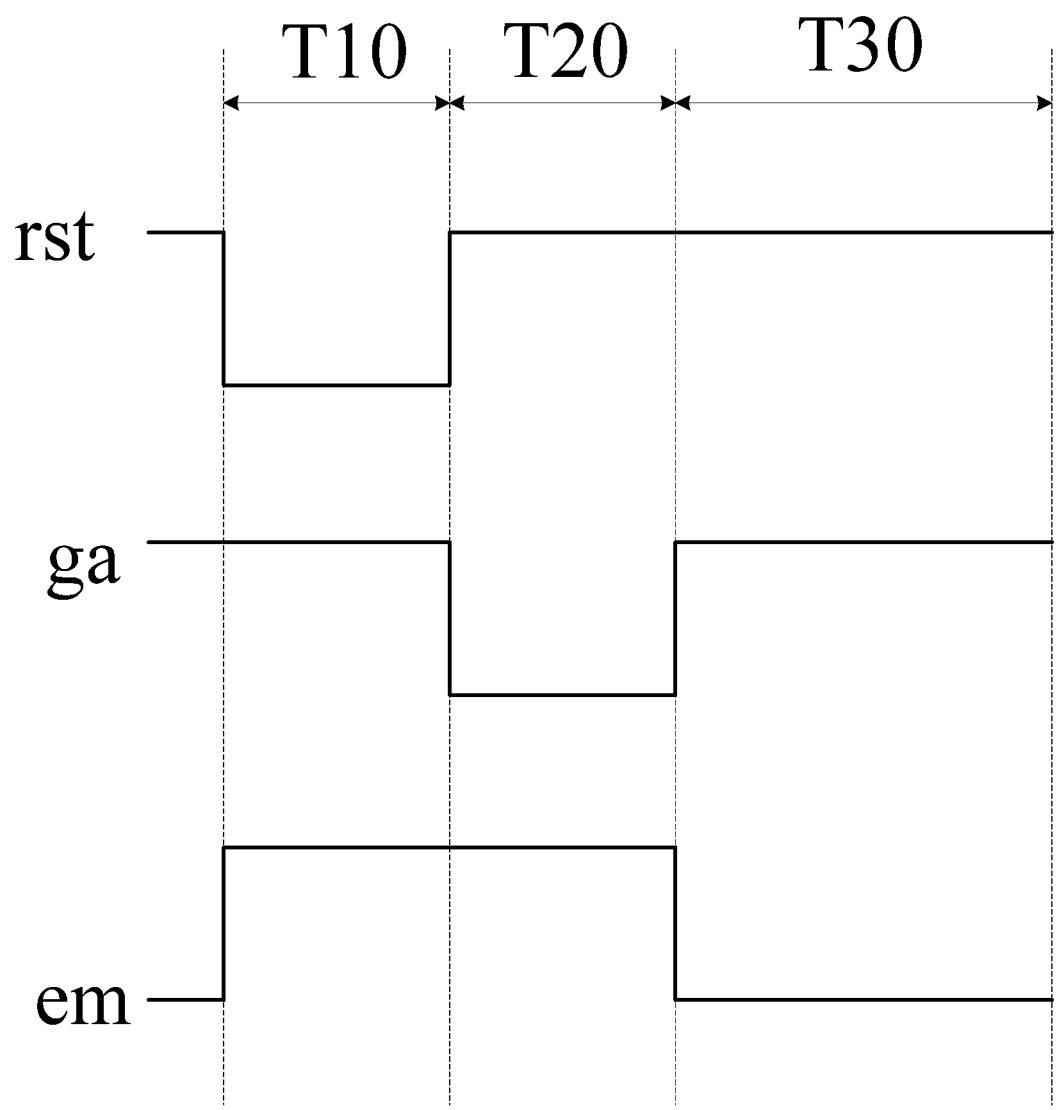
FIG. 5C is a timing diagram of the circuit shown in FIG. 5B.

The signal timing diagram corresponding to the pixel circuit shown in FIG. 5B is shown in FIG. 5C. In one frame of display time, the working process of the pixel circuit has three stages: T10 stage, T20 stage, and T30 stage. In FIG. 5C, rst represents the signal transmitted on the reset line RST, ga represents the signal transmitted on the scan line GA, and em represents the signal transmitted on the light-emitting control line EM.

In the T10 stage, the signal rst controls the initialization transistor T6 to be turned on, so that the signal transmitted on the initialization line VINIT can be provided to the gate of the driving transistor T1 to reset the gate of the driving transistor T1. The signal rst controls the reset transistor T7 to be turned on to provide the signal transmitted on the initialization line VINIT to the anode of the light-emitting element 0120 to reset the anode of the light-emitting element 0120. In addition, in this stage, the signal ga controls both the data writing transistor T2 and the threshold compensation transistor T3 to be turned off. The signal em controls both the light-emitting control transistor T4 and the conduction control transistor T5 to be turned off.

In the T20 stage, the signal ga controls the data writing transistor T2 and the threshold compensation transistor T3 to be turned on, and the turned-on data writing transistor T2 causes the data signal transmitted on the data line VD to charge the gate of the driving transistor T1 to make the voltage of the gate of the driving transistor T1 become: Vdata+Vth. Vth represents the threshold voltage of the driving transistor T1, and Vdata represents the voltage of the data signal. Moreover, in this stage, the signal rst controls both the initialization transistor T6 and the reset transistor T7 to be turned off. The signal em controls both the light-emitting control transistor T4 and the conduction control transistor T5 to be turned off.

In the T30 stage, the signal em controls both the light-emitting control transistor T4 and the conduction control transistor T5 to be turned on. The turned-on light-emitting control transistor T4 provides the voltage Vdd of the first power supply terminal VDD to the first electrode of the driving transistor T1, so that the voltage of the first electrode of the driving transistor T1 is Vdd. The driving transistor T1 generates a driving current according to its gate voltage Vdata+|Vth| and the voltage Vdd of the first electrode. The driving current is supplied to the light-emitting element 0120 through the turned-on conduction control transistor T5 to drive the light-emitting element 0120 to emit light. In this stage, the signal rst controls the initialization transistor T6 and the reset transistor T7 to be turned off. The signal ga controls the data writing transistor T2 and the threshold compensation transistor T3 to be turned off.

It should be noted that in the embodiments of the present disclosure, the first electrode of the above-mentioned transistor can be its source and the second electrode can be its drain; or the first electrode can be its drain and the second electrode can be its source. This can be designed and determined based on requirements of the actual application. In addition, the pixel circuit in the sub-pixel may not only have the structure shown in FIG. 5B and FIG. 5C, but also may have a structure including other numbers of transistors, which is not limited in the embodiment of the present disclosure.

The structure shown in FIG. 5B is taken as an example for description. Illustratively, the display panel includes a base substrate, a transistor array layer disposed on the base substrate, a first planarization layer located on a side of the transistor array layer away from the base substrate, a first electrode layer located on a side of the first planarization layer away from the base substrate, a pixel defining layer on a side of the first electrode layer away from the base substrate, a support layer on a side of the pixel defining layer away from the base substrate, a light-emitting layer on a side of the pixel defining layer away from the base substrate, and the cathode on a side of the light-emitting layer away from the base substrate. The transistor array layer can be used to form transistors and capacitors in the pixel circuit, as well as to form scan lines, reset lines, light-emitting control lines EM, initialization lines VINIT, first power supply signal lines VDD electrically connected to the first power supply terminal VDD, etc. Exemplarily, the transistor array layer may include an active semiconductor layer, a gate conductive layer, a reference conductive layer, and a source-drain metal layer (See also FIG. 6 below).

Figure 6:
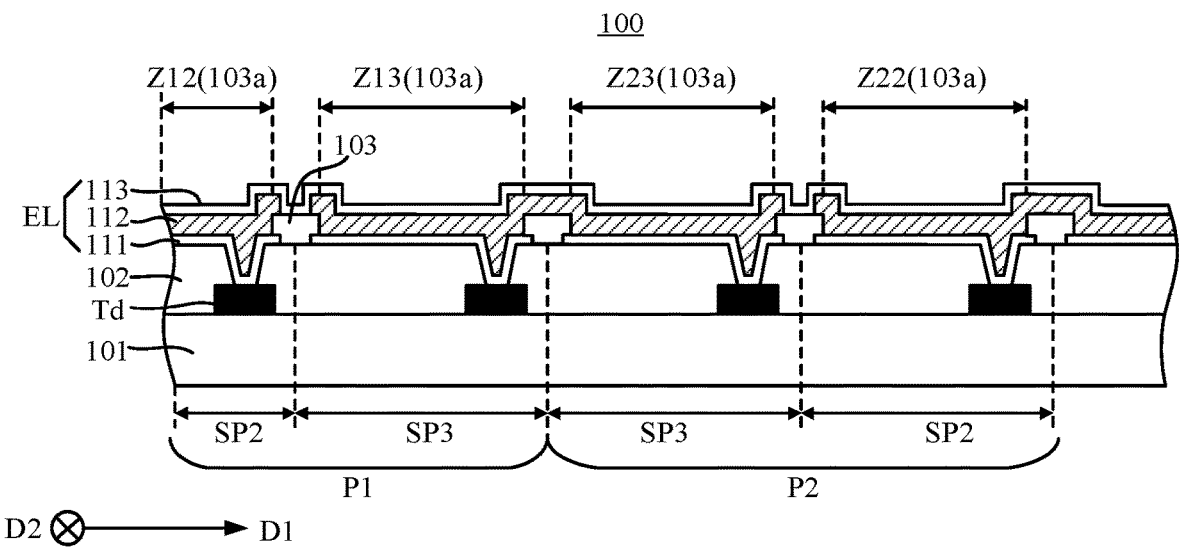
FIG. 6 is a schematic cross-sectional view of the display panel of FIG. 1A taken along line AA.

FIG. 6 is a schematic cross-sectional view of the display panel 100 taken along line AA in FIG. 1A. In this example, it is assumed that each sub-pixel takes the form of the circuit as shown in FIG. 5A.

Referring to FIG. 6, the display panel 100 includes a base substrate 101 on which a driving transistor Td and a switching transistor Ts (not shown) are formed in each sub-pixel region. Although not shown, each of the driving transistor Td and the switching transistor Ts includes a gate electrode, a semiconductor layer, a source electrode, and a drain electrode. For example, the driving transistor Td is of a top gate type and includes a semiconductor layer of polysilicon, a gate insulating layer on the semiconductor layer, a gate electrode on the gate insulating layer, and source and drain electrodes above the gate electrode. The center of the semiconductor layer serves as a channel, and impurities are doped to both ends of the semiconductor layer. The source and drain electrodes contact both ends of the semiconductor layer, respectively.

A passivation layer 102 is formed on the entire surface of the base substrate 101 to cover the driving transistor Td and the switching transistor Ts (not shown). The passivation layer 102 may be formed of an inorganic insulating material, for example, silicon oxide or silicon nitride, or an organic insulating material, for example, benzocyclobutene or acrylic resin.

In each of the sub-pixel regions, the organic light emitting diode EL includes a first electrode 111, an organic light emitting layer 112, and a second electrode 113 which are sequentially stacked in a direction away from the base substrate 101. The first electrode 111 may be electrically connected to the drain electrode of the driving transistor Td. The first electrode 111 serves as an anode, and the second electrode 113 serves as a cathode.

A pixel defining layer 103 is formed on the passivation layer 102 and at the boundaries of every two adjacent first electrodes 111 to delimit different sub-pixels. For example, in FIG. 6, the pixel defining layer 103 separates the organic light emitting layer 112 of the second sub-pixel SP2 from the organic light emitting layer 112 of the third sub-pixel SP3. In some embodiments, the two sub-pixels SP3 that are directly adjacent in the first direction D1 and emit light of the same color have an integrally formed organic light-emitting layer 112, as shown in FIG. 6. Although not shown, the two sub-pixels SP2 directly adjacent in the first direction D1 and emitting light of the same color may also have an integrally formed organic light-emitting layer 112. In practice, the integrally formed organic light-emitting layer 112 may be broken at a step due to the different heights of its different portions, but the orthographic projections of these portions onto the base substrate 101 are in communication with each other. More generally, the organic light-emitting layers 112 of any two sub-pixels directly adjacent in the first direction D1 and having light-emitting zone configured to emit light of the same color are formed such that the orthographic projections of these two organic light-emitting layers 112 onto the base substrate 101 are in communication with each other. The pixel defining layer 103 may be formed of an inorganic insulating material, for example, silicon oxide or silicon nitride, or an organic insulating material, for example, benzocyclobutene or acrylic resin.

In this example, the first electrodes 111 in different sub-pixel regions are separated from each other by the pixel defining layer 103, and the second electrodes 113 in different sub-pixel regions are integrally formed to cover the pixel defining layer 103 and the organic light-emitting layers 112 in different sub-pixel regions. At least a portion of the organic light emitting layer 112 is located on the pixel defining layer 103. The orthographic projection of the first electrode 111 onto the base substrate 101 partially overlaps the orthographic projection of the pixel defining layer 103 onto the base substrate 101. The pixel defining layer 103 includes a plurality of openings 103a that expose respective ones of the first electrodes 111 in the first, second, and third sub-pixels of the plurality of pixels. The respective openings 103a define respective ones of the first, second, and third light-emitting zones of the plurality of pixels. For example, the second light-emitting zone Z12 and the third light-emitting zone Z13 in the pixel P1, and the second light-emitting zone Z22 and the third light-emitting zone Z23 in the pixel P2, defined by the four openings 103a, respectively, are shown in FIG. 6.

As shown in FIG. 6, an orthographic projection of the organic light-emitting layer 112 of each sub-pixel on the substrate 101 onto the base substrate 101 has an area larger than an area of an orthographic projection of a corresponding one of the plurality of openings 103a onto the base substrate 101, such that the orthographic projection of the corresponding opening falls within the orthographic projection of the organic light emitting layer 112. It will be understood that although the openings 103a are illustrated as having vertical sidewalls in FIG. 6, this is merely illustrative. In some embodiments, each opening 103A may have a sloped sidewall such that the opening 103A tapers in a direction toward the base substrate 101. However, the orthographic projection of the portion having the largest dimension of the opening 103a onto the base substrate 101 still falls within the orthographic projection of the corresponding organic light-emitting layer 112.

In addition, for any two sub-pixels (e.g., the two sub-pixels SP3 shown in FIG. 6) that are directly adjacent in the first direction D1 and configured to emit light of the same color, their organic light-emitting layers 112 have orthographic projections onto the base substrate 101 that are in communication with each other, and the area of the orthographic projections in communication with each other is larger than the area of the orthographic projection of two corresponding openings 103a adjacent in the first direction D1 onto the base substrate 101. Accordingly, the orthographic projection of the two corresponding openings 103a falls within the orthographic projections of the organic light-emitting layer 112 that are in communication with each other.

In some embodiments, the first electrode 111 is formed on a side of the pixel defining layer 112 close to the base substrate 101, and at least part of the first electrode 111 is exposed by the plurality of openings 103a formed in the pixel defining layer 112. Two first electrodes of two second sub-pixels or two first electrodes of two third sub-pixels in at least two pixels adjacent in the first direction or the second direction are electrically connected (See also the description of FIG. 9-FIG. 23 below).

FIGS. 7A to 7D show, in plan views, various example arrangements of the light emitting layers in the pixel regions of FIG. 1A.

Reference numeral 112A indicates a light-emitting layer 112 corresponding to the first light-emitting zone (e.g., Z11) when viewed from above. Reference numeral 112A may also represent an orthographic projection of the light-emitting layer 112 onto the base substrate 101. Reference numeral 112B indicates an integrally formed light emitting layer 112 corresponding to two second light-emitting zones (e.g., Z32 and Z42) when viewed from above, which two second light-emitting zones are directly adjacent in the first direction D1. Reference numeral 112B may also represent an orthographic projection of that integrally formed light-emitting layer 112 onto the base substrate 101. Reference numeral 112C indicates an integrally formed light emitting layer 112 corresponding to two third light-emitting zones (e.g., Z13 and Z23) when viewed from above, which two third light-emitting zones are directly adjacent in the first direction D1. Reference numeral 112C may also represent an orthographic projection of that integrally formed light emitting layer 112 onto the base substrate 101.

Figure 7A:
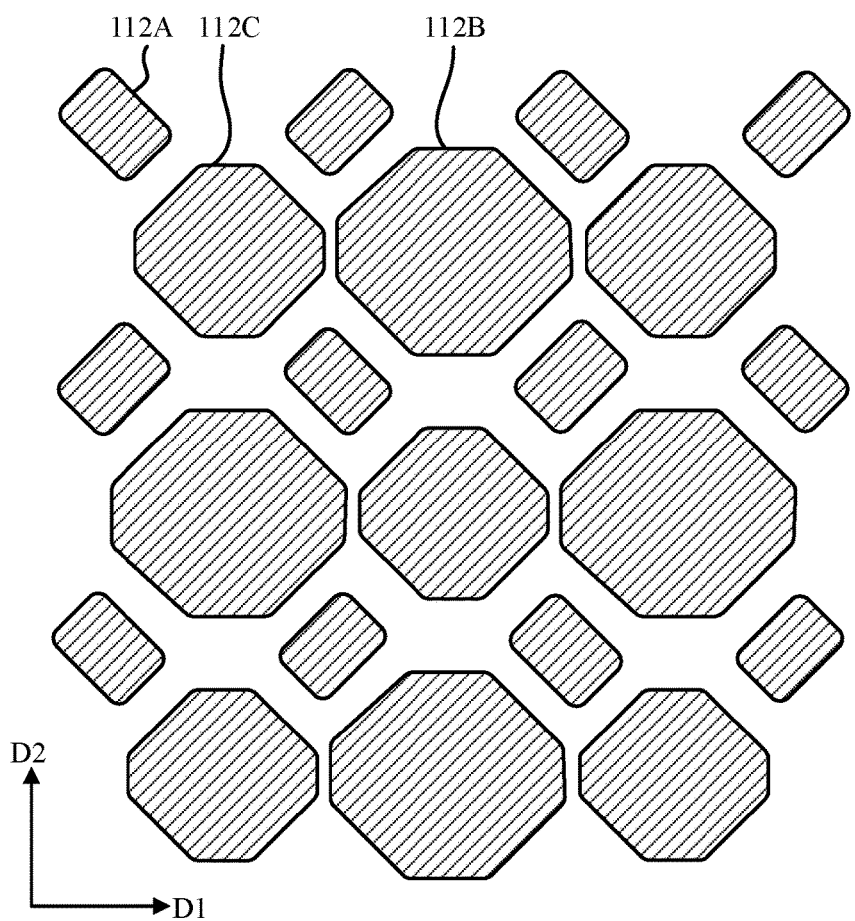
FIGS. 7A to 7D are schematic plan views showing various example arrangements of light emitting layers in the pixel regions of FIG. 1A.
Figure 7B:
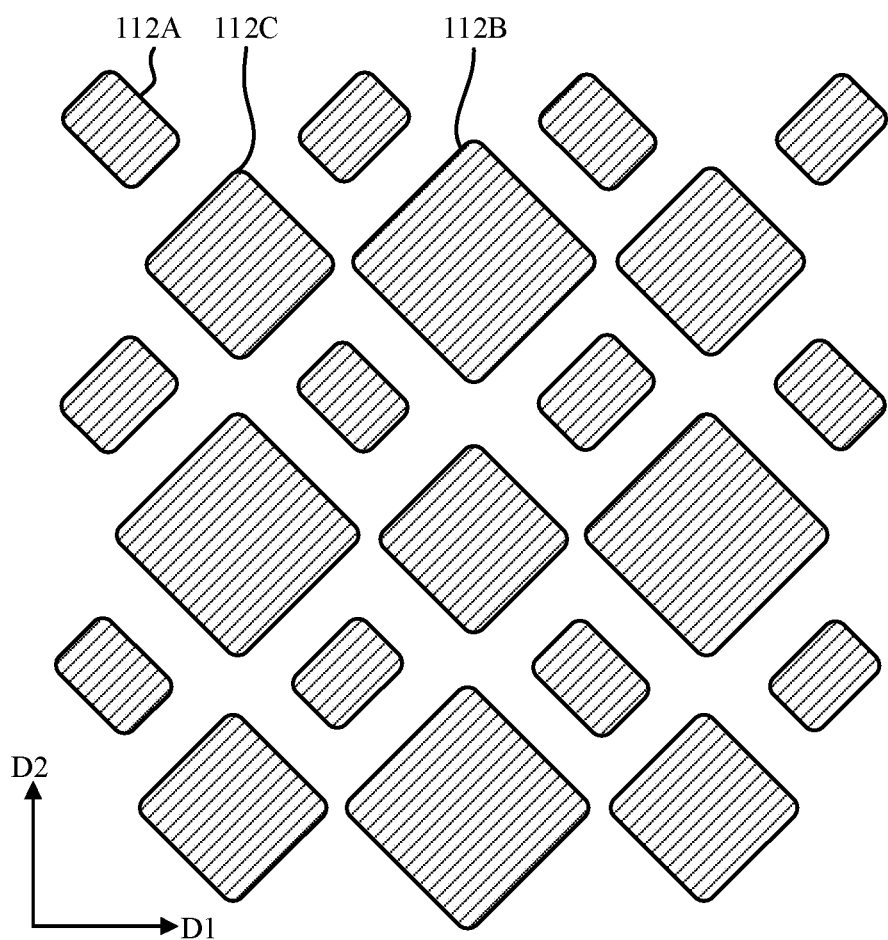
Figure 7C:
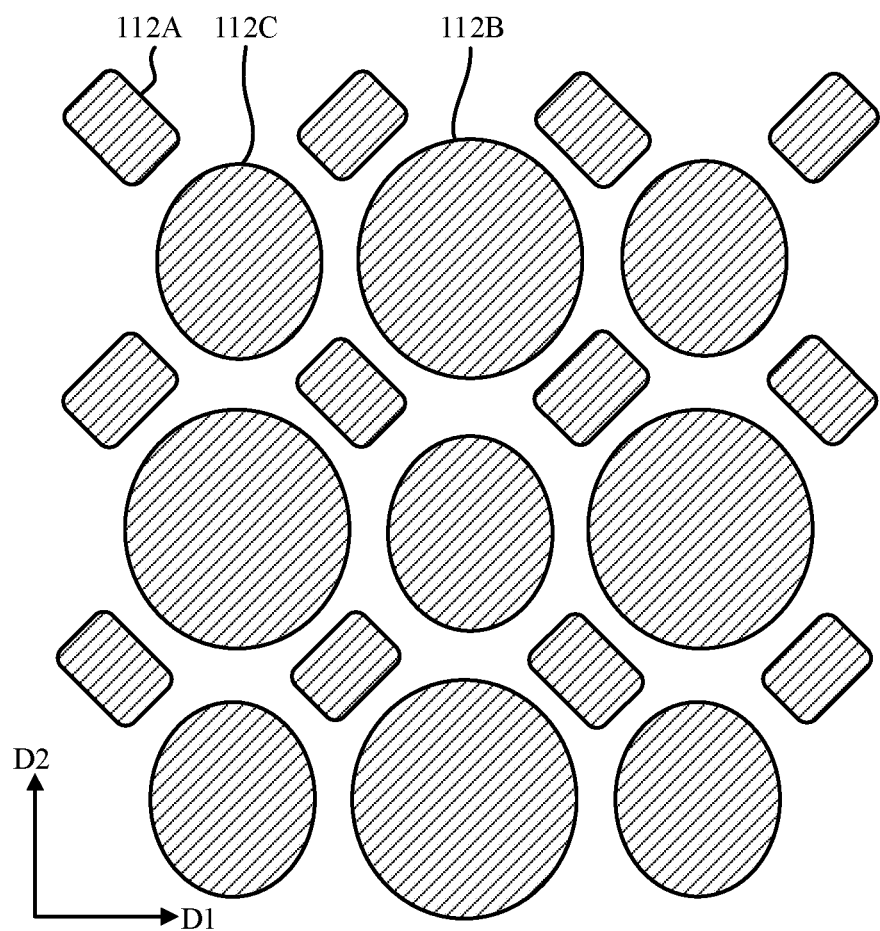
Figure 7D:
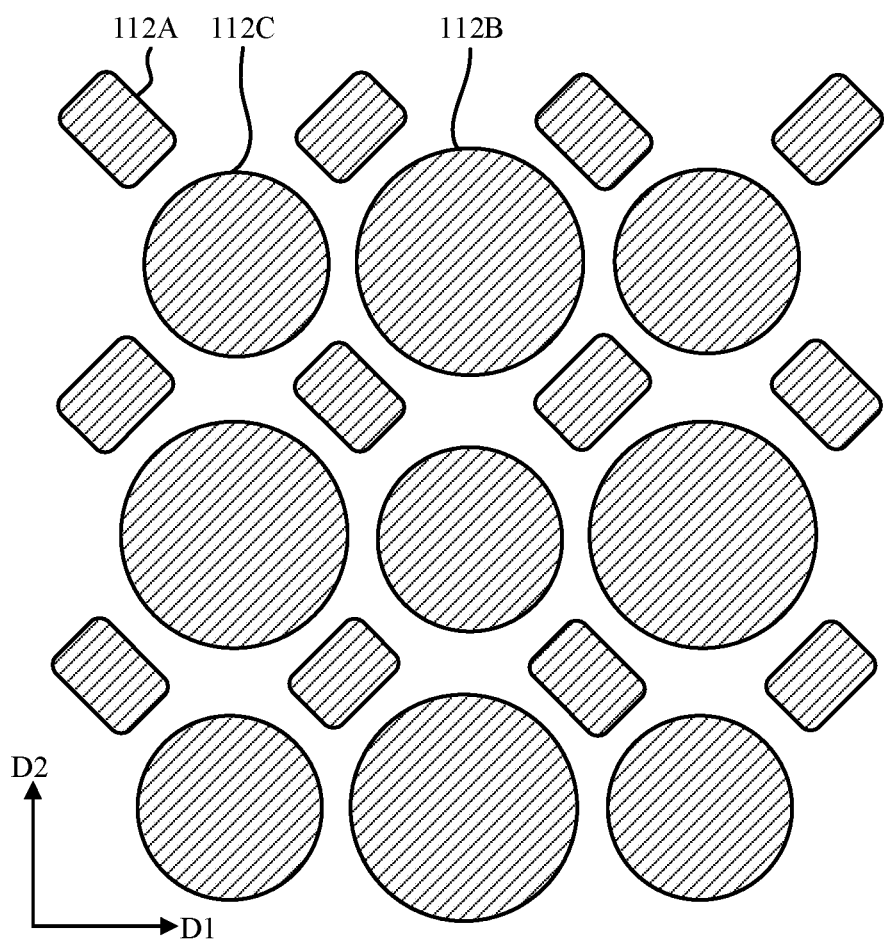

In FIG. 7A, the light-emitting layers 112B and 112C each have a shape of a rounded hexagon. In this case, the second and third light-emitting zones may each have, for example, a substantially trapezoidal shape (see FIG. 2). In FIG. 7B, the light-emitting layers 112B and 112C each have a shape of a rounded rectangle. In this case, the second and third light-emitting zones may each have, for example, a substantially triangular shape (see FIG. 3). In FIG. 7C, the light-emitting layers 112B and 112C each have a substantially elliptical shape. In FIG. 7D, the light-emitting layers 112B and 112C each have a substantially circular shape.

It will be understood that the shape of the light-emitting layer 112 when viewed from above is determined by the shape of the opening of the mask used in the evaporation process. In forming the light-emitting layers 112A, a first mask is used having a plurality of openings each corresponding to a respective one of the light-emitting layers 112A, and an evaporated first light-emitting material passes through the plurality of openings to form the light emitting layers 112A. In forming the light emitting layers 112B, a second mask is used having a plurality of openings each corresponding to a respective one of the light emitting layers 112B, and an evaporated second light-emitting material passes through the plurality of openings to form the light emitting layers 112B. In forming the light-emitting layers 112C, a third mask is used having a plurality of openings each corresponding to a respective one of the light-emitting layers 112C, and an evaporated third light-emitting material passes through the plurality of openings to form the light emitting layers 112C. Accordingly, the light-emitting layers 112A, 112B, and 112C may have any suitable shape depending on the mask used.

Figure 8A:
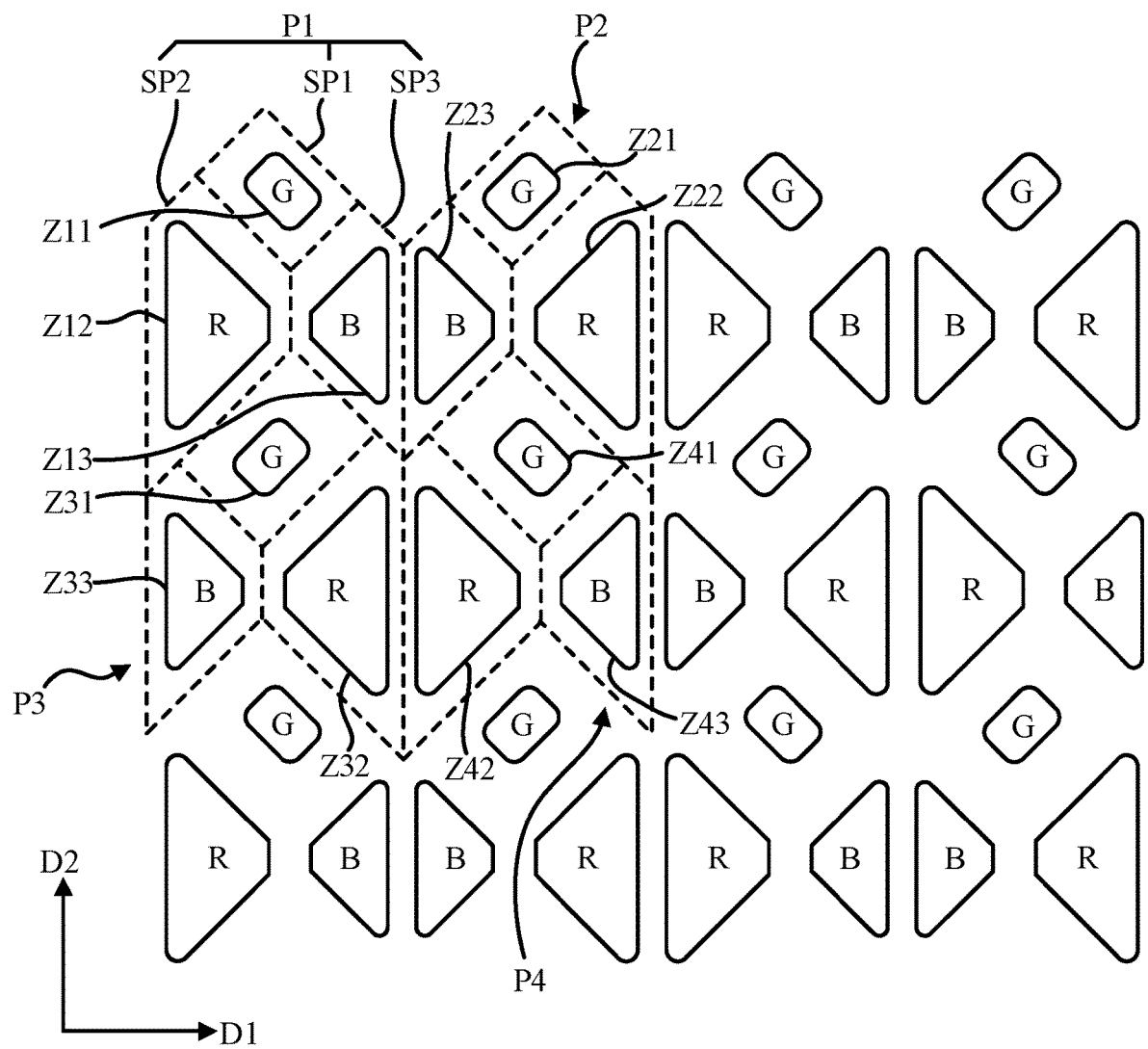
FIGS. 8A-8B are schematic diagrams showing pixel regions of display panels according to further embodiments of the present disclosure.

FIG. 8A is a schematic diagram showing the pixel regions of a display panel 200 according to another embodiment of the present disclosure.

Referring to FIG. 8A, the display panel 200 includes a plurality of pixels arranged in an array in the first direction D1 and the second direction D2, four of which are labeled P1, P2, P3, and P4, respectively. Each of the pixels includes a first sub-pixel having a first light-emitting zone configured to emit light of a first color, a second sub-pixel having a second light-emitting zone configured to emit light of a second color, and a third sub-pixel having a third light-emitting zone configured to emit light of a third color.

Unlike the display panel 100 of FIG. 1A, in the display panel 200, the first light-emitting zone emits green light, the second light-emitting zone emits red light, and the third light-emitting zone emits blue light. As shown in FIG. 8A, the pixel P1 includes a first sub-pixel SP1 having a first light-emitting zone Z11 that emits green light, a second sub-pixel SP2 having a second light-emitting zone Z12 that emits red light, and a third sub-pixel SP3 having a third light-emitting zone Z13 that emits blue light. The pixel P2 includes a first sub-pixel SP1 having a first light-emitting zone Z21 emitting green light, a second sub-pixel SP2 having a second light-emitting zone Z22 emitting red light, and a third sub-pixel SP3 having a third light-emitting zone Z23 emitting blue light. The pixel P3 includes a first sub-pixel SP1 having a first light-emitting zone Z31 that emits green light, a second sub-pixel SP2 having a second light-emitting zone Z32 that emits red light, and a third sub-pixel SP3 having a third light-emitting zone Z33 that emits blue light. The pixel P4 includes a first sub-pixel SP1 having a first light-emitting zone Z41 that emits green light, and a second sub-pixel SP2 having a second light-emitting zone Z42 that emits red light, a third sub-pixel SP3 having a third light-emitting zone Z43 that emits blue light.

In the example of FIG. 8A, the first light-emitting zone emitting green light has a first area, the second light-emitting zone emitting red light has a second area, and the third light-emitting zone emitting blue light has a third area, with the second area larger than the first area and the third area. Other embodiments are also contemplated. For example, the second light-emitting zone and the third light-emitting zone may have substantially equal areas. In this case, the first light-emitting zone may, for example, have a circular or square shape.

Figure 8B:
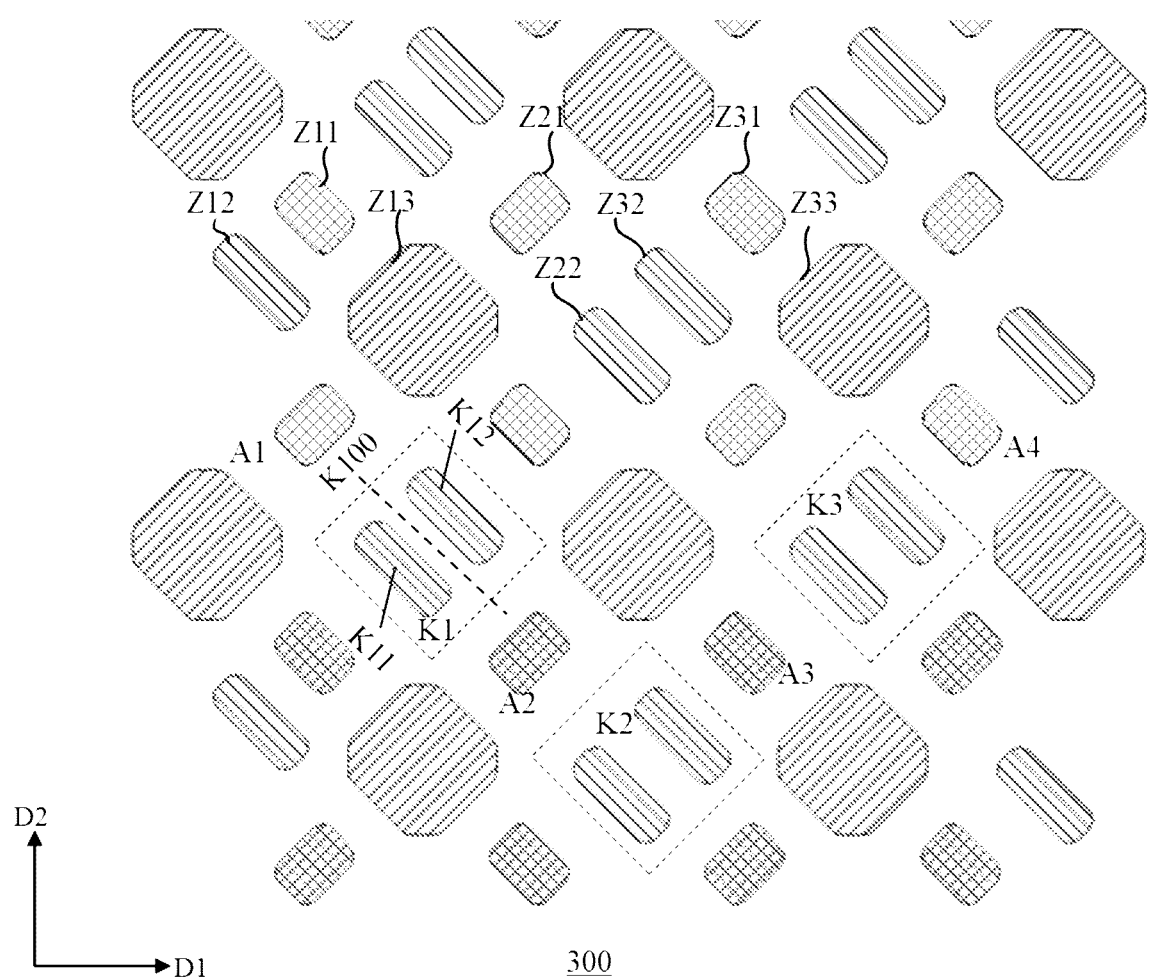

FIG. 8B is a schematic diagram showing pixel regions of a display panel 300 according to another embodiment of the present disclosure.

Referring to FIG. 8B, the display panel 300 includes a plurality of pixels arranged in an array in a first direction D1 and a second direction D2 intersecting (e.g., perpendicular to) the first direction D1. Each of the pixels includes a first sub-pixel having a first light-emitting zone configured to emit light of a first color, a second sub-pixel having a second light-emitting zone configured to emit light of a second color, and a third sub-pixel having (at least part of) a third light-emitting zone configured to emit light of a third color. In the example of FIG. 8, one pixel includes a first sub-pixel having a first light-emitting zone Z11 that emits green light, a second sub-pixel having a second light-emitting zone Z12 that emits blue light, and a third sub-pixel having (at least part of) a third light-emitting zone Z13 that emits red light; another pixel includes a first sub-pixel having a first light-emitting zone Z21 that emits green light, a second sub-pixel having a second light-emitting zone Z22 that emits blue light, and a third sub-pixel having (at least part of) a third light-emitting zone Z13 that emits red light (shares the third light-emitting zone Z13 with the previous pixel); and another pixel includes a first sub-pixel having a first light-emitting zone Z31 that emits green light, a second sub-pixel having a second light-emitting zone Z32 that emits blue light, and a third sub-pixel having (at least part of) a third light-emitting zone Z33 that emits red light.

Exemplarily, two second light-emitting zones (such as Z22 and Z32, such as K11 and K12) respectively included in two pixels adjacent in the first direction are adjacent to each other, and the two second light-emitting zones K11 and K12 are substantially symmetrical with respect to a symmetry axis K100, and the symmetry axis K100 is parallel to the longest side of one of the two second light-emitting zones K11 and K12. The two second light-emitting zones are directly adjacent in an oblique direction (for example, a direction that forms an angle of about 45° with the first direction D1 or the second direction D2). Two second light-emitting zones adjacent to each other are arranged between two first light-emitting zones, and the two first light-emitting zones are adjacent to each other in a direction that forms an angle of about 45° with the first direction D1 or the second direction D2. For example, two adjacent second light-emitting zones K11 and K12 in the zone K1 are arranged between the first light-emitting zones A1 and A2, and two adjacent second light-emitting zones in the zone K3 are arranged between the first light-emitting zones A3 and A4. Two adjacent second light-emitting zones on one side of a first light-emitting zone and two adjacent second light-emitting zones on opposite side of the first light-emitting zone have a centrosymmetry about a geometric center of the first light-emitting zone. For example, two adjacent second light-emitting zones in the zone K1 and two adjacent second light-emitting zones in the zone K2 have a centrosymmetry about a geometric center of the first light-emitting zone A2, and two adjacent second light-emitting zones in the zone K2 and two adjacent second light-emitting zones in the zone K3 have a centrosymmetry about a geometric center of the first light-emitting zone A3.

Exemplarily, in FIG. 8B, each of the first light-emitting zone, the second light-emitting zone, and the third light-emitting zone has a shape of a rounded rectangle. Exemplarily, the long side directions of the rectangles of the second light-emitting zones Z22 and Z32 are parallel to each other, and the long side directions form an angle of about 45° with D1 or D2. For example, the long side directions of the rectangles of the second light-emitting zones Z22 and Z32 is substantially perpendicular to the long side direction of the rectangle of the first light-emitting zone Z21.

FIG. 9-FIG. 23 are shown by the same or parallel plane as FIG. 1A.

Figure 9:
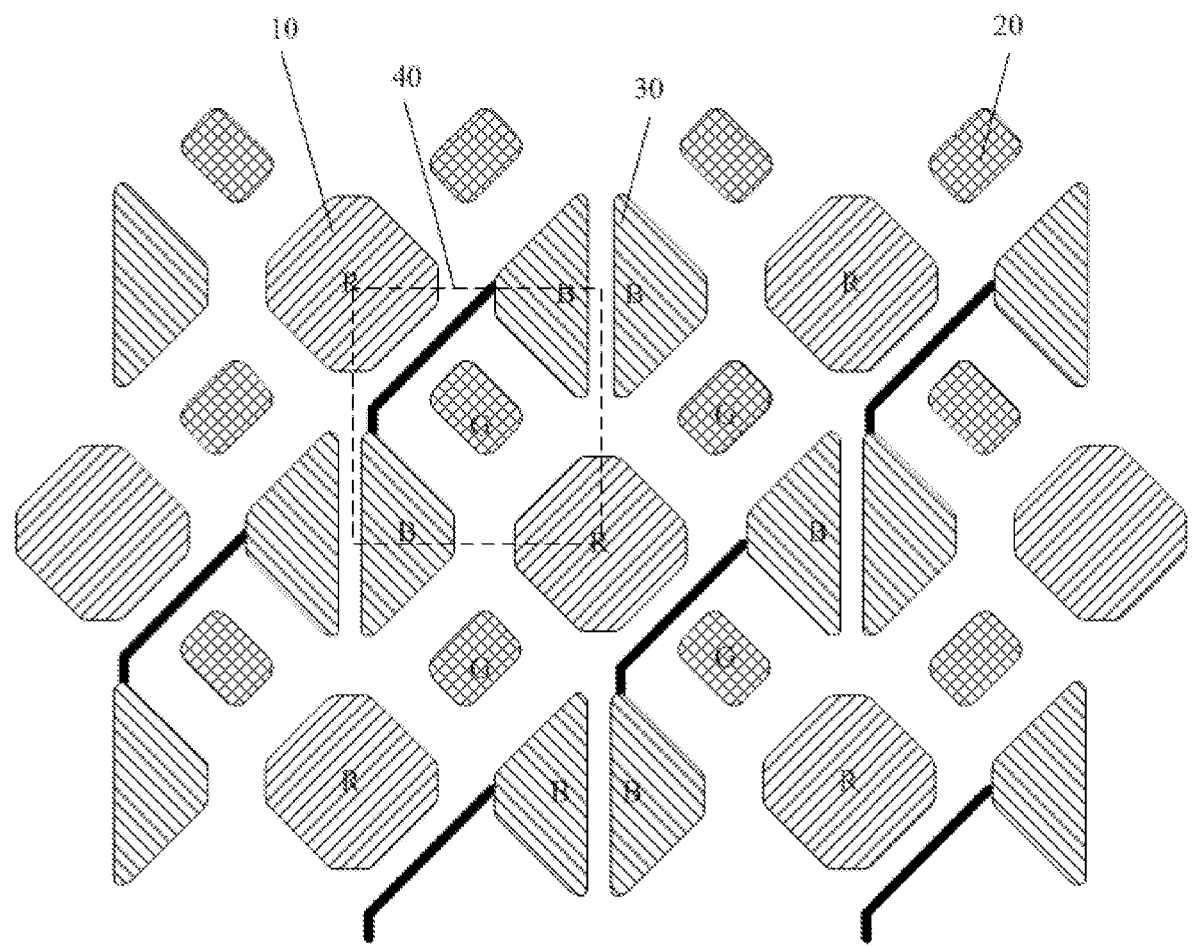
FIG. 9 illustrates schematics of an exemplary pixel arrangement according to some embodiments of the present disclosure.

As shown in FIG. 9, the pixel arrangement may include fourth light-emitting zones 10, fifth light-emitting zones 20, and sixth light-emitting zones 30. Meanwhile, referring to FIG. 10, two adjacent sixth light-emitting zones 30, facing each other, may form a group of sixth light-emitting zones 31. The fifth light-emitting zones 20 may be aligned to form row of fifth light-emitting zones in a direction of the row axis. The fourth light-emitting zones 10 and the groups of sixth light-emitting zones 31 may be arranged in an alternating configuration along the direction of the row axis. The fifth light-emitting zones 20 may be aligned to form column of fifth light-emitting zones along a direction of the column axis (vertically). The fourth light-emitting zones 10 and the groups of sixth light-emitting zones 31 may be arranged in an alternating configuration along the direction of the column axis.

It is understandable that, according to certain manufacturing or design requirements, the two sixth light-emitting zones 30 for forming a group of sixth light-emitting zones 31 may also have different shapes and/or different sizes. For example, one sixth light-emitting zone 30 may have a greater size than the other sixth light-emitting zone 30. Also, the two sixth light-emitting zones 30 may have similar overall shapes but may be different from each other in some areas. For example, certain areas of the two sixth light-emitting zones may have been removed or modified such that the two sixth light-emitting zones 30 may have similar overall shapes but different shapes in certain areas. Other reasons may also cause the two sixth light-emitting zones to have similar overall shapes but different shapes in certain areas. The two sixth light-emitting zones with the features described above are also suitable for the manufacturing/design requirements of the sixth light-emitting zones for forming the group of sixth light-emitting zones 31.

Figure 11:
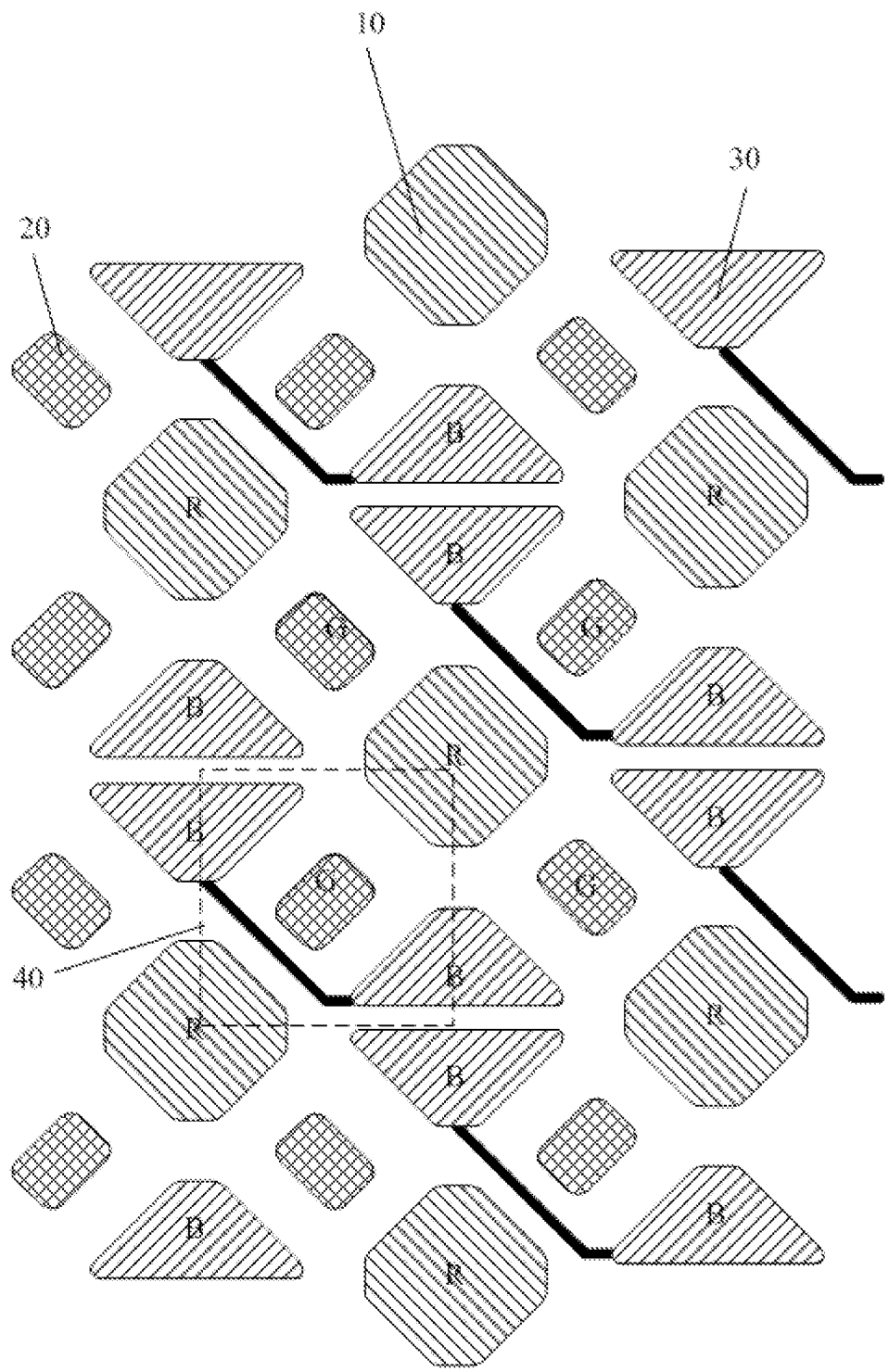
FIG. 11 illustrates schematics of the pixel arrangement of FIG. 9 with a rotation angle of 90 degrees according to some embodiments of the present disclosure.

According to various applications/embodiments, the pixel arrangement of FIG. 9 may be rotated for 90 degrees to form the pixel arrangement of FIG. 11.

For example, in FIG. 9 and FIG. 11, taking the geometric center of the fourth light-emitting zone 10 as the center of rotational symmetry, the four fifth light-emitting zones 20 closest to the fourth light-emitting zone 10 (that is, the nearest four fifth light-emitting zones 20 surrounding the fourth light-emitting zone 10) are rotationally symmetrical, and the rotation angle is 90 degrees.

It should be noted that, in the present disclosure, limitations such as the mirror symmetry, certain features being the same, being aligned in a diagonal direction, and specific limitations on angles, sizes, and shapes only need to be approximate or similar. That is, the geometric relationships in the present disclosure may not need to be precise. According to requirements on design/manufacturing process, any suitable approximate/similar geometric relationships capable of representing the embodiments of the present disclosure are within the scope of the present disclosure.

Figure 12:
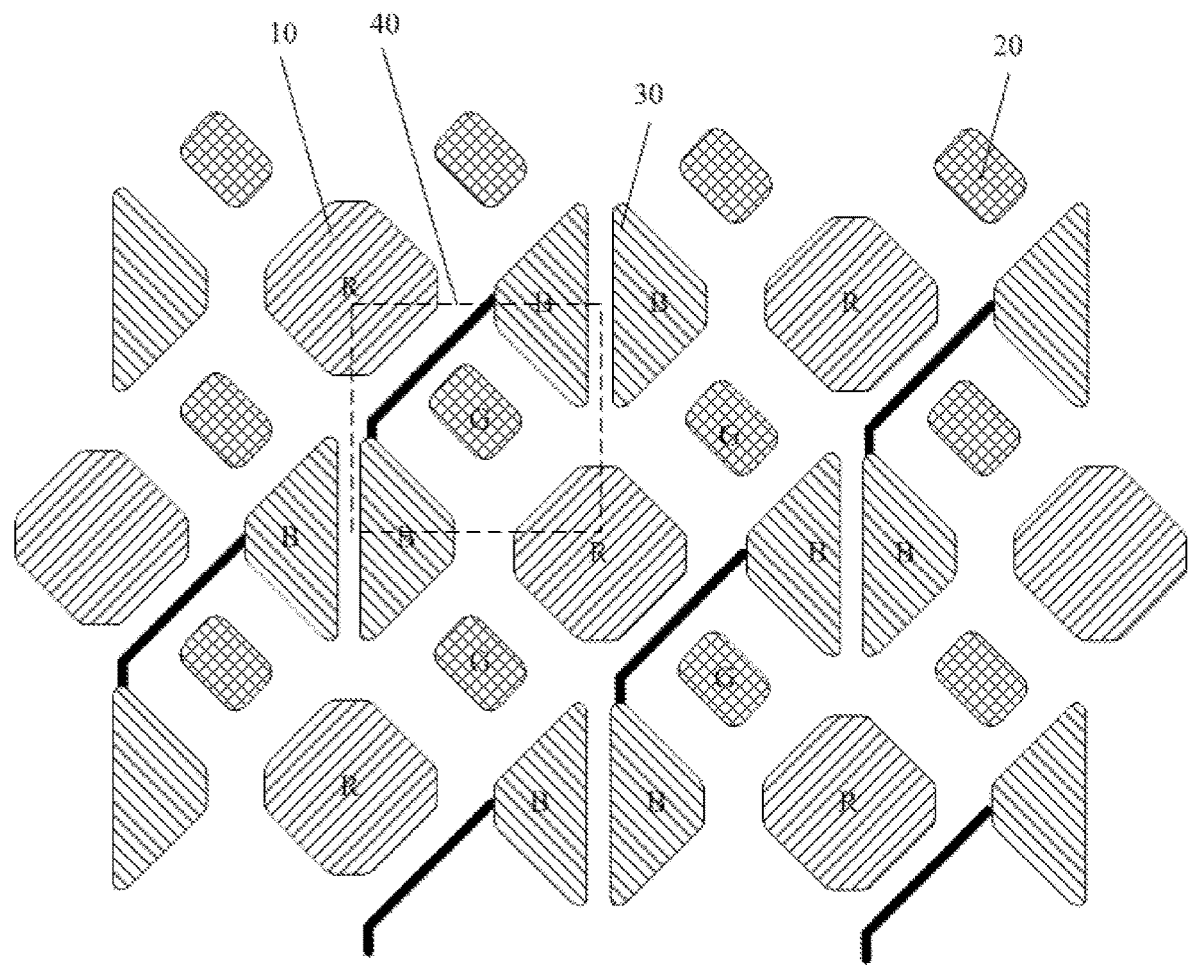
FIG. 12 illustrates schematics of another arrangement of the fifth light-emitting zone in the pixel arrangement of FIG. 9 according to some embodiments of the present disclosure.

In certain embodiments, the overall arrangement of the fifth light-emitting zones 20 in the pixel arrangement illustrated in FIG. 9 may be modified. As shown in FIG. 12, each fifth light-emitting zone 20 may have the same shape and arrangement direction. That is, the fifth light-emitting zone 20 may move to another fifth light-emitting zone 20 by translation in the first direction D1 or the second direction D2. In FIG. 12, taking the geometric center of the fourth light-emitting zone 10 as the center of rotational symmetry, the four fifth light-emitting zones 20 closest to the fourth light-emitting zone 10 (that is, the nearest four fifth light-emitting zones 20 surrounding the fourth light-emitting zone 10) are rotationally symmetric, and the rotation angle is 180 degrees.

It is understandable that, the pixel arrangement of FIG. 12 can also be rotated by 90 degrees to form a new pixel arrangement according to certain applications/embodiments and details are thus omitted herein.

Figure 13:
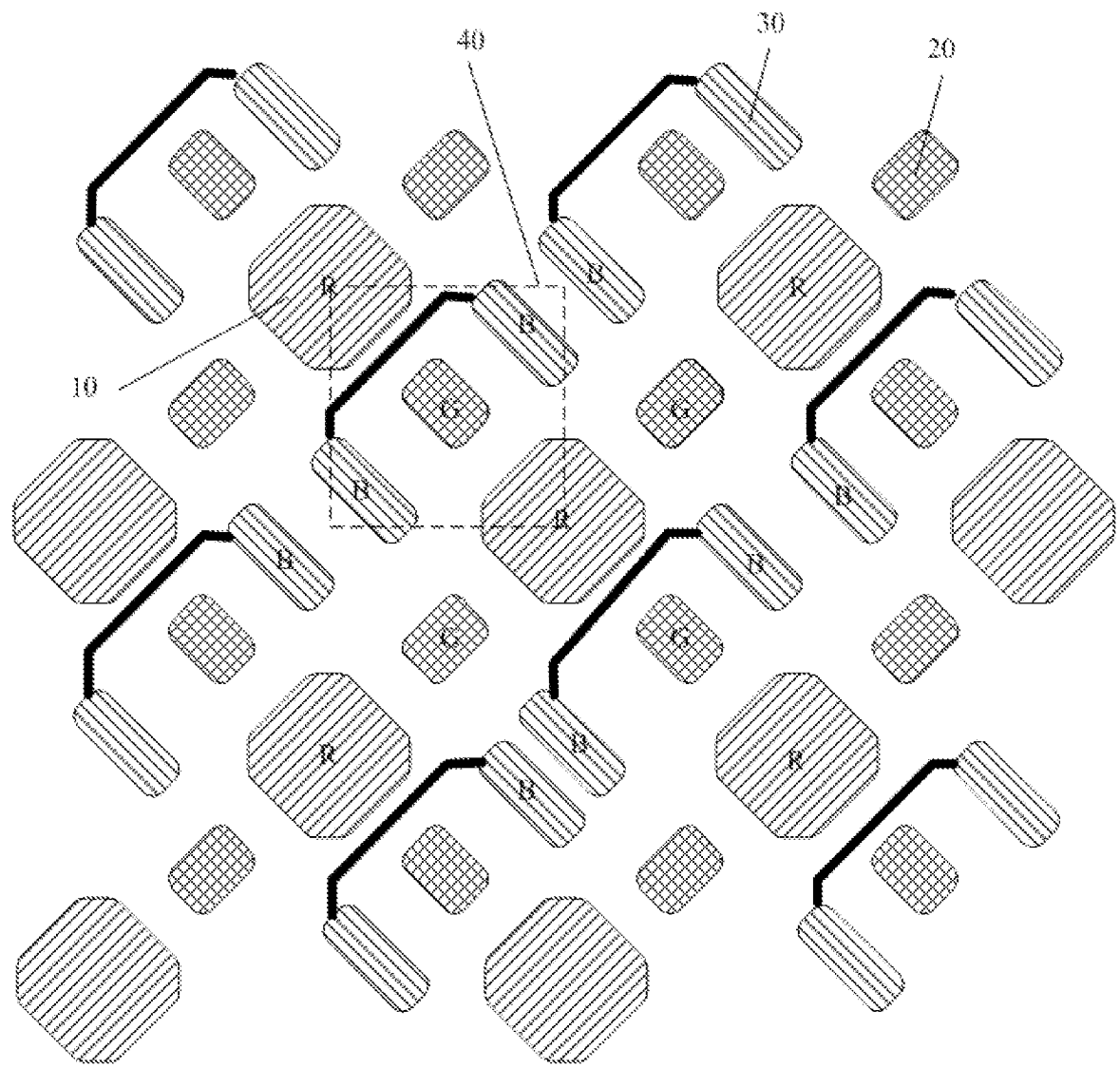
FIG. 13 illustrates schematics of another configuration of the pixel arrangement of FIG. 9 according to some embodiments of the present disclosure, where the shapes of the sixth light-emitting zones are changed.

In certain embodiments, the overall arrangement of the sixth light-emitting zones 30 in the pixel arrangement of FIG. 9 can be modified. FIG. 13 shows a similar structure as FIG. 8B.

Figure 14:
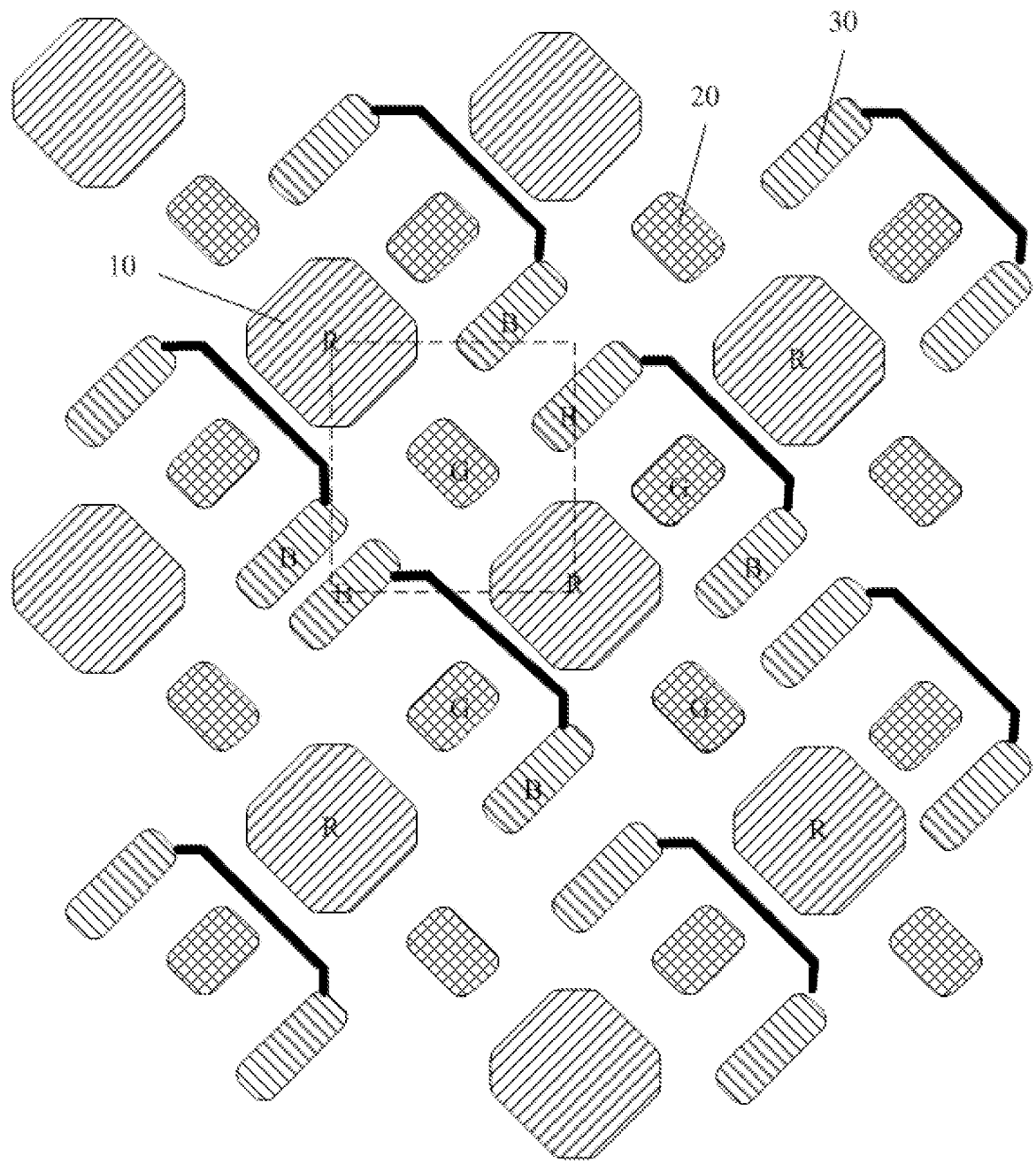
FIG. 14 illustrates schematics of the pixel arrangement of FIG. 13 with a rotation angle of 90 degrees according to some embodiments of the present disclosure.

In some embodiments, the arrangement of the fifth light-emitting zones 20 in FIG. 13 can be changed with reference to FIG. 12. In some embodiments, according to the application situation, FIG. 13 can also be rotated 90 degrees to form a new pixel structure as shown in FIG. 14, which will not be described in detail here.

In some embodiments, the geometric centers of the fourth light-emitting zones 10 in a same row or in a same column may be aligned along a straight line. The geometric centers of the groups of sixth light-emitting zones 31 in a same row or a same column may be aligned along a straight line. The geometric centers of the fifth light-emitting zones 20 in a same row or a same column may be aligned along a straight line. The arrangement described above may simplify the manufacturing process of the pixel arrangement.

In some embodiments, to ensure uniform display effect, the geometric centers of the fourth light-emitting zones 10, the geometric centers of the fifth light-emitting zones 20, and the geometric centers of the groups of sixth light-emitting zones 31 may be distributed uniformly in a pixel arrangement. That is, the fourth light-emitting zones 10, the fifth light-emitting zones 20, and the groups of sixth light-emitting zones 31 may be distributed uniformly in a pixel arrangement. The arrangement described above may enable the light-emitting zones for displaying different colors to be distributed uniformly on the pixel arrangement. The display quality can be improved.

Figure 10:
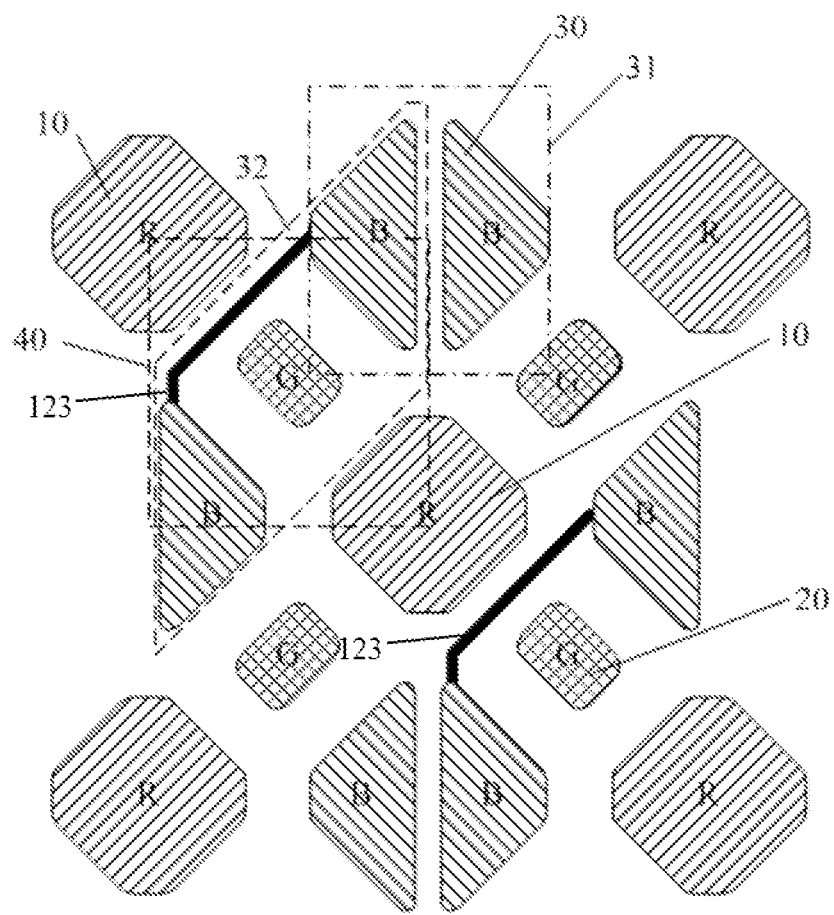
FIG. 10 illustrates enlarged schematics of the pixel arrangement of FIG. 9 according to some embodiments of the present disclosure.

Referring to FIG. 10, in an approximately rectangular area delineated with a single fifth light-emitting zone 20 as the center, at least two sixth light-emitting zones 30 located on opposite sides of the long side of the rectangle of the fifth light-emitting zone 20 and adjacent to the fifth light-emitting zone 20 constitute a string of sixth light-emitting zones 32. The sixth light-emitting zones 30 in the string of sixth light-emitting zones 32 may display the same color. A display unit (pixel) 40 may include two fourth light-emitting zones 10, a fifth light-emitting zone 20 adjacent to the fourth light-emitting zones 10, and a string of sixth light-emitting zones 32 neighboring the fourth light-emitting zones 10. The adjacent display units 40 may share the two fourth light-emitting zones 10 and the string of sixth light-emitting zones 32 (i.e., surrounding display units 40). Specifically, a string of sixth light-emitting zones 32 may include at least two sixth light-emitting zones 30. For illustration purposes, the string of sixth light-emitting zones 32 illustrated in the present disclosure may include two sixth light-emitting zones 30 or three sixth light-emitting zones 30. In practice, the number and positions of sixth light-emitting zones 30 in one string of sixth light-emitting zones 32 are not limited to the embodiments shown here and can be adjusted according to requirements in the design/manufacturing process, for example, to accommodate wiring requirements and algorithm.

Figure 15:
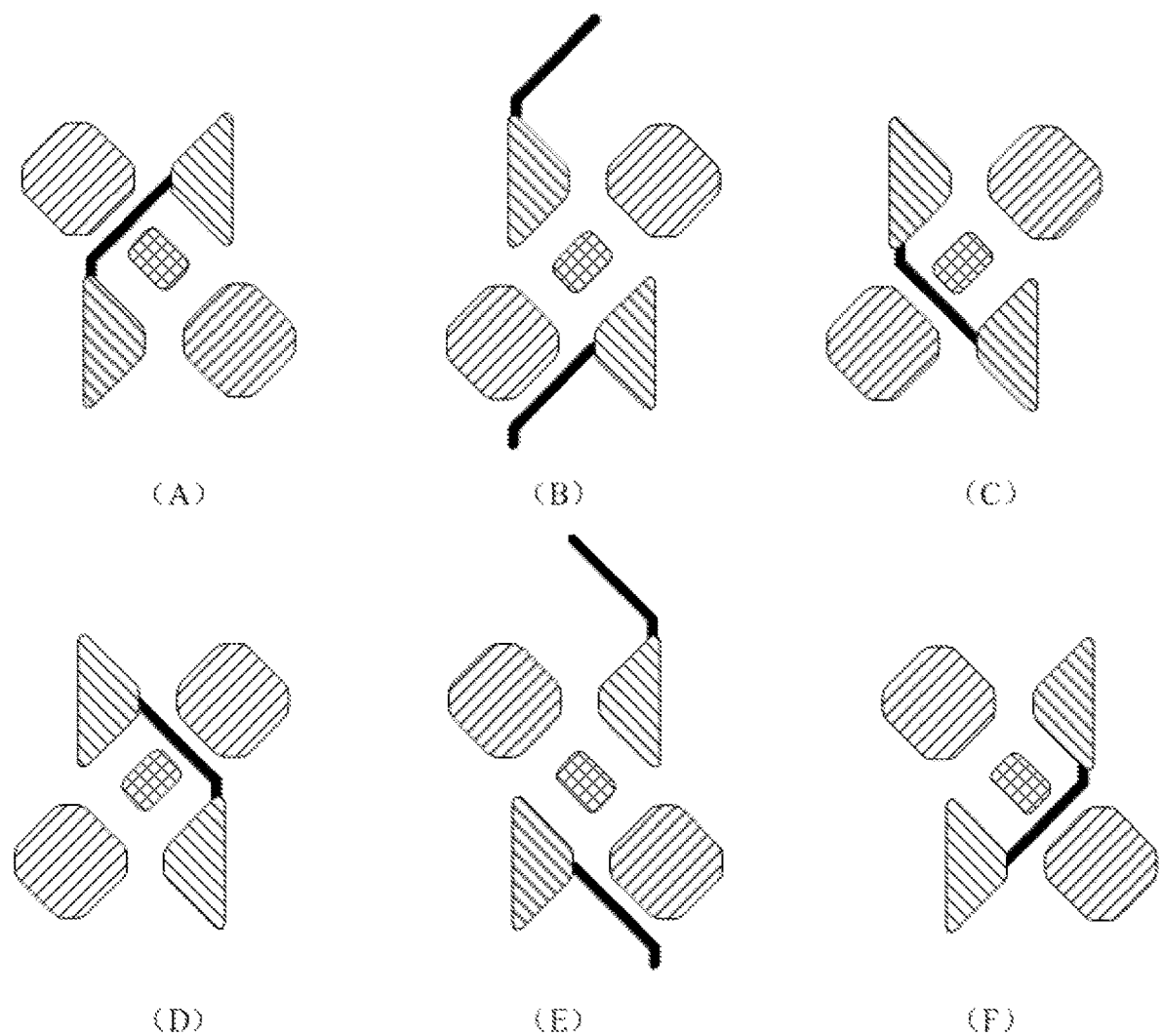
FIG. 15 illustrates schematics of different arrangements of display units of the pixel arrangement of FIG. 9 according to some embodiments of the present disclosure.

As shown in FIG. 9, and FIGS. 11 to 14, a display unit 40 is shown in a dashed box (no real boundaries in an actual pixel arrangement). FIG. 15 illustrates display units 40 with a plurality of different arrangements. Each of the display units 40 may represent a different configuration/arrangement of the light-emitting zones in the display unit 40 sharing light-emitting zones with adjacent display units 40. Each display unit 40 in FIG. 15 may share the fourth light-emitting zones 10 and the string of sixth light-emitting zones 32 with adjacent display units 40. The position of an adjacent display unit 40, sharing the fourth light-emitting zones 10 and/or the string of sixth light-emitting zones 32, may be dependent on the positions of the fourth light-emitting zones 10 and the sixth light-emitting zones 30 within the display unit 40.

In some embodiments, referring to FIG. 10, two sixth light-emitting zones 30 connected with a line 123 may form one string of sixth light-emitting zones 32. A fifth light-emitting zone 20, (at least a part of) a string of sixth light-emitting zones 32 having a shortest distance to the fifth light-emitting zone 20, and (at least a part of) the two fourth light-emitting zones 10 positioned on two opposite sides of the short side of the rectangle of the fifth light-emitting zone 20 may form a display unit (pixel) 40. The two fourth light-emitting zones 10 may each have a shortest distance to the fifth light-emitting zone 20 along a diagonal direction.

In FIGS. 15, (A), (C), (D), and (F) show different embodiments of (at least part of) at least two sixth light-emitting zones in a direct connection relationship included in the same display unit, where the at least two sixth light-emitting zones in a direct connection relationship form a string of sixth light-emitting zones.

In FIGS. 15, (B) and (E) show different embodiments of (at least part of) at least two sixth light-emitting zones that do not have a direct connection relationship and are included in the same display unit, where the at least two sixth light-emitting zones that do not have a direct connection relationship respectively form a string of sixth light-emitting zones with the sixth light-emitting zone in the adjacent row (the upper row of display unit rows or the lower row of display unit rows) of the display unit. As shown in (B) and (E), the display units 40 can display the color of the sixth light-emitting zone through the string of sixth light-emitting zones connecting the display unit 40 and the adjacent display unit 40 in the upper display unit row, or through the string of sixth light-emitting zones connecting the display unit 40 and the adjacent display unit 40 in the lower display unit row. The display unit 40 can also display the color of the sixth light-emitting zone through a string of sixth light-emitting zones connecting the display unit 40 and the adjacent display units 40 in the upper display unit row and a string of sixth light-emitting zones connecting the display unit 40 and the adjacent display units 40 in the lower display unit row simultaneously.

FIG. 11 illustrates a pixel arrangement modified from the pixel arrangement illustrated in FIG. 9. The display unit in FIG. 11 can also be arranged with reference to the dashed frame in FIG. 11 and FIG. 9.

In the pixel arrangements described above, by sharing light-emitting zones between adjacent display units, high display resolution can be realized. Meanwhile, the aperture ratio of the light-emitting zones can be improved and the manufacturing process for forming the pixel arrangements may be simplified. Display brightness and product lifespan may be improved.

In one embodiment, four fifth light-emitting zones 20 may each be adjacent to a same fourth light-emitting zone 10 along a diagonal direction. Among the four fifth light-emitting zones 20, two aligned along a diagonal direction may have centrosymmetry about the geometric center of the fourth light-emitting zone 10, the other two aligned along the other diagonal direction may also have centrosymmetry about the geometric center of the fourth light-emitting zone 10. The four display units 40, each including one of the fifth light-emitting zone 20, may share the fourth light-emitting zone 10. In one display unit 40, the group of sixth light-emitting zones 32 neighboring the fifth light-emitting zone 20 (connected with a line) may be shared by adjacent display units 40 in the upper adjacent display unit row and/or in the lower adjacent display unit row. Alternatively, in one display unit 40, the string of sixth light-emitting zones 32 neighboring the fifth light-emitting zone 20 (connected by a line) may be shared by adjacent display units 40 in the upper/right adjacent display unit column and/or in the lower/left adjacent display unit column. For example, four adjacent display units 40, positioned in two adjacent columns and two adjacent rows, may form a 2 by 2 block shape. The four adjacent display units may include five fourth light-emitting zones 10. The fourth light-emitting zone 10 positioned in the center may be adjacent to the fifth light-emitting zone 20 of the four display units 40 along a diagonal direction. Among the four fifth light-emitting zones 20, two aligned along a diagonal direction may have centrosymmetry about the geometric center of the fourth light-emitting zone 10 in the center, and the other two aligned along the other diagonal direction may also have centrosymmetry about the geometric center of the fourth light-emitting zone 10 in the center. The fourth light-emitting zone 10 may be shared by the four display units 40. Each of the four fourth light-emitting zones 10 positioned at the four corners of the color gamut area formed by the four display units 40 may be shared by adjacent display units 40 in the adjacent (upper and/or lower) display unit rows.

In one embodiment, the shape of the fourth light-emitting zone 10, the shape of the group of sixth light-emitting zones 31, and the shape of the fifth light-emitting zone 20 may each be a symmetrical shape, e.g., have at least an axis of symmetry. The axis of symmetry of the shape of a fourth light-emitting zone 10 may extend along a direction parallel to the direction of the row axis (the first direction D1, as shown in FIG. 9, and FIG. 11-14) or column axis (the second direction D2, as shown in FIG. 9, and FIGS. 11-14), or along a diagonal direction (such as the direction at an angle of about 45° with D1 or D2, as shown in FIG. 9, and FIGS. 11-14). The axis of symmetry of the shape of a group of sixth light-emitting zones 31 or a sixth light-emitting zone 30 may extend along a direction parallel to the direction of the row axis (as shown in FIG. 11) or column axis (as shown in FIG. 9 and FIG. 12), or along a diagonal direction (as shown in FIG. 13 and FIG. 14). The axis of symmetry of the shape of a fifth light-emitting zone 20 may extend along a direction parallel to the direction of the row axis (as shown in FIG. 9, and FIGS. 11-14, when the shape of the fifth light-emitting zone 20 is a square, a rhombus, a circle, and/or other suitable regular polygons) or column axis (as shown in FIG. 9, and FIGS. 11-14, when the shape of the fifth light-emitting zone 20 is a square, a rhombus, a circle, and/or other suitable polygons), or along a diagonal direction (as shown in FIG. 9, and FIGS. 11-14). Thus, the overall arrangement of the fourth light-emitting zones 10, the fifth light-emitting zones 20, and the groups of sixth light-emitting zones 31 may form a structure/pattern with axes of symmetries. In the manufacturing process, when applying the FMM to form the pixel arrangement, the FMM is often stretched along the direction of the row axis and/or column axis. Since the axes of symmetries of the pattern/structure may be parallel along the direction of row axis, column axis and/or diagonal direction, the FMM may not be deformed during the manufacturing process. The shapes of the light-emitting zones may not be distorted. Thus, the arrangement/designs described above may ensure the positions of the light-emitting zones in the pixel arrangement to remain accurate.

In some embodiments, in the pixel arrangements described above, to simplify the wiring of the display panel and manufacturing process of masks, the turning angles of certain shapes (e.g., quadrilaterals or octagonal) of the light-emitting zones (e.g., the fourth light-emitting zones 10, the fifth light-emitting zones 20, and/or the groups of sixth light-emitting zones 31) may be chamfered to improve independent color display between the light-emitting zones.

The pixel arrangements described above may include a row of single light-emitting zones (e.g., a row of only fifth light-emitting zones 20) or a column of single light-emitting zones on the edges of the pixel arrangements. A single light-emitting zone may form a display unit 40 with light-emitting zones in the adjacent rows or columns to display images. The display unit 40 may include three light-emitting zones. By applying appropriate edge detection algorithms, desirable display effect can be obtained. The processing of the light-emitting zones on the edges of the pixel arrangement is not limited to the embodiments disclosed here.

In some embodiments, the fourth light-emitting zone 10, the group of sixth light-emitting zones 31, the sixth light-emitting zone 30, and the fifth light-emitting zone 20 may each have a circular shape, a triangular shape, a quadrilateral shape, a pentagonal shape, a hexagonal shape, and/or octagonal shape. The shape of a light-emitting zone may be determined according to manufacturing/design requirements. In one embodiment, the fourth light-emitting zone 10 may have a quadrilateral shape and/or an octagonal shape, and the sixth light-emitting zone 30 may have a triangular shape and/or a quadrilateral shape. Two adjacent sixth light-emitting zones 30, facing each other, may form a group of sixth light-emitting zones 31, and the group of sixth light-emitting zones 31 may have an overall shape of a quadrilateral shape and/or an octagonal shape. The fifth light-emitting zone 20 may have a quadrilateral shape and/or an octagonal shape. By arranging the shapes of the light-emitting zones as described above, the formation of the display units 40 may be more flexible. In practice, the shapes of the light-emitting zones can be flexibly determined according to the applications and/or the display effect of the corresponding display panel.

In some embodiments, the pixel arrangements illustrated in FIG. 11 and FIG. 12 are modified from the pixel arrangement of FIG. 9. In the pixel arrangements of FIG. 9, FIG. 11 and FIG. 12, the fourth light-emitting zone 10 may have a rhombic shape, and the sixth light-emitting zone 30 may have an isosceles triangle shape. The group of sixth light-emitting zones 31, formed by the two adjacent sixth light-emitting zones 30 facing each other, may have an overall shape of a rhombic shape. The fifth light-emitting zone 20 may have a rectangular shape.

In some embodiments, the pixel arrangements of FIG. 13 and FIG. 14 are modified from the pixel arrangement illustrated in FIG. 9. In the pixel arrangements of FIG. 13 and FIG. 14, the fourth light-emitting zone 10 may have a rhombic shape, and the sixth light-emitting zone 30 may have a rectangular shape. The group of sixth light-emitting zones 31, formed by the two adjacent sixth light-emitting zones 30 facing each other, may have an overall shape of a quadrilateral shape. The fifth light-emitting zone 20 may have a rectangular shape.

In some embodiments, in the pixel arrangement described above, the area of the fourth light-emitting zone 10 may be equal to the area of the group of sixth light-emitting zones 31, and the area of the fifth light-emitting zone 20 may be less than the area of the fourth light-emitting zone 10. Alternatively, the area of the group of sixth light-emitting zones 31 may be greater than the area of the fourth light-emitting zone 10, and the area of the fourth light-emitting zone 10 may be greater than the area of the fifth light-emitting zone 20.

In some embodiments, the color displayed by the fourth light-emitting zones 10, the color displayed by the fifth light-emitting zones 20, and the color displayed by the group of sixth light-emitting zones 31 may be any one of red (R), blue (B), and green (G) colors such that desirable full-color images can be displayed by the pixel arrangement. In one embodiment, the fourth light-emitting zones 10 may display red or blue, the fifth light-emitting zones 20 may display green, and the groups of sixth light-emitting zones 31 may display blue or red. In some embodiments, in OLED display devices, since the materials for emitting blue light often have a lower emission efficiency and a shorter lifespan compared to the materials for emitting red light/green light, the area of a light-emitting zone for displaying blue may be larger than the area of a light-emitting zone for displaying red and the area of a light-emitting zone for displaying green. In some embodiments, since human eye is more sensitive to green color, and the material for emitting green light may have the highest emission efficiency, a light-emitting zone for displaying green may have the smallest area. That is, the area of a fifth light-emitting zone 20 may be smaller than the area of a fourth light-emitting zone 10 and the area of a group of sixth light-emitting zones 31. Meanwhile, the light-emitting zones for displaying green, easier to be identified by human eye, may be distributed uniformly in the directions of row axis and column axis to ensure desirable display quality along the directions of row axis and column axis.

Figure 16:
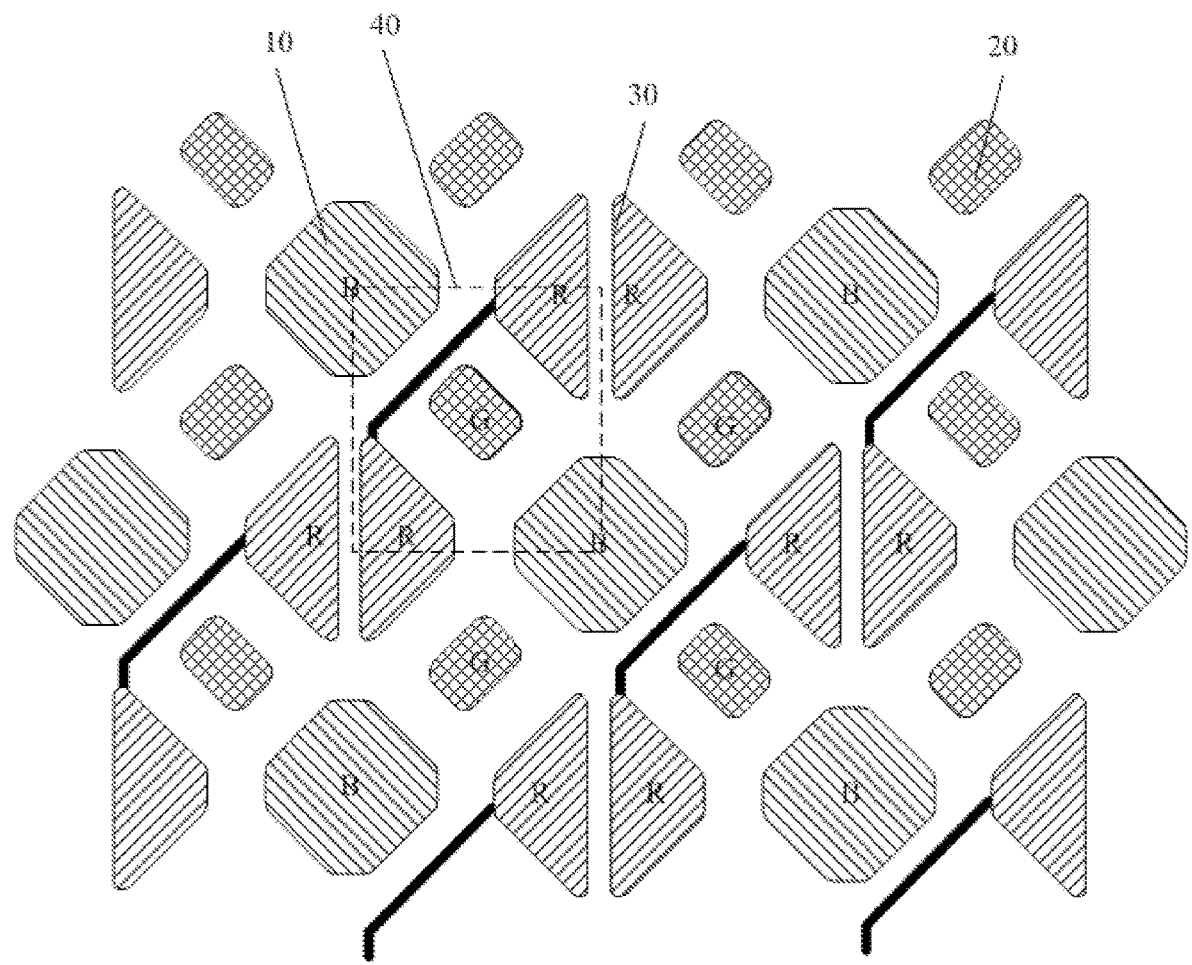
FIG. 16 illustrates schematics of another color configuration of the sub-pixels in the pixel arrangement in FIG. 9 according to some embodiments of the present disclosure.

For example, in FIG. 9 and FIGS. 11 to 14, the fourth light-emitting zones may display red (R), the fifth light-emitting zones 20 may display green (G), and the group of sixth light-emitting zones 31 may display blue (B). The light-emitting zones for displaying red each may be shared by adjacent display units. The light-emitting zones for displaying blue may be adjacent and facing each other. In FIG. 16, the fourth light-emitting zones 10 may display blue (B), the fifth light-emitting zones 20 may display green (G), and the groups of sixth light-emitting zones 31 may display red (R). The light-emitting zones for display red may be adjacent and facing each other. The light-emitting zones for displaying blue may be shared by adjacent display units 40. In the pixel arrangements described above, by arranging the light-emitting zones for displaying red or blue (i.e., being adjacent or shared), risks of color mixing by light-emitting zones can be reduced. Meanwhile, the arrangement described above may also reduce the areas between light-emitting zones, i.e., the areas with no light emission, such that the aperture ratio can be increased to about 42%. Using conventional pixel arrangement designs, the aperture ratios achieved would be lower.

The red (R), green (G), and blue (B) colors described above may each be the color displayed/emitted by one light-emitting zone. For example, in the pixel arrangement of an organic electroluminescent display device, the RGB colors described above may refer to the colors of the light-emitting layer of the organic electroluminescent diodes. When biased normally, the light-emitting layer may emit light with the corresponding color. In the pixel arrangement of an LCD device, the colors described above may refer to the colors of the CF (Color Filter) layer in the film substrate. When the backlight passes through the CF layer, the backlight is filtered by the CF and light with the corresponding color can be produced.

In some embodiments, the pixel arrangements described above receive pixel display information/data through data lines. In one embodiment, a fourth light-emitting zone 10, a string of sixth light-emitting zones 32, and a fifth light-emitting zone 20 each may be connected with a data line for receiving pixel display information/data. Also, the sixth light-emitting zones 30 in one string of sixth light-emitting zones 32 may receive the same display information/data. Alternatively, the addressable electrode of each light-emitting zone 30 in one string of sixth light-emitting zones 32 may be electrically connected.

In some embodiments, referring to FIG. 9, since a fourth light-emitting zone 10 may only be connected with one data line and may be shared by the four display units 40 and the string of sixth light-emitting zones 32 (the two sixth light-emitting zones 30 connected with a line) may only be connected with one data line and may be shared by three display units 40, the number of data lines used in the disclosed pixel arrangement can be reduced. The back panel wiring can be easier. Meanwhile, when the same number of display units 40 are used in the pixel arrangement, fewer data lines are used in the disclosed pixel arrangement. Thus, the power consumption of the display apparatus containing the pixel arrangement can be reduced.

The light-emitting zones in the pixel arrangements presented above may be OLED display devices or LCD display devices. That is, the pixel arrangement provided by the present disclosure may be suitable for OLED display devices and LCD display devices. It is noted that, the pixel arrangement disclosed may also be suitable for other devices containing the pixel arrangements such as digital cameras, plasma display devices, and so on.

In some embodiments, when the pixel arrangement is used in an OLED display device, the metal electrodes (i.e., anode or cathode) corresponding to the sixth light-emitting zones 30 in a string of sixth light-emitting zones 32 may be electrically connected together. The metal electrodes (i.e., anode or cathode) may also not be connected and the same display information can be loaded on each OLED.

For example, anodes of the plurality of sixth light-emitting zones 30 in the same sixth light-emitting zone string 32 may be connected. In some embodiments, the connection may be realized through connecting lines 123 in the same layer as the anodes, and the connecting lines 123 may further be integrated with the anodes. In some embodiments, the connection lines 123 may also be located in another metal layer and be configured to connect different anodes through via holes. The another metal layer is, for example, the source-drain metal layer (for simplicity of illustration, the via holes connecting the anodes and the underlying pixel circuits are not shown in the figures). In some embodiments, in the same display unit (pixel), the via holes connecting the anodes of the RGB light-emitting zones and the pixel circuits may be substantially in the same straight line. The straight line is, for example, between the row of the G light-emitting zones and the row of the R and B light-emitting zones.

When the pixel arrangement is used in an LCD display device, the pixel electrodes corresponding to the sixth light-emitting zones 30 in a string of sixth light-emitting zones 32, may be electrically connected together. The pixel electrodes may also not be connected and the same display information can be loaded on each LCD device.

Multiple light-emitting zones connected in a string can not only simplify driving and reduce signal lines, but also ensure normal display when defects occur in some light-emitting zones. For example, for two light-emitting zones of the same color connected in a string, when a dark spot or other defect occurs in one of the two light-emitting zones, the defective light-emitting zone can be turned off, and the other normal light-emitting zone can be used for display.

For manufacturing LCD display devices, the fourth light-emitting zones 10, the fifth light-emitting zones 20, and the sixth light-emitting zones 30 may be formed through a patterning process. For manufacturing OLED display devices, the fourth light-emitting zones 10, the fifth light-emitting zones 20, and the sixth light-emitting zones 30 may be formed through a deposition process. The patterning process may include a photolithography process, or include a photolithography process and corresponding etching steps.

The patterning process may also include printing, inkjet printing, and/or other process for forming predetermined patterns. The photolithography process may refer to the steps including film formation, exposure, and/or development. By applying appropriate photoresist films, masks, and/or exposure apparatus, patterns can be formed through the photolithography process. The deposition process, i.e., the vacuum coating process, may be referred to as the process of evaporating/subliming the material/substance for forming the film and depositing the evaporated/sublimed material/substance on the surface of the substrate/device. To form a certain pattern, the FMM can be applied on the surface of the substrate/device such that the evaporated/sublimed material/substance may not be formed in the areas covered by the FMM. Based on the pixel arrangement to be formed, appropriate processes can be selected to form the pattern of the pixel arrangement.

In some embodiments, for OLED display devices, the fourth light-emitting zones 10, the fifth light-emitting zones 20, and the groups of sixth light-emitting zones 31 may correspond to the openings in the FMM. When forming the pixel arrangements in FIG. 9 and FIGS. 11 to 14, the limit on the distance/spacing between two openings in the FMM may be applied on a diagonal direction (e.g., 45 degrees) to increase the density of the light-emitting zones and improve the display resolution. For example, the resolution of greater than 300 ppi (pixels per inch) can be obtained. In comparison, using the conventional pixel arrangement designs shown in FIGS. 16-18, the resolutions realized are all below 300 ppi.

In some embodiments, in the manufacturing process of OLED display devices, since the distance between two light-emitting zones may represent the distance in a diagonal direction, the distance/spacing between two light-emitting zones may be increased such that it is easier to apply the FMM to form the pattern of light-emitting zones. The pattern may correspond to the areas on the FMM with openings to form the light-emitting zones. The distance/spacing between the openings (i.e., along a diagonal direction) in the FMM as described above may be much greater than the distance/spacing between the openings (i.e., along the row axis or column axis) in a conventional FMM. By using the FMM as described above, a pixel arrangement with higher resolution may be obtained.

In some embodiments, considering the arrangement of the fourth light-emitting zones 10, one fourth light-emitting zone 10 can be shared by four adjacent display units 40. Considering the arrangement of the sixth light-emitting zones 30, when electrically connected, one sixth light-emitting zone 30 can be shared by three display units 40 in one row or in one column. In the pixel arrangements disclosed above, the distance/spacing between the openings corresponding to adjacent light-emitting zones for displaying the same color (i.e., the adjacent light-emitting zones for display red, blue, or green) in the FMM may be increased such that the design of the FMM and the deposition process for forming the organic layer can be easier. Higher display resolution may be easier to obtain in the pixel arrangements provided in the disclosure. Compared to conventional pixel arrangements (i.e., three light-emitting zones forming one display unit 40), the display units 40 of the pixels structures provided in the present disclosure share light-emitting zones to display images. The manufacturing process for forming the pixel arrangements disclosed is greatly simplified, and the design and manufacturing of the FMM is easier.

The present disclosure provides a new pixel arrangement. By optimizing/improving the arrangement of the light-emitting zones for displaying RGB colors, the line representing the shortest distance between the boundaries of two adjacent light-emitting zones for displaying different colors may have an angle of 45 degrees with the horizontal direction (the first direction D1). Thus, when the manufacturing of the FMM has a certain precision, the arrangement of the light-emitting zones described above can obtain higher display resolutions. Meanwhile, the aperture ratio of the light-emitting zones can be improved, and the aperture ratio of the display apparatus containing the pixel arrangement can be improved. Correspondingly, the display brightness of the display apparatus containing the pixel arrangement can be improved. The lifespan of the OLED display device containing the pixel arrangement can be improved.

In some embodiments, the pixel arrangement provided in the present disclosure is suitable for forming side-by-side top-emitting AMOLED display panels through a deposition process using the FMM.

Another aspect of the present disclosure provides a method for displaying the pixel arrangement. Some embodiments provide the method for displaying the pixel arrangement. As described above, in the pixel arrangement, adjacent display units 40 share one fourth light-emitting zone 10 and one string of sixth light-emitting zones 32 for displaying images so that each display unit 40 is able to display pixel display information of three colors (i.e., the RGB colors).

In some embodiments, referring to FIG. 10, in an approximately rectangular area delineated with a single fifth light-emitting zone 20 as the center, at least two sixth light-emitting zones 30 located on opposite sides of the long side of the rectangle of the fifth light-emitting zone 20 and adjacent to the fifth light-emitting zone 20 constitute a string of sixth light-emitting zones 32. The sixth light-emitting zones 30 in the string of sixth light-emitting zones 32 may display the same color, so that each display unit 40 is able to display the pixel display information of three colors (i.e., the RGB colors).

Figure 17:
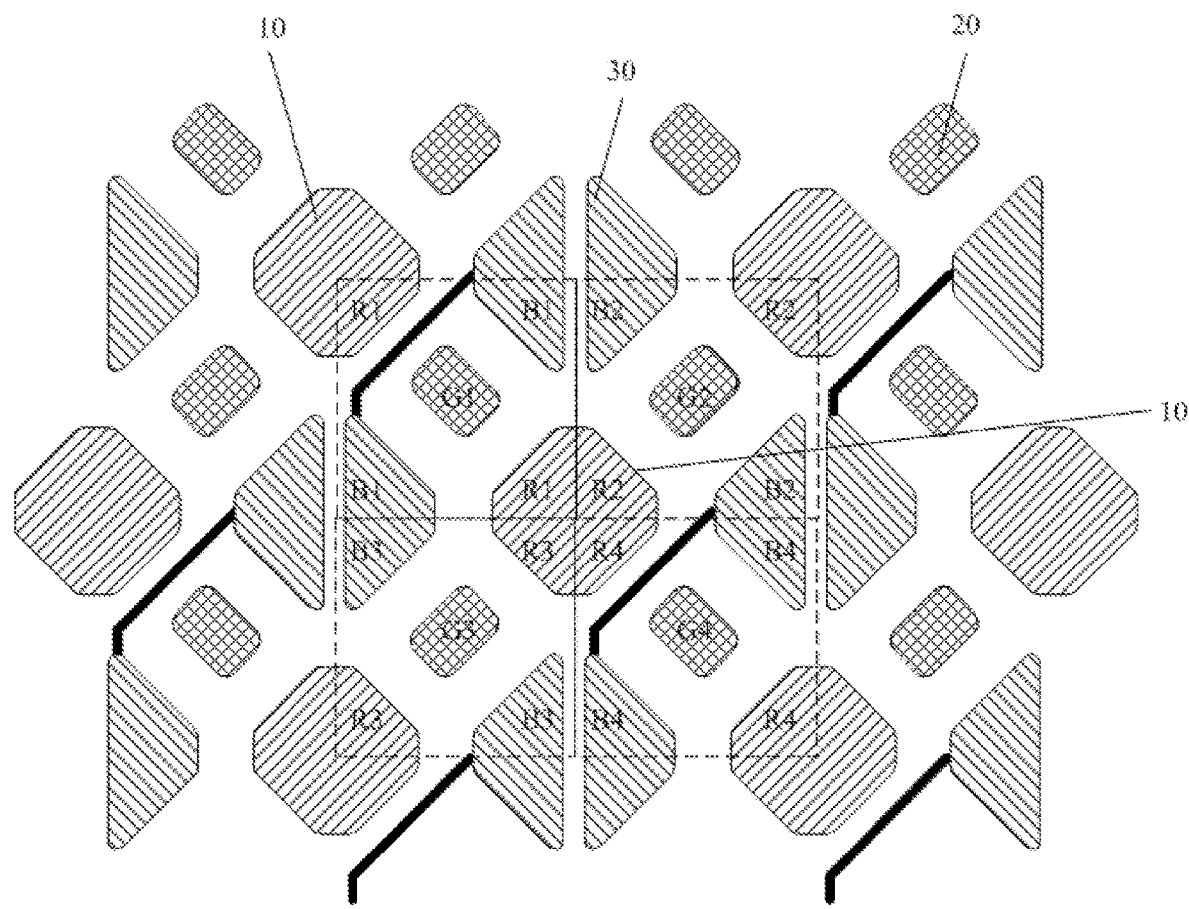
FIG. 17 illustrates an exemplary configuration of display units of the pixel arrangement according to some embodiments of the present disclosure.

In some embodiments, in the pixel arrangement provided by the present disclosure, as shown in FIG. 17, four adjacent display units 40, positioned in two adjacent columns and two adjacent rows, may form a 2 by 2 block shape. The 2 by 2 block shape may include five fourth light-emitting zones 10. The fourth light-emitting zone 10 positioned at the center of the 2 by 2 block (i.e., four adjacent display units 40) may be adjacent to each of the four fifth light-emitting zones 20 along a diagonal direction. The fourth light-emitting zone 10 positioned at the center may have two perpendicular central axes and the direction of each central axis may extend between two of the four fifth light-emitting zones 20. Among the four fifth light-emitting zones 20, two along one diagonal direction may have mirror symmetry about a central axis of the fourth light-emitting zone 10, and the other two along the other diagonal direction may also have mirror symmetry about a central axis of the fourth light-emitting zone 10. The fourth light-emitting zone 10 positioned at the center may be shared by the four adjacent display units 40. The four adjacent display units 40 may form a large color gamut area. The four fourth light-emitting zones 10 positioned at the four corners of the large color gamut area (i.e., each positioned at one corner) may each be shared by adjacent display units 40 in the adjacent display unit rows. In the pixel arrangement illustrated in FIG. 17, the fourth light-emitting zones 10 may display red (R), the fifth light-emitting zones 20 may display green (G), and the sixth light-emitting zones 30 may display blue (B). Based on the configuration of the fifth light-emitting zone 20 contained in a display unit 40, display units 40 with different configurations may be defined. The fourth light-emitting zones 10 shared by a plurality of (e.g., four) display units 40 may be labeled as R1, R2, R3, and R4. The strings of sixth light-emitting zones 32 shared by a plurality of display units 40 may be labeled as B1, B2, B3, and B4. The light-emitting zones with the same labeling number may form a color gamut (e.g., light-emitting zones with labels of R1, G1, and B1 may form a gamut, and light-emitting zones with labels of R2, G2, and B2 may form another color gamut). In one color gamut, the colors formed by mixing the colors displayed by the light-emitting zones may represent the pixel display information of the color gamut.

When display images, first, a data source for providing the pixel display information may be used to input/send corresponding pixel display information (i.e., containing the RGB color information for the fourth light-emitting zone 10, the fifth light-emitting zone 20, and the string of sixth light-emitting zones 32), to each pixel unit 40. The method for displaying the pixel arrangement may include the following steps.

In step S1, the theoretical brightness values for each pixel unit may be obtained based on the pixel display information. The theoretical brightness values may correspond to the colors displayed by the fourth light-emitting zone 10, the fifth light-emitting zone 20, and the string of sixth light-emitting zones 32.

In step S1, the driving circuit/chip of the display panel may determine, receive, and store the pixel display information, and amplify the pixel display information for each color to obtain display information for the three primary colors (i.e., RGB colors). The driving circuit may further obtain brightness signals through suitable matrix transformation processes. The brightness signals may correspond to the theoretical brightness values of the three primary colors. The process described above can be obtained by using any suitable brightness/color separation means used in conventional manufacturing processes and is omitted herein.

In step S2, the actual brightness values of the fourth light-emitting zone 10, the fifth light-emitting zone 20, and the string of sixth light-emitting zones 32 of each pixel unit may be calculated.

In step S2, the actual brightness value of a fourth light-emitting zone 10 may be calculated as a sum, i.e., a weighted sum, of the weighted theoretical brightness value of each shared portion of the fourth light-emitting zone 10. The actual brightness value of a fifth light-emitting zone 20 may be the theoretical brightness value corresponding to the color displayed by the fifth light-emitting zone 20. The actual brightness value of the string of sixth light-emitting zones 32 may be calculated as a sum of the weighted theoretical brightness values of each shared portion of the string of sixth light-emitting zones 32. A shared portion of a fourth light-emitting zone 10 or a string of sixth light-emitting zones 32 may refer to a portion shared by an adjacent display unit 40.

In the pixel arrangement illustrated in FIG. 17, since four adjacent display units 40 (i.e., depicted as the 2 by 2 block) may share one fourth light-emitting zone 10 (e.g., the fourth light-emitting zone 10 positioned at the center of the 2 by 2 block), the weight (or relative weight) for the theoretical brightness value of each shared portion of the fourth light-emitting zone 10 may be ¼. For example, the fourth light-emitting zones 10 may display red, the input signal sent to a fourth light-emitting zone 10 may be a sum of the weighted pixel display information for the red color displayed by each shared portion of the fourth light-emitting zone 10. Each shared portion is shared by one of the four adjacent display units 40. The weight may each be ¼.

A string of sixth light-emitting zones 32 may include two adjacent sixth light-emitting zones 30 along a diagonal direction. Each sixth light-emitting zone 30 is contained in a different group of sixth light-emitting zones 31. A fifth light-emitting zone 20, a string of sixth light-emitting zones 32 with the shortest distance to the fifth light-emitting zone 20, and two fourth light-emitting zones 10 positioned on two sides of the fifth light-emitting zone 20 in two adjacent rows and each having the shortest distance to the fifth light-emitting zone 20 along a diagonal direction, may form a display unit 40. In one display unit 40, the string of sixth light-emitting zones 32, positioned next to the fifth light-emitting zone 20, may be shared by an adjacent display unit 40 in an upper and/or a lower adjacent display unit row. Alternatively, the string of sixth light-emitting zones 32 of one display unit 40, positioned next to the fifth light-emitting zone 20, may be shared by an adjacent display unit 40 in an upper/right and/or a lower/left adjacent display unit column. The weight for the theoretical brightness value of each shared portion of a sixth light-emitting zone 30 in the string of sixth light-emitting zones 32, shared by adjacent display units 40, may each be ½. For example, the strings of sixth light-emitting zones 32 may display blue, and the input signal sent to the string of sixth light-emitting zones 32 may be a sum of the weighted pixel display information for the blue color of each shared portion of the string of sixth light-emitting zones 32, and the weight may each be ½.

In one embodiment, the final brightness value of a fourth light-emitting zone 10 (or a string of sixth light-emitting zones 32) may be calculated as a sum of weighted theoretical brightness values for the color displayed by each shared portion of the fourth light-emitting zones 10 (or the string of sixth light-emitting zones 32). The weighted theoretical brightness value is a product of the theoretical brightness value of the color displayed by a shared portion and the corresponding weight. For example, when a fourth light-emitting zone 10 is shared by four display units 40, the relationship between the sum and weighted theoretical brightness values described above can be, H=Ax+By+Cz+Dδ, where A, B, C, and D may each represent a weight for the display information of the color displayed by a shared portion of the light-emitting zone and H may represent the actual brightness value of the color displayed by the light-emitting zone (i.e., the weighted sum). The values of the weights may satisfy A+B+C+D=1.

It should be understood that, since the overall display effect (e.g., bright or dark) of the image displayed may be dependent on the pixel display information, the weights for theoretical brightness values of the color displayed by the fourth light-emitting zone 10 (or the string of sixth light-emitting zones 32) can be adjusted to obtain a more appropriate weighted sum and improved display brightness.

In step S3, the actual brightness value may be sent/inputted to the fourth light-emitting zone 10, the fifth light-emitting zone 20, and the string of sixth light-emitting zones 32 of each pixel unit to display images.

In step S3, the actual brightness values of the fourth light-emitting zone 10, the fifth light-emitting zone 20, and the string of sixth light-emitting zones 32 of each display unit may be obtained through step S2. The actual brightness values may be sent to the corresponding light-emitting zones to display images.

As shown in the pixel arrangements described above, a fourth light-emitting zone 10, a fifth light-emitting zone 20, and a string of sixth light-emitting zones 32 may each be connected with a data line. In step 3, the fourth light-emitting zone 10, the fifth light-emitting zone 20, and the string of sixth light-emitting zones 32 may receive the corresponding actual brightness value (i.e., obtained from step S2) through the data line.

For illustration purposes, in some embodiments the method for displaying the pixel arrangement is applied on the pixel arrangement illustrated in FIG. 9. The color mixing of a display unit, the formation of a color gamut, and the calculation of actual brightness values are illustrated for the pixel arrangement of FIG. 17. As shown in FIG. 17, the light-emitting zones for displaying red may be the fourth light-emitting zones 10, the light-emitting zones for displaying blue may be the sixth light-emitting zones 30, and two sixth light-emitting zones 30 may form a strings of sixth light-emitting zones 32. Similarly, the actual brightness values of the light-emitting zones in the pixel arrangements of FIGS. 11 to 14 (modified from the pixel arrangement of FIG. 9) may be calculated in the same manner. Meanwhile, in some embodiments in the pixel arrangement of FIG. 16, the light-emitting zones for displaying blue may be the fourth light-emitting zones 10, the light-emitting zones for displaying red may be the sixth light-emitting zones 30, and two adjacent sixth light-emitting zones 30 may form a strings of sixth light-emitting zones 32. The actual brightness values of the light-emitting zones in the pixel arrangement of FIG. 16 may be calculated in the same manner and the details are omitted herein.

By applying the method provided in the present disclosure, brightness information of the light-emitting zones can be calculated through suitable pixel sharing algorithms and desirable display effect can obtained for the pixel arrangement. The number of data lines used in the pixel arrangement can be reduced, and back panel wiring can be made easier. The power consumption of the display apparatus containing the pixel arrangement can be further reduced.

The present disclosure further provides another pixel arrangement. Compared to the pixel arrangements disclosed in previous embodiments of the present disclosure, the pixel arrangement may include a greater number of sixth light-emitting zones 30 in one string of sixth light-emitting zones 32 for displaying the same color.

Similar to the pixel arrangement provided in some embodiments, the pixel arrangement provided in some embodiments may also be used in OLED display devices and/or LCD devices. The pixel arrangement may also be used in other suitable device with display functions such as digital cameras, and plasma display devices.

Figure 18:
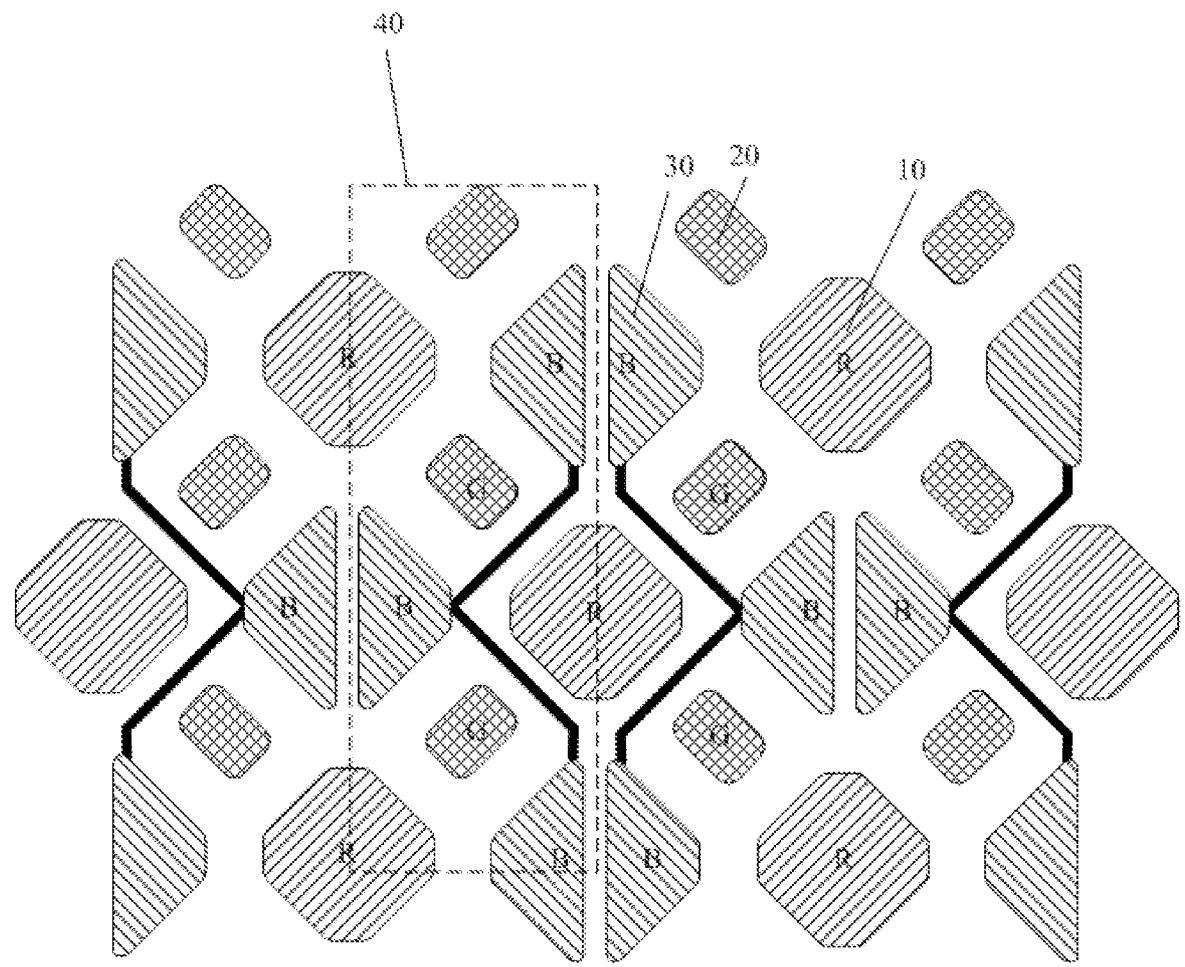
FIG. 18 illustrates schematics of an arrangement of the pixel arrangement according to some embodiments of the present disclosure.

In some embodiments, as shown in FIG. 18, the string of sixth light-emitting zones 32 includes (at least part of) three sixth light-emitting zones 30. The three sixth light-emitting zones 30 are located between the central axis of the single fourth light-emitting zone 10 in the second direction D2 and the central axis of the another single fourth light-emitting zone 10 closest to the single fourth light-emitting zone 10 in the diagonal direction (the direction at an angle of about 45° to D1 or D2) in the direction D2. The three sixth light-emitting zones 30 belong to three groups of sixth light-emitting zones 31. The fifth light-emitting zone 20, the fourth light-emitting zone 10, and the string of sixth light-emitting zones 32 constitute a display unit 40.

Figure 22:
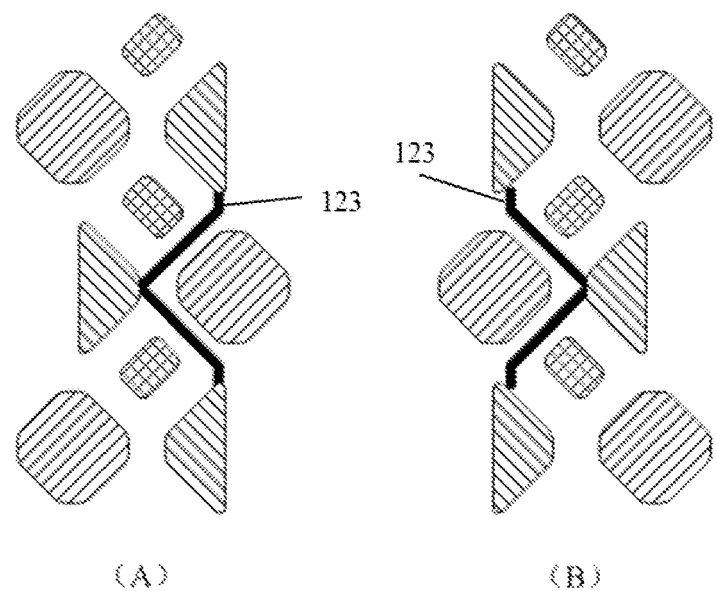
FIG. 22 illustrates schematics of different configurations of display units in the pixel arrangement of FIG. 18 according to some embodiments of the present disclosure.

In some embodiments, the three sixth light-emitting zones 30 may include a sixth light-emitting zone 30 adjacent to and in the same row as the fourth light-emitting zone 10 (such as the fourth light-emitting zones 10 in the middle row as shown in (A) and (B) of FIG. 22), and two sixth light-emitting zones 30 located on the upper and lower sides of the fourth light-emitting zone 10, adjacent to and in the same column as the fourth light-emitting zone 10, and belonging to different groups of sixth light-emitting zones 31. In some embodiments, the three groups of sixth light-emitting zones 31 include a first group, a second group, and a third group that are sequentially connected. The second group is the group of sixth light-emitting zones closest to the first group in the diagonal direction (the direction at an angle of about 45° with D1 or D2) and the third group is the group of sixth light-emitting zones closest to the second group in the diagonal direction (the direction at an angle of about 45° with D1 or D2). The line between the first group and the second group is perpendicular to the line between the second group and the third group. For example, the pixel arrangement of FIG. 19 can be obtained by rotating the pixel arrangement of FIG. 18 for 90 degrees.

Figure 19:
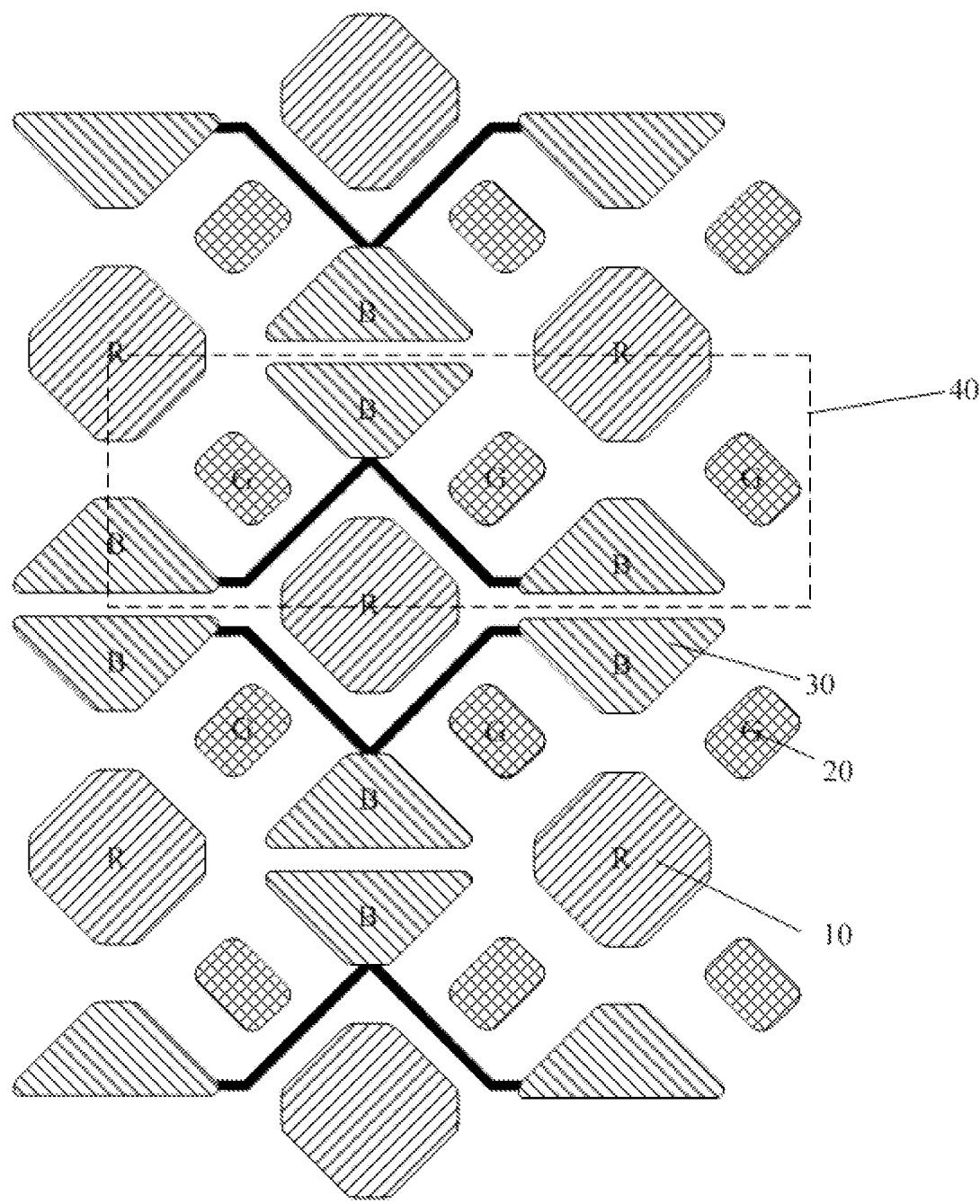
FIG. 19 illustrates schematics of the pixel arrangement of FIG. 18 with a rotation angle of 90 degrees according to some embodiments of the present disclosure.
Figure 20:
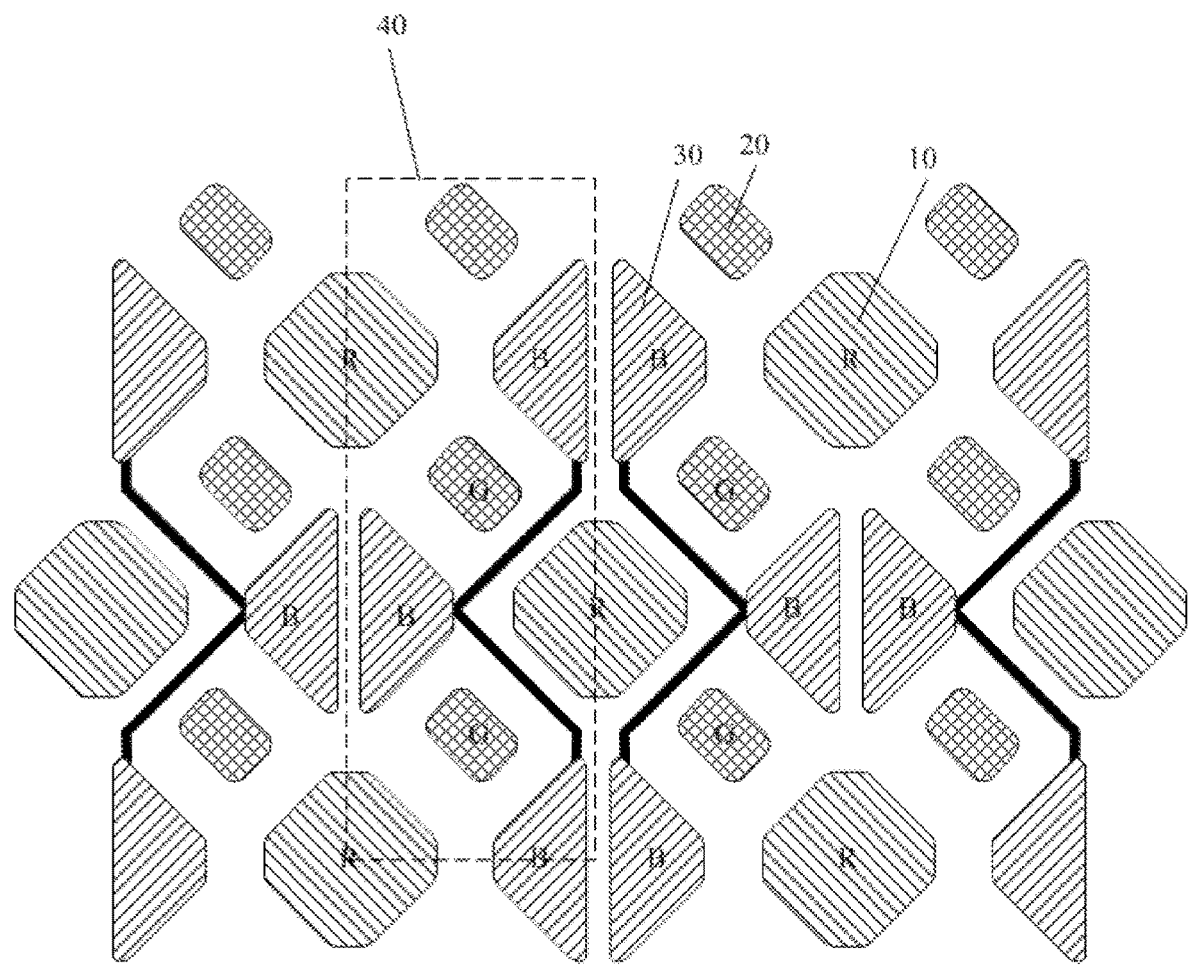
FIG. 20 illustrates schematics of another arrangement of the fifth light-emitting zone in the pixel arrangement of FIG. 18 according to some embodiments of the present disclosure.
Figure 21:
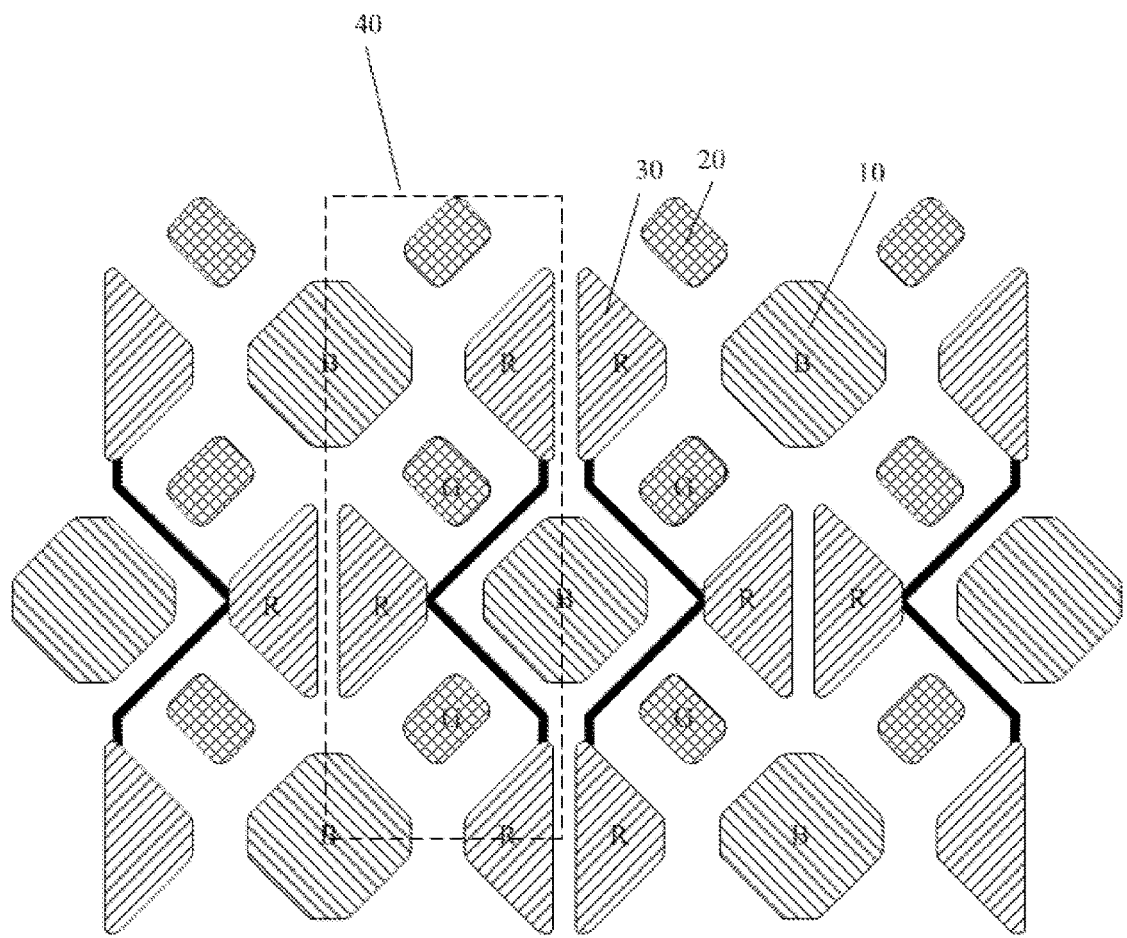
FIG. 21 illustrates schematics of another arrangement of the light-emitting zones in the pixel arrangement of FIG. 18.

Similar to some embodiments, the configuration/arrangement of the fifth light-emitting zones 20 in the pixel arrangement of FIG. 19 can also be modified to form the pixel arrangement shown in FIG. 20. Alternatively, the arrangement of colors displayed by the fourth light-emitting zones 10 and the sixth light-emitting zones 30 in the pixel arrangement of FIG. 19 can be modified to form the pixel arrangement shown in FIG. 21.

The pixel arrangements of FIGS. 18 to 21 can be divided into different display units 40 with different configurations. Each display unit 40 may share light-emitting zones with adjacent display units 40. FIG. 22 illustrates two display units 40 (separated by the dashed line in between) with different configurations. In (A) and (B) of FIG. 22, three sixth light-emitting zones 30 connected by lines 123 may form a string of sixth light-emitting zones 32. Each string of sixth light-emitting zones 32 may be formed by sixth light-emitting zones 30 with direct connection. The string of sixth light-emitting zones 32 may be shared by two other display units 40, and each of the two other display units 40 may include one of the two fifth light-emitting zones 20, adjacent to the lines of direct connection, in the display unit 40. The two fifth light-emitting zone 20, each adjacent to the fourth light-emitting zone 10 in the middle (labeled with M) along a diagonal direction, may each have centrosymmetry about the geometric center of the fourth light-emitting zone 10 (labeled with M) with another fifth light-emitting zone 20 (not shown). That is, the two other display units 40, each containing one of the two fifth light-emitting zones 20 in the pixel unit 40 shown in FIG. 22, may share the fourth light-emitting zone 10 (labeled with M). Also, the two fifth light-emitting zones 20, each adjacent to the same string of sixth light-emitting zones 32 and adjacent to the lines of direct connection in the display unit 40, may be positioned in the same column/row. The two display units 40, each containing one of the three fifth light-emitting zones 20, may share the string of sixth light-emitting zones 32.

In some embodiments, as shown in FIGS. 18 to 21, for an OLED display device or an LCD display device, the structure and principle of the connection of the three sixth light-emitting zones 30 in the sixth light-emitting zone string 32 may be similar to the structure and principle of the connection of the sixth light-emitting zones 30 in the sixth light-emitting zone string 32 in the FIGS. 9-17 described above (the number of the six light-emitting zones 30 in the sixth light-emitting zone string 32 is different), which is not repeated here.

Compared to the pixel arrangement disclosed above, the pixel arrangement disclosed in some embodiments may further reduce the number of data lines used in the pixel arrangement. Back panel wiring can be made easier, and the power consumption of the display apparatus containing the pixel arrangement can be further reduced.

Another aspect of the present disclosure provides a method for displaying the pixel arrangement in some embodiments shown in FIGS. 18-23. In the pixel arrangement described in some embodiments, adjacent display units 40 may share a fourth light-emitting zone 10 and a string of sixth light-emitting zones 32 for displaying images such that each display unit 40 is able to display pixel display information of three primary colors (i.e., RGB colors).

The method for displaying the pixel arrangement disclosed in some embodiments can be referred to the method for displaying the pixel arrangement disclosed above. Since the number of sixth light-emitting zones 30 in one string of sixth light-emitting zones 32 may be different from the pixel arrangement disclosed above, the weights for calculating the actual brightness values of the strings of sixth light-emitting zones 32 can be adjusted.

Figure 23:
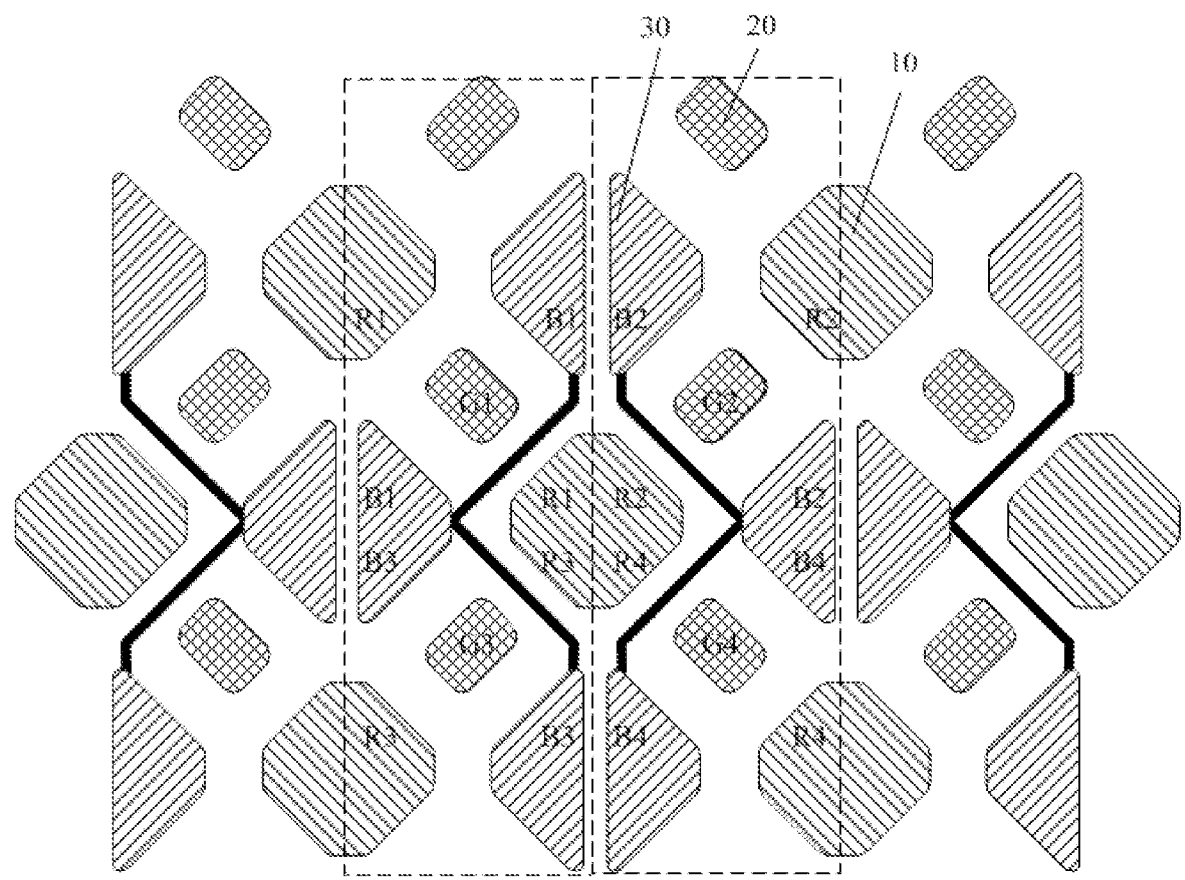
FIG. 23 illustrates schematics of an exemplary configuration of display units of the pixel arrangement according to some embodiments of the present disclosure.

In one embodiment, as shown in FIG. 23, the string of sixth light-emitting zones 32 includes (at least part of) three sixth light-emitting zones 30. The three sixth light-emitting zones 30 are located between the central axis of the single fourth light-emitting zone 10 in the second direction D2 and the central axis of the another single fourth light-emitting zone 10 closest to the single fourth light-emitting zone 10 in the diagonal direction (the direction at an angle of about 45° to D1 or D2) in the direction D2. The three sixth light-emitting zones 30 belong to three groups of sixth light-emitting zones 31. The fifth light-emitting zone 20, the fourth light-emitting zone 10, and the string of sixth light-emitting zones 32 constitute a display unit 40. The fourth light-emitting zones 10 may display red (R), the fifth light-emitting zones 20 may display green (G), and the sixth light-emitting zones 30 may display blue (B). Based on the configuration of the fifth light-emitting zone 20 contained, different display units 40 can be defined. The fourth light-emitting zone 10, which may be shared by a plurality of display units 40, may be labeled with R1, R2, R3, and R4. The string of sixth light-emitting zones 32, which may be shared by a plurality of display units 40, may be labeled with B1, B2, B3, and B4. The light-emitting zones with the same labeling number may form one color gamut (e.g., R1, G1, and B1 may form one gamut, and R2, G2, and B2 may form another color gamut). The color formed by mixing the colors of the light-emitting zones in a gamut may represent the display information of the color gamut.

The method for displaying the pixel arrangement of FIG. 23 may include the following steps.

In step S1, the theoretical brightness values from the pixel display information for each display unit 40 may be obtained, where the theoretical brightness values may correspond to the colors displayed by the fourth light-emitting zone 10, the fifth light-emitting zone 20, and the string of sixth light-emitting zones 32 of each display unit 40.

In step S2, the actual brightness values of the fourth light-emitting zone 10, the fifth light-emitting zone 20, and the string of sixth light-emitting zones 32 of each display unit 40 can be calculated.

In step S2, the three consecutive fifth light-emitting zones 20 may be aligned in one row/column and positioned adjacent to the string of sixth light-emitting zones 32. Three display units 40, each containing one of the three fifth light-emitting zones 20, may share the same string of sixth light-emitting zones 32. The weights of the theoretical brightness values for the color displayed by the shared portion of the string of sixth light-emitting zones 32 in each of the three display units 40 may be ⅓.

In step S3, the corresponding actual brightness values may be inputted into the fourth light-emitting zone 10, the fifth light-emitting zone 20, and the string of sixth light-emitting zones 32 of each pixel unit to display images.

By applying the method provided in the present disclosure, brightness information of the light-emitting zones can be calculated through suitable pixel sharing algorithms and the pixel arrangement can obtain desirable display effect. The number of data lines used in the pixel arrangement can be reduced, and back panel wiring can be easier. The power consumption of the display apparatus containing the pixel arrangement can be further reduced.

Figure 24:
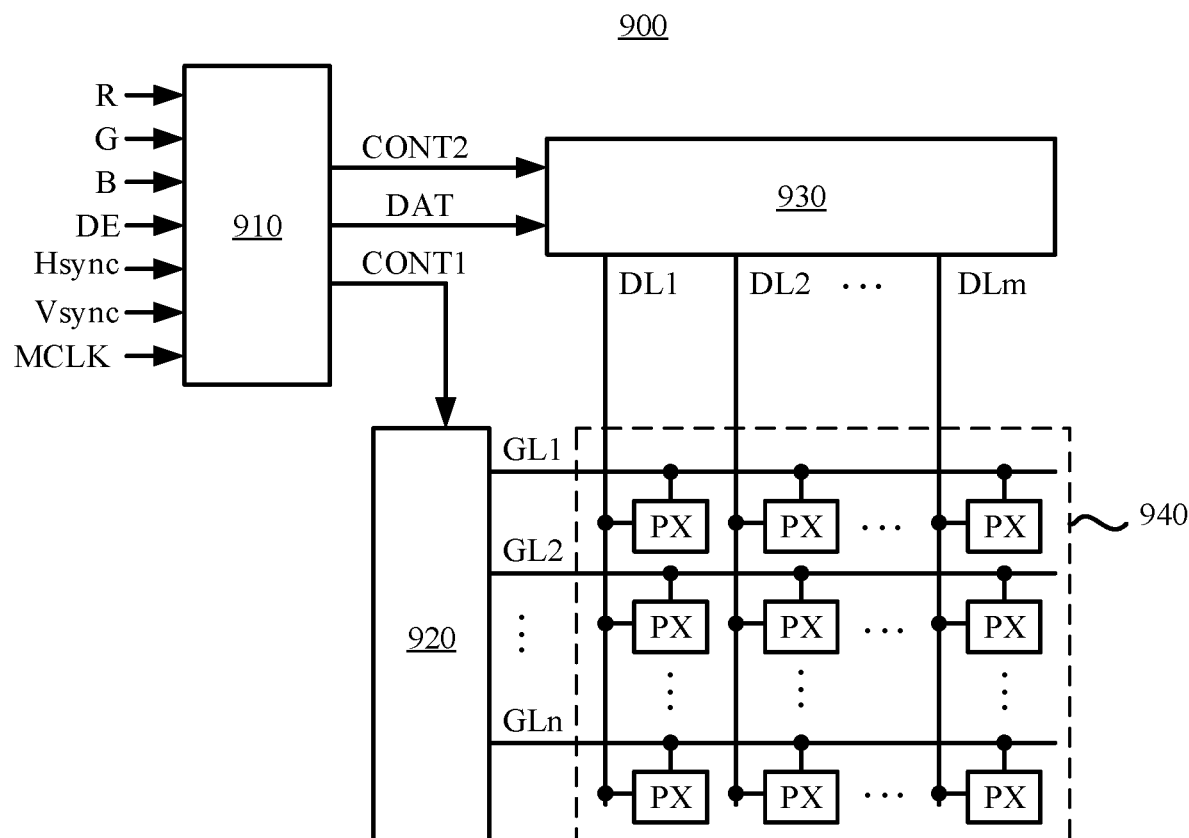
FIG. 24 is a schematic block diagram of a display device in accordance with an embodiment of the present disclosure.

FIG. 24 is a schematic block diagram of a display device 900 in accordance with an embodiment of the present disclosure. Referring to FIG. 24, the display device 900 includes a timing controller 910, a scan driver 920, a data driver 930, and a display panel 940.

The timing controller 910 receives synchronization signals and video signals R, G, and B from a system interface. The synchronization signals include a horizontal synchronization signal Hsync, a vertical synchronization signal Vsync, a main clock signal MCLK, and a data enable signal DE. The timing controller 910 generates a first driving control signal CONT1, a second driving control signal CONT2, and image data signals DAT based on the video signals R, G, and B, the horizontal synchronization signal Hsync, the vertical synchronization signal Vsync, the data enable signal DE, and the main clock signal MCLK. The timing controller 910 divides the video signals R, G, and B into units of frames based on the vertical synchronization signal Vsync, and divides the video signals R, G, and B into units of data lines based on the horizontal synchronization signal Hsync, to generate the image data signals DAT. The timing controller 910 transmits the image data signals DAT and the second drive control signal CONT2 to the data driver 930, and the first drive control signal CONT1 to the scan driver 920.

The display panel 940 includes pixels PX that are substantially arranged in a matrix. The display panel 940 may take the form of the display panel (such as, 100, 200 or 300) described above in connection with FIGS. 1A to 23. In the display panel 940, a plurality of substantially parallel gate lines GL1 to GLn extend in a first direction, and a plurality of substantially parallel data lines DL1 to DLm extend in a second direction. The gate lines GL1 to GLn and the data lines DL1 to DLm are coupled to the pixels PX.

The scan driver 920 is coupled to the gate lines GL1 to GLn. In response to the first driving control signal CONT1, the scan driver 920 generates a plurality of scan signals S[1] to S[n], and sequentially applies the scan signals S[1]-S[n] to the gate lines GL1 to GLn. In some embodiments, the scan driver 920 may be integrated with the display panel 940.

The data driver 930 is coupled to the data lines DL1 to DLm. In response to the second driving control signal CONT2 and the image data signals DAT, the data driver 930 generates a plurality of data voltages D[1] to D[m], and applies the plurality of data voltages D[1] to D[m] to the data lines DL1 to DLm, respectively.

By way of example and not limitation, the display device 900 may be any product or component having a display function, such as a cell phone, a tablet, a television, a display, a notebook computer, a digital photo frame, a navigator, and the like.

Variations to the disclosed embodiments can be understood and effected by the skilled person in practicing the claimed subject matter, from a study of the drawings, the disclosure, and the appended claims. In the claims, the word "comprises" or "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A display panel, comprising:
a plurality of pixels arranged in an array in a first direction and a second direction intersecting the first direction, each pixel comprising:
a first sub-pixel having a first light-emitting zone configured to emit light of a first color;
at least two second sub-pixels each having a second light-emitting zone configured to emit light of a second color; and
a third sub-pixel having a third light-emitting zone configured to emit light of a third color,
wherein the plurality of pixels comprise adjacent four pixels, the four pixels are arranged in two adjacent rows along the first direction and in two adjacent columns along the second direction, the third sub-pixel of the four pixels is a same sub-pixel, and the third sub-pixel is arranged at a center of the four pixels and is shared by the four pixels; and
wherein the at least two second sub-pixels of each of two pixels in the adjacent four pixels are connected to each other via a connecting line, the two pixels are diagonally adjacent with respect to the third sub-pixel; and the at least two second sub-pixels of each of the other two pixels in the adjacent four pixels are not connected to each other, the other two pixels are diagonally adjacent with respect to the third sub-pixel.

2. The display panel of claim 1, wherein in one of the plurality of pixels, the first, second, and third light-emitting zones are arranged in a triangle such that the first, second, and third light-emitting zones respectively cover three vertices of the triangle, and one side of the triangle is substantially parallel to the first direction, and wherein the second and third light-emitting zones respectively cover two vertices of three vertices of the triangle, and the two vertices define the side of the triangle which is substantially parallel to the first direction.

3. The display panel of claim 2, wherein the plurality of pixels are arranged along the first direction, and a line connecting centers of the first light-emitting zones in the plurality of pixels is substantially parallel to the first direction.

4. The display panel of claim 2, wherein, in one of the plurality of pixels, a line connecting a center of the second light-emitting zone and a center of the third light-emitting zone is substantially parallel to the first direction.

5. The display panel of claim 2, wherein one of the plurality of pixels has a luminance center inside the triangle, and a distance from the luminance center to the first light-emitting zone of the pixel is less than a distance from the luminance center to the second light-emitting zone of the pixel or a distance from the luminance center to the third light-emitting zone of the pixel.

6. The display panel of claim 1, wherein in the plurality of pixels, the first light-emitting zones have the same shape, the second light-emitting zones have the same shape, and the third light-emitting zones have the same shape.

7. The display panel of claim 1, wherein the plurality of pixels are arranged such that two pixels directly adjacent in the first direction have respective patterns of first, second, and third light-emitting zones, the respective patterns of first, second, and third light-emitting zones being substantially mirror symmetrical to each other with respect to a symmetry axis, wherein the symmetry axis is substantially parallel to the second direction.

8. The display panel of claim 1, wherein the plurality of pixels are arranged such that, in four pixels distributed in a 2*2 matrix, two diagonally adjacent pixels have substantially repeating patterns of first, second and third light-emitting zones with respect to each other.

9. The display panel of claim 1, wherein in each of the plurality of pixels, the second light-emitting zone has a substantially trapezoidal shape, the substantially trapezoidal shape having a longer base side and a shorter base side substantially parallel to each other.

10. The display panel of claim 1, wherein in the plurality of pixels:
a plurality of second light-emitting zones or third light-emitting zones arranged in the second direction are connected to a same data line;
a plurality of first light-emitting zones arranged in the second direction are connected to a same data line;
a first light-emitting zone, a second light-emitting zone, and a third light-emitting zone in a same pixel are connected to a same control line; and
two adjacent pixels in the first direction are connected to a same control line, and
wherein the control line comprises at least one of a scan line, a light-emitting control line, or a reset control line.

11. The display panel of claim 10, wherein both the data line to which the plurality of second light-emitting zones or third light-emitting zones arranged in the second direction are connected and the data line to which the plurality of first light-emitting zones arranged in the second direction are connected are alternately arranged in the first direction.

12. The display panel of claim 1, wherein at least one of a first line or a second line sequentially connecting the luminance centers of the pixels arranged in the first direction or the second direction is a straight line.

13. The display panel of claim 1, wherein at least one of a first line or a second line sequentially connecting the luminance centers of the pixels arranged in the first direction or the second direction has a zigzag shape, and an acute angle between a polyline segment in the zigzag shape and an extending direction of the zigzag shape is less than 45 degrees.

14. The display panel of claim 1, wherein two second light-emitting zones respectively comprised in two pixels adjacent in the first direction are adjacent to each other, and the two second light-emitting zones are substantially symmetrical with respect to a symmetry axis, and the symmetry axis is parallel to the longest side of one of the two second light-emitting zones.

15. The display panel of claim 1, further comprising:
a base substrate on which the plurality of pixels are formed, wherein each of the first, second, and third sub-pixels comprises a light emitting diode comprising a first electrode, a light emitting layer, and a second electrode which are sequentially stacked in a direction away from the base substrate; and
a pixel defining layer comprising a plurality of openings, the plurality of openings defining respective ones of the first, second and third light-emitting zones of the plurality of pixels,
wherein an area of an orthographic projection of the light emitting layer onto the base substrate is larger than an area of an orthographic projection of a corresponding one of the plurality of openings onto the base substrate, such that the orthographic projection of the corresponding one of the plurality of openings falls within the orthographic projection of the light emitting layer; and wherein the light-emitting layers of any two sub-pixels directly adjacent in the first direction and having light-emitting zones configured to emit light of a same color are formed such that orthographic projections of the light-emitting layers onto the base substrate are in communication with each other.

16. The display panel of claim 1, further comprising:

a base substrate on which the plurality of pixels are formed, wherein each of the first, second, and third sub-pixels comprises a light emitting diode comprising a first electrode, a light emitting layer, and a second electrode which are sequentially stacked in a direction away from the base substrate; and a pixel defining layer comprising a plurality of openings, the plurality of openings defining respective ones of the first, second and third light-emitting zones of the plurality of pixels, wherein the first electrode is formed on a side of the pixel defining layer close to the base substrate, and at least part of the first electrode is exposed by the plurality of openings formed in the pixel defining layer; and wherein two first electrodes of two second sub-pixels or two first electrodes of two third sub-pixels in at least two pixels adjacent in the first direction or the second direction are electrically connected.

17. A display device comprising the display panel of claim 1.

18. The display panel of claim 1, wherein the four pixels comprise a first pixel and a second pixel which are arranged along the second direction, the first light-emitting zone of the first pixel is adjacent to the second light-emitting zone and the third light-emitting zone of the second pixel, the first light-emitting zone of the first pixel has a substantially polygonal shape, the substantially polygonal shape comprising:

a first side substantially parallel to one side of the second light-emitting zone of the first pixel, and the one side of the second light-emitting zone of the first pixel being opposite to the first light-emitting zone;

a second side substantially parallel to one side of the third light-emitting zone of the first pixel, and the one side of the third light-emitting zone of the first pixel being opposite to the first light-emitting zone;

a third side substantially parallel to one side of the second light-emitting zone of the second pixel, and the one side of the second light-emitting zone of the second pixel being opposite to the first light-emitting zone; and a fourth side substantially parallel to one side of the third light-emitting zone of the second pixel, and the one side of the third light-emitting zone of the second pixel being opposite to the first light-emitting zone.

* * * * *